US012048152B2

(12) United States Patent
Baek

(10) Patent No.: US 12,048,152 B2
(45) Date of Patent: Jul. 23, 2024

(54) VERTICAL MEMORY DEVICES

(71) Applicant: SAMSUNG ELECTRONICS CO., LTD., Suwon-si (KR)

(72) Inventor: Seokcheon Baek, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 301 days.

(21) Appl. No.: 17/035,930

(22) Filed: Sep. 29, 2020

(65) Prior Publication Data

US 2021/0265388 A1 Aug. 26, 2021

(30) Foreign Application Priority Data

Feb. 21, 2020 (KR) ........................ 10-2020-0021416

(51) Int. Cl.

| | |
|---|---|
| ***H01L 27/11582*** | (2017.01) |
| ***G11C 8/14*** | (2006.01) |
| ***H01L 23/522*** | (2006.01) |
| ***H01L 27/11565*** | (2017.01) |
| ***H01L 29/423*** | (2006.01) |
| ***H01L 29/792*** | (2006.01) |

(Continued)

(52) U.S. Cl.

CPC ............... *H10B 43/27* (2023.02); *G11C 8/14* (2013.01); *H01L 23/5226* (2013.01); *H01L 29/4234* (2013.01); *H01L 29/7926* (2013.01); *H10B 43/10* (2023.02)

(58) Field of Classification Search

CPC ......... H01L 27/11575; H01L 27/11565; H01L 27/1157; H01L 27/11573; H01L 27/11582; H01L 27/11524; H01L 27/11526; H01L 27/11551; H01L 23/5226; H01L 23/5283; H01L 21/76816; H01L 21/76865; H01L 21/76877; H01L 21/76831; H10B 43/27; H10B 41/35; H10B 41/41; H10B 41/27; H10B 43/35; H10B 43/40; H10B 43/10; H10B 43/50

See application file for complete search history.

(56) References Cited

U.S. PATENT DOCUMENTS 9,595,535 B1 3/2017 Ogawa et al.
9,646,880 B1 5/2017 Takai et al.
(Continued)

FOREIGN PATENT DOCUMENTS

KR 10-2017-0046892 5/2017

*Primary Examiner* — Mary A Wilczewski
*Assistant Examiner* — Tsz K Chiu
(74) *Attorney, Agent, or Firm* — F. CHAU & ASSOCIATES, LLC

(57) ABSTRACT

A vertical memory device includes a plurality of memory blocks having a plurality of horizontal gate electrodes spaced apart from each other in a first direction and extending in a second direction. A plurality of vertical channels extends through the horizontal gate electrodes in the first direction. A plurality of charge storage structures are disposed between the vertical channels and the horizontal gate electrodes. A conductive path extends in a third direction. The plurality of memory blocks are arranged in the third direction and are divided from each other by a first division pattern that extends in the second direction. The plurality of horizontal gate electrodes at each level are connected to the conductive path at a first lateral side in the second direction to form a shared memory block.

17 Claims, 47 Drawing Sheets

(51) Int. Cl.

| | |
|---|---|
| ***H10B 43/10*** | (2023.01) |
| ***H10B 43/27*** | (2023.01) |

(56) References Cited

U.S. PATENT DOCUMENTS

| | | | | |
|---|---|---|---|---|
| 9,721,663 | B1 | 8/2017 | Ogawa et al. | |
| 9,865,540 | B2 | 1/2018 | Kim et al. | |
| 10,269,817 | B2 | 4/2019 | Ogawa et al. | |
| 10,276,240 | B2 | 4/2019 | Fukano | |
| 2012/0057395 | A1* | 3/2012 | Lee | G11C 5/06 365/230.06 |
| 2012/0241872 | A1* | 9/2012 | Endo | H01L 27/11531 257/408 |
| 2014/0264549 | A1* | 9/2014 | Lee | H01L 27/11556 438/269 |
| 2017/0323900 | A1* | 11/2017 | Kanamori | H01L 27/0688 |
| 2018/0012903 | A1* | 1/2018 | Kim | H10B 43/10 |
| 2019/0252398 | A1 | 8/2019 | Utsumi | |
| 2019/0348436 | A1* | 11/2019 | Kim | H01L 27/11573 |
| 2020/0075605 | A1* | 3/2020 | Kim | H01L 27/11519 |
| 2020/0176467 | A1* | 6/2020 | Choi | H01L 27/1157 |
| 2020/0194445 | A1* | 6/2020 | Sharangpani | H01L 21/823487 |
| 2020/0219898 | A1* | 7/2020 | Kanamori | H10B 43/27 |
| 2020/0227432 | A1* | 7/2020 | Lai | H01L 23/5226 |
| 2020/0303411 | A1* | 9/2020 | Baek | H01L 23/5283 |
| 2020/0350331 | A1* | 11/2020 | Kim | H10B 43/10 |
| 2021/0242128 | A1* | 8/2021 | Ito | H10B 43/10 |

* cited by examiner

VERTICAL MEMORY DEVICES

CROSS-REFERENCE TO RELATED APPLICATION

This application claims priority under 35 U.S.C. § 119 to Korean Patent Application No. 10-2020-0021416, filed on Feb. 21, 2020 in the Korean Intellectual Property Office, the disclosure of which is incorporated by reference in its entirety herein.

1. TECHNICAL FIELD

The present inventive concepts relate to a vertical memory device, and more particularly, a vertical NAND flash memory device.

2. DISCUSSION OF RELATED ART

In a VNAND flash memory device having a gate electrode that includes doped polysilicon, the resistance of the gate electrode increases as a length of the gate electrode increases. Therefore, a memory cell region which includes memory cells of the memory device may not have a large area. Consequently, the area of a pad region surrounding the memory cell region may increase which results in a decrease in the integration degree of the vertical memory device.

SUMMARY

Exemplary embodiments of the present inventive concepts provide a vertical memory device having improved electrical characteristics.

According to an exemplary embodiment of the present inventive concepts, a vertical memory device includes a plurality of memory blocks. Each of the plurality of memory blocks includes a plurality of horizontal gate electrodes disposed on a substrate and spaced apart from each other in a first direction that is substantially perpendicular to an upper surface of the substrate. Each of the plurality of horizontal gate electrodes extends in a second direction that is substantially parallel to the upper surface of the substrate. Each of the plurality of memory blocks also includes a plurality of vertical channels. Each of the plurality of vertical channels extends through horizontal gate electrodes of the plurality of horizontal gate electrodes in the first direction. Each of the plurality of memory blocks also includes a plurality of charge storage structures. Each of the charge storage structures are disposed between a vertical channel of the plurality of vertical channels and a horizontal gate electrode of the plurality of horizontal gate electrodes. A conductive path extends in a third direction that is substantially parallel to the upper surface of the substrate and crosses the second direction. The plurality of memory blocks are arranged in the third direction and are divided from each other by a first division pattern that extends in the second direction. The plurality of horizontal gate electrodes at each level are connected to the conductive path at a first lateral side in the second direction to form a shared memory block.

According to exemplary embodiment of the present inventive concepts, a vertical memory device includes a substrate including a memory cell region and a pad region surrounding the memory cell region. A conductive path is disposed on the memory cell region. The conductive path includes conductive patterns that are spaced apart from each other in a first direction that is substantially perpendicular to an upper surface of the substrate. The conductive path extends in at least one of second and third directions that are substantially parallel to the upper surface of the substrate and cross each other. Shared memory blocks are disposed on cell array regions, respectively, of the substrate. The cell array regions are portions of the memory cell region of the substrate that are spaced apart from each other by the conductive path. Each of the shared memory blocks includes memory blocks arranged in the third direction on each of the cell array regions of the substrate. The memory blocks are divided by a first division pattern extending in the second direction. Each of the memory blocks includes horizontal gate electrodes disposed on the substrate and spaced apart from each other in the first direction. Each of the horizontal gate electrodes extends in the second direction. Vertical channels each extend through the horizontal gate electrodes in the first direction. Charge storage structures in which each of the charge storage structures are disposed between each of the vertical channels and the horizontal gate electrodes. The horizontal gate electrodes at each level of the memory blocks in each of the shared memory blocks are electrically connected to the conductive path at a first lateral side in the second direction or a second lateral side in the third direction of each of the shared memory blocks and are configured to be shared by the shared memory blocks.

According to an exemplary embodiment of the present inventive concepts, a vertical memory device includes a substrate including a first region and a second region. First pass transistors are disposed on the second region of the substrate. Second and third pass transistors are disposed on the first region of the substrate. First, second and third lower circuit patterns are disposed on the substrate. The first to third lower circuit patterns are configured to be electrically connected to the first to third pass transistors, respectively. A common source plate (CSP) is disposed on the first to third lower circuit patterns. Memory blocks each include first, second and third horizontal gate electrodes disposed on the CSP. The first, second and third horizontal gate electrodes are spaced apart from each other in a first direction that is substantially perpendicular to an upper surface of the substrate. Each of the first to third horizontal gate electrodes extends on the first and second regions of the substrate in a second direction that is substantially parallel to the upper surface of the substrate. Vertical channels are disposed on the first region. Each of the vertical channels extends through the first to third horizontal gate electrodes in the first direction. Charge storage structures are disposed on sidewalls of the vertical channels, respectively. A conductive path extends on the substrate in a third direction that is substantially parallel to the upper surface of the substrate and crosses the second direction. A first switching transistor is configured to control electrical signals applied to the second horizontal gate electrodes. The first switching transistor is disposed on the first region of the substrate and includes a first vertical gate electrode extending through the first to third horizontal gate electrodes in the first direction on the first region of the substrate. The first vertical gate electrode is electrically insulated from the first to third horizontal gate electrodes. A first horizontal channel is disposed at a portion of each of the second horizontal gate electrodes that is adjacent to the first vertical gate electrode. A second switching transistor is configured to control electrical signals applied to the third horizontal gate electrode. The second switching transistor is disposed on the first region of the substrate and includes a second vertical gate electrode extending through the first to third horizontal gate electrodes in the first direction on the first region of the substrate. The second vertical gate electrode is electrically insulated from the first to third horizontal gate electrodes and is spaced apart from the first vertical gate electrode in the second direction. A second horizontal channel is disposed at a portion of the third horizontal gate electrodes that is adjacent to the third vertical gate electrodes. The memory blocks are disposed in the third direction, and are divided by a division pattern that extends in the second direction. The first, second and third horizontal gate electrodes at each level of the memory blocks are connected to form a shared memory block. The first, second and third horizontal gate electrodes at each level included in the shared memory block are connected to the conductive path at a lateral side in the second direction of the shared memory block.

In the vertical memory device in accordance with exemplary embodiments of the present inventive concepts, the total resistance of each of the gate electrodes may be reduced by the conductive path connected to the gate electrodes on the memory cell region of the substrate. For example, the upper circuit pattern for applying electrical signals to the gate electrodes may be formed not only on the pads of the gate electrodes at a lateral end portion of the memory cell region in a second direction but also on the pads of the gate electrodes at a lateral end portion of the memory cell region in a third direction substantially perpendicular to the second direction to have a further reduced resistance and increased freedom of layout of the upper circuit pattern.

DETAILED DESCRIPTION OF EXEMPLARY EMBODIMENTS

Vertical memory devices and methods of manufacturing the same in accordance with exemplary embodiments of the present inventive concepts will be described more fully hereinafter with reference to the accompanying drawings. It will be understood that, although the terms “first,” “second,” and/or “third” may be used herein to describe various elements, components, regions, layers and/or sections, these elements, components, regions, layers and/or sections should not be limited by these terms. These terms are only used to distinguish one element, component, region, layer or section from another region, layer or section.

Hereinafter in the present Specification (but not necessarily in the claims), a direction substantially perpendicular to an upper surface of a substrate may be defined as a first direction D1, and two directions substantially parallel to the upper surface of the substrate and crossing each other may be defined as second and third directions D2 and D3, respectively. In an exemplary embodiment, the second and third directions D2 and D3 may be substantially perpendicular to each other. However, exemplary embodiments of the present inventive concepts are not limited thereto.

FIGS. 1 to 31 are plan views and cross-sectional views illustrating a method of manufacturing a vertical memory device in accordance with exemplary embodiments of the present inventive concepts. FIGS. 1-2, 9-10, 15-16, 18, 22, 24-25 and 30 are the plan views, and FIGS. 3-5, 8, 11-14, 17, 19-21, 23, 26-39 and 31 are the cross-sectional views.

Figure 20:
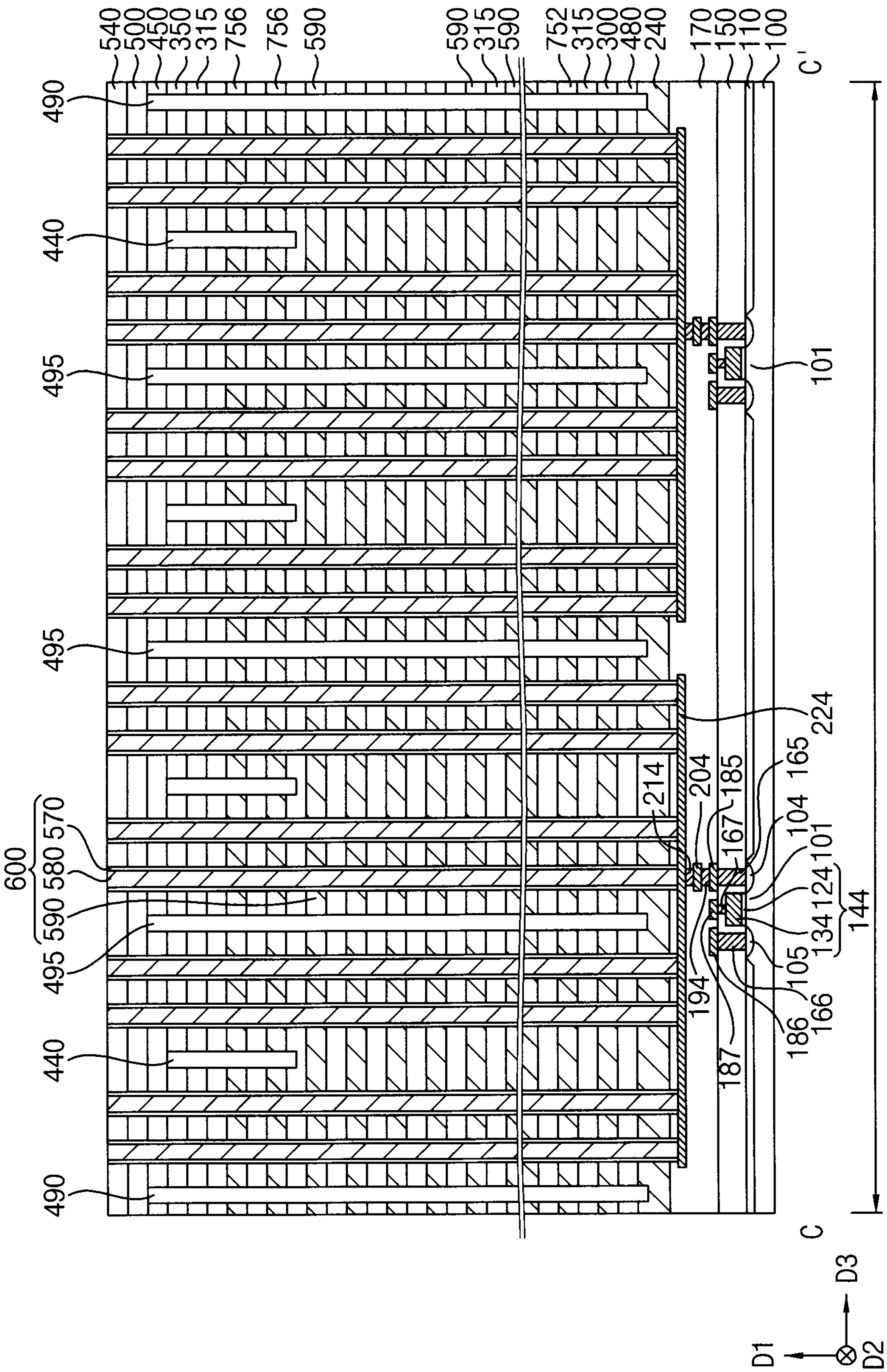
Figure 21:
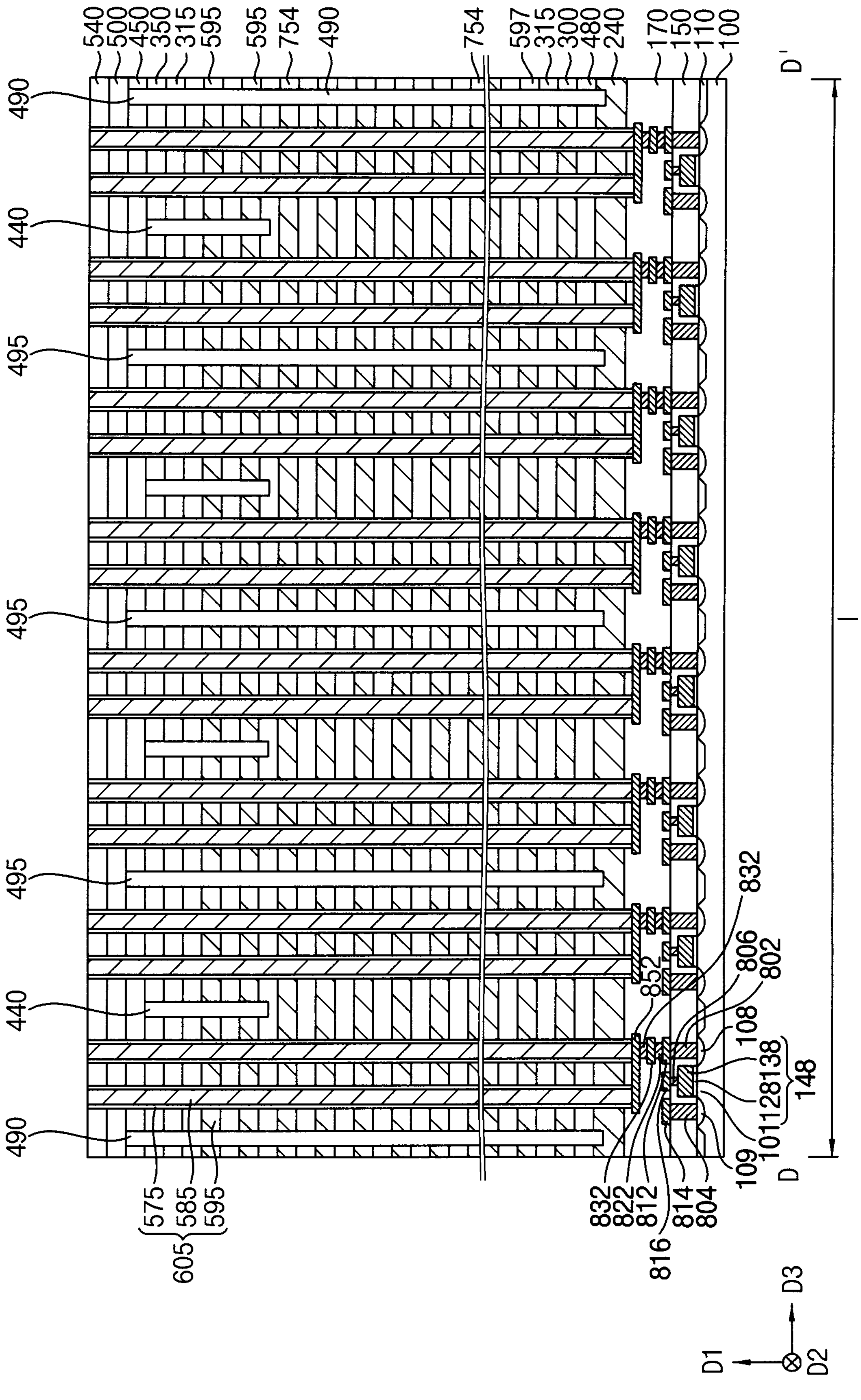
Figure 28:
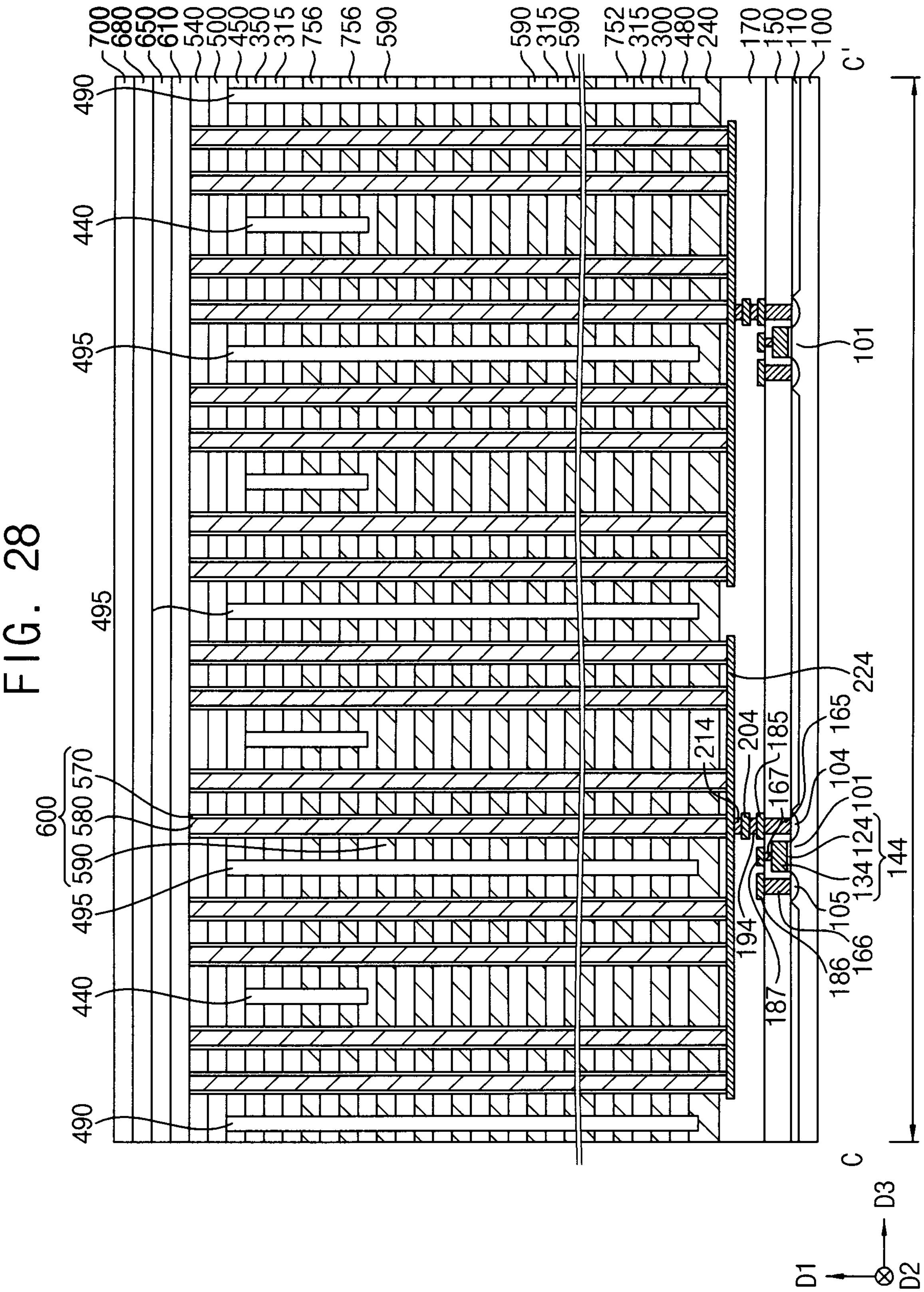
Figure 29:
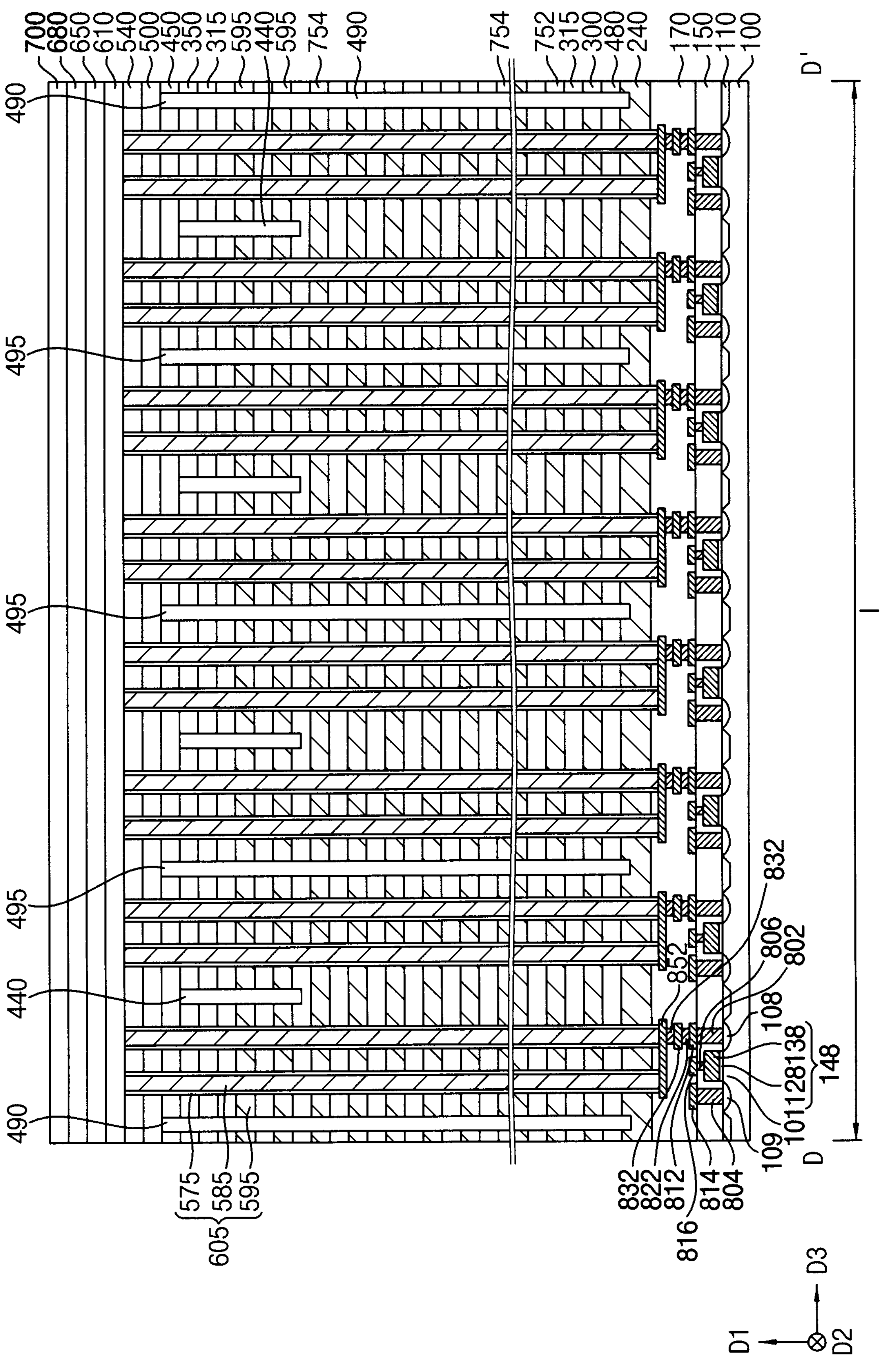
Figure 30:
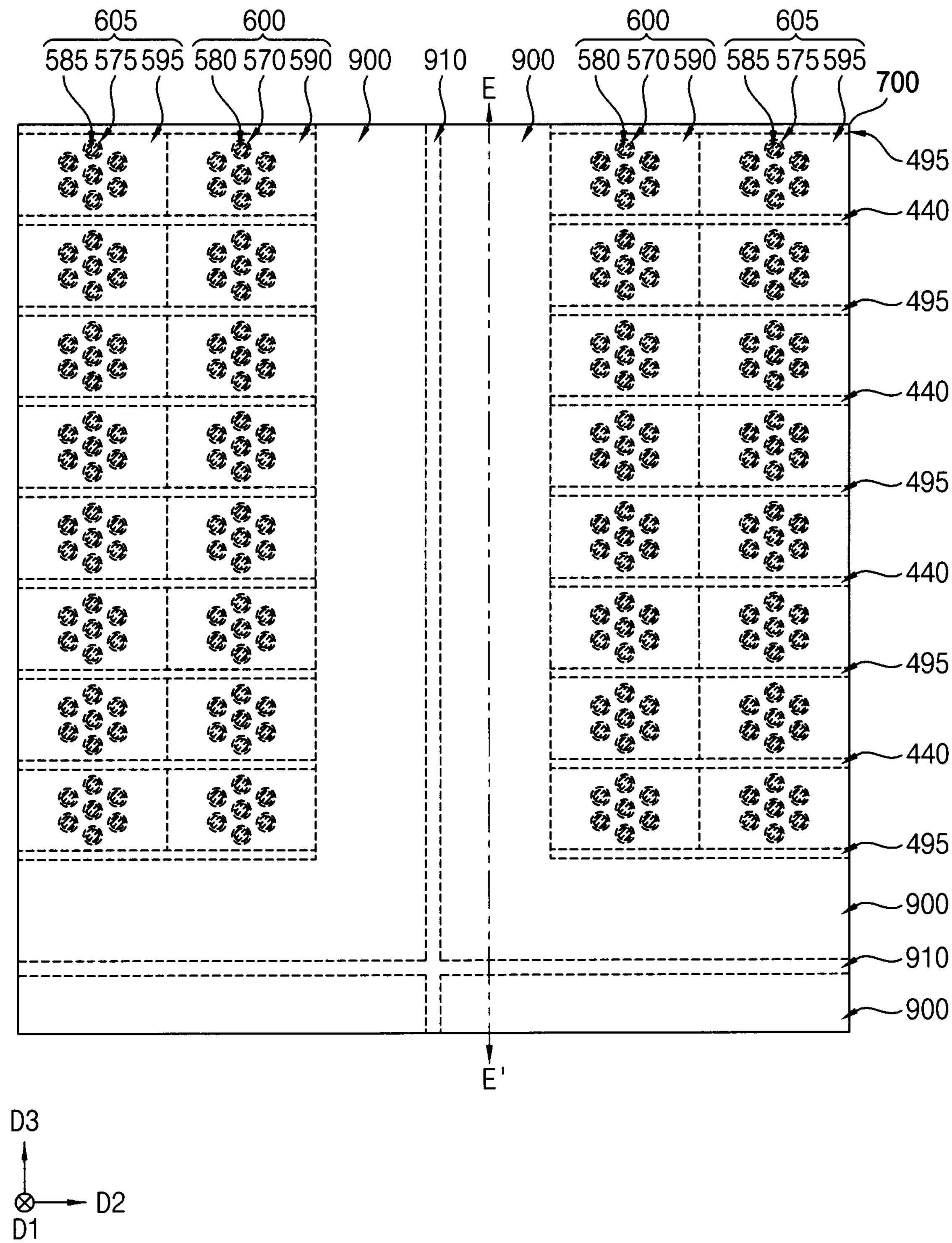
Figure 31:
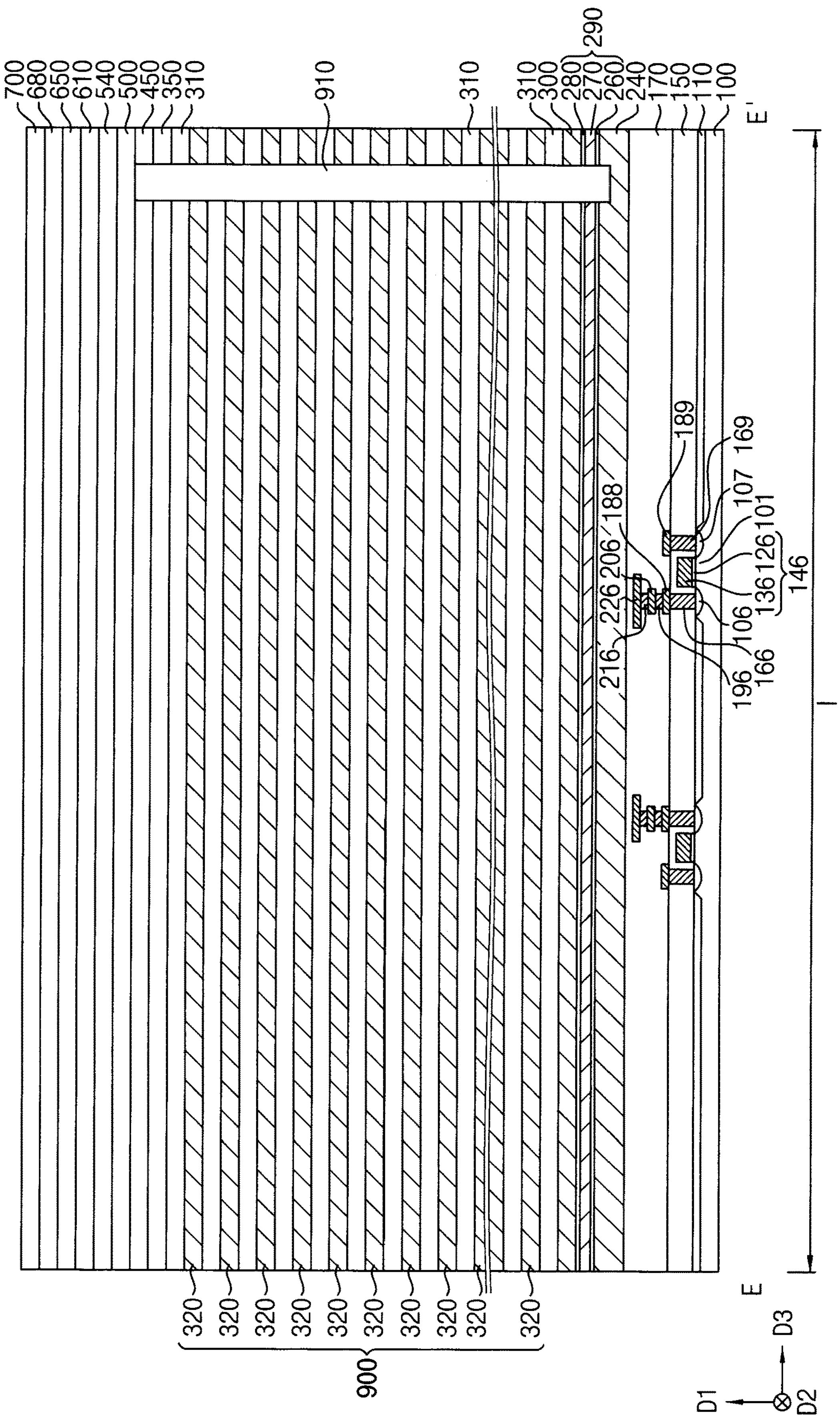

FIGS. 3-5, 8, 17, 19, 23 and 26 are cross-sectional views taken along lines A-A' of corresponding plan views, respectively. FIGS. 11-14 and 27 are cross-sectional views taken along lines B-B' of corresponding plan views, respectively. FIGS. 20 and 28 are cross-sectional views taken along lines C-C' of corresponding plan views, respectively. FIGS. 21 and 29 are cross-sectional views taken along lines D-D' of corresponding plan views, respectively. FIG. 31 is a cross-sectional views taken along a line E-E' of a corresponding plan view. FIGS. 2-8, 10-14, 16-23 and 25-29 are drawings of a region X of FIG. 1. FIGS. 30 and 31 are drawings of a region W of FIG. 1, and FIG. 8B are an enlarged cross-sectional view of a region Y of FIG. 8A.

Figure 1:
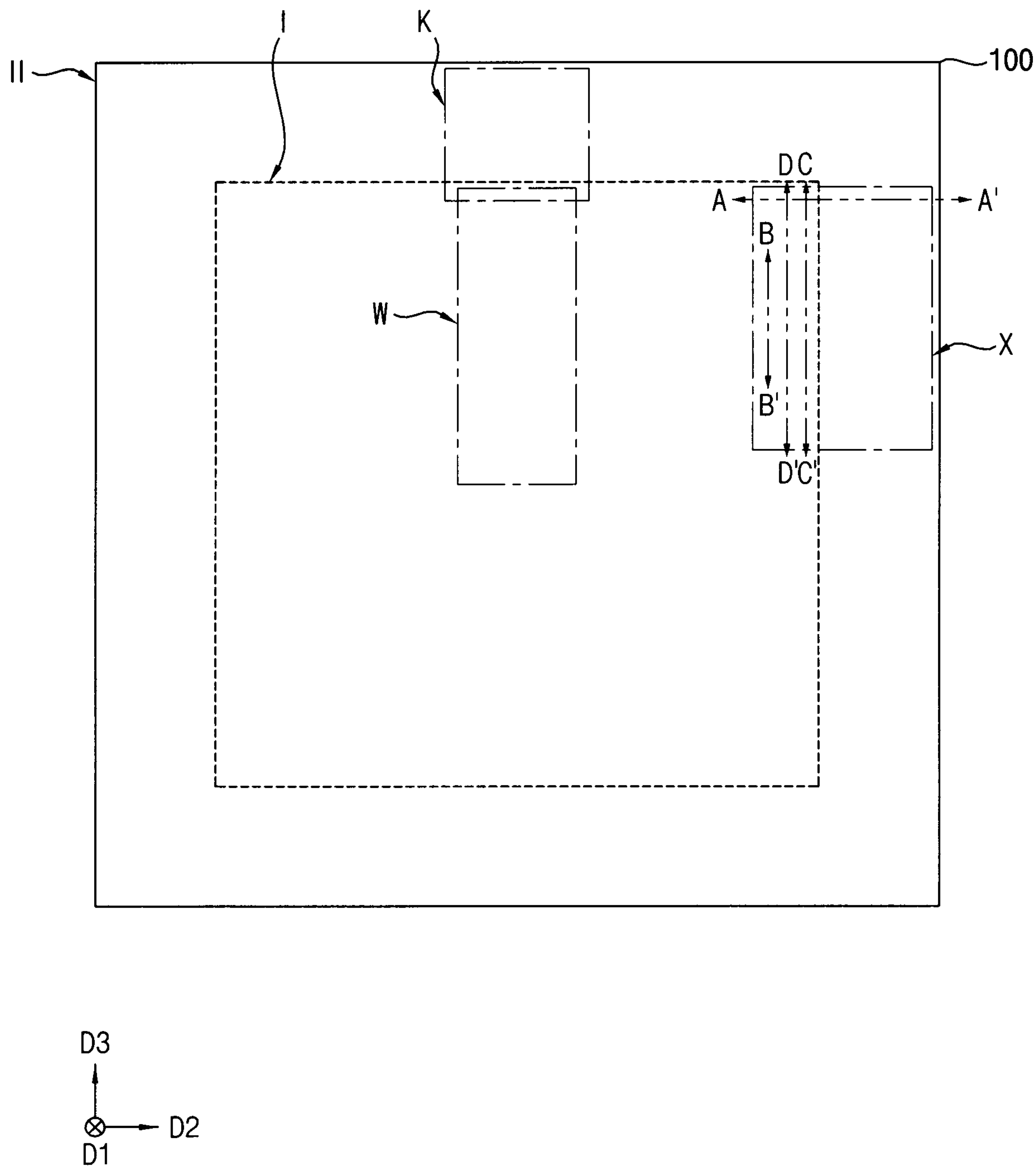
FIGS. 1 to 31 are plan views and cross-sectional views illustrating a method of manufacturing a vertical memory device in accordance with exemplary embodiment of the present inventive concepts.

Referring to the exemplary embodiment of FIG. 1, a substrate 100 may include a first region I and a second region II at least partially surrounding the first region I. For example, as shown in the exemplary embodiment of FIG. 1, the first region I may have a rectangular shape in a plan view (e.g., in a plane defined in the second and third directions D2, D3) and the second region II may surround all four sides of the first region. However, exemplary embodiments of the present inventive concepts are not limited thereto.

In an exemplary embodiment, the substrate 100 may include semiconductor materials such as at least one compound selected from silicon, germanium, silicon-germanium, etc., or III-V compounds, such as at least one compound selected from GaP, GaAs, GaSb, etc. In an exemplary embodiment, the substrate 100 may be a silicon-on-insulator (SOI) substrate or a germanium-on-insulator (GOI) substrate.

In an exemplary embodiment, the first and second regions I and II may be a cell array region and a pad region (or extension region), respectively, which together may form a cell region. For example, memory cells each including a gate electrode, a channel, and a charge storage structure may be disposed on the first region I of the substrate 100, and upper contact plugs for transferring electrical signals to the memory cells and pads of the gate electrodes contacting the upper contact plugs may be formed on the second region II of the substrate 100. A third region may be further formed in the substrate 100 to at least partially surround the second region II of the substrate 100, and an upper circuit pattern for applying electrical signals to the memory cells through the upper contact plugs may be formed on the third region of the substrate 100.

Figure 2:
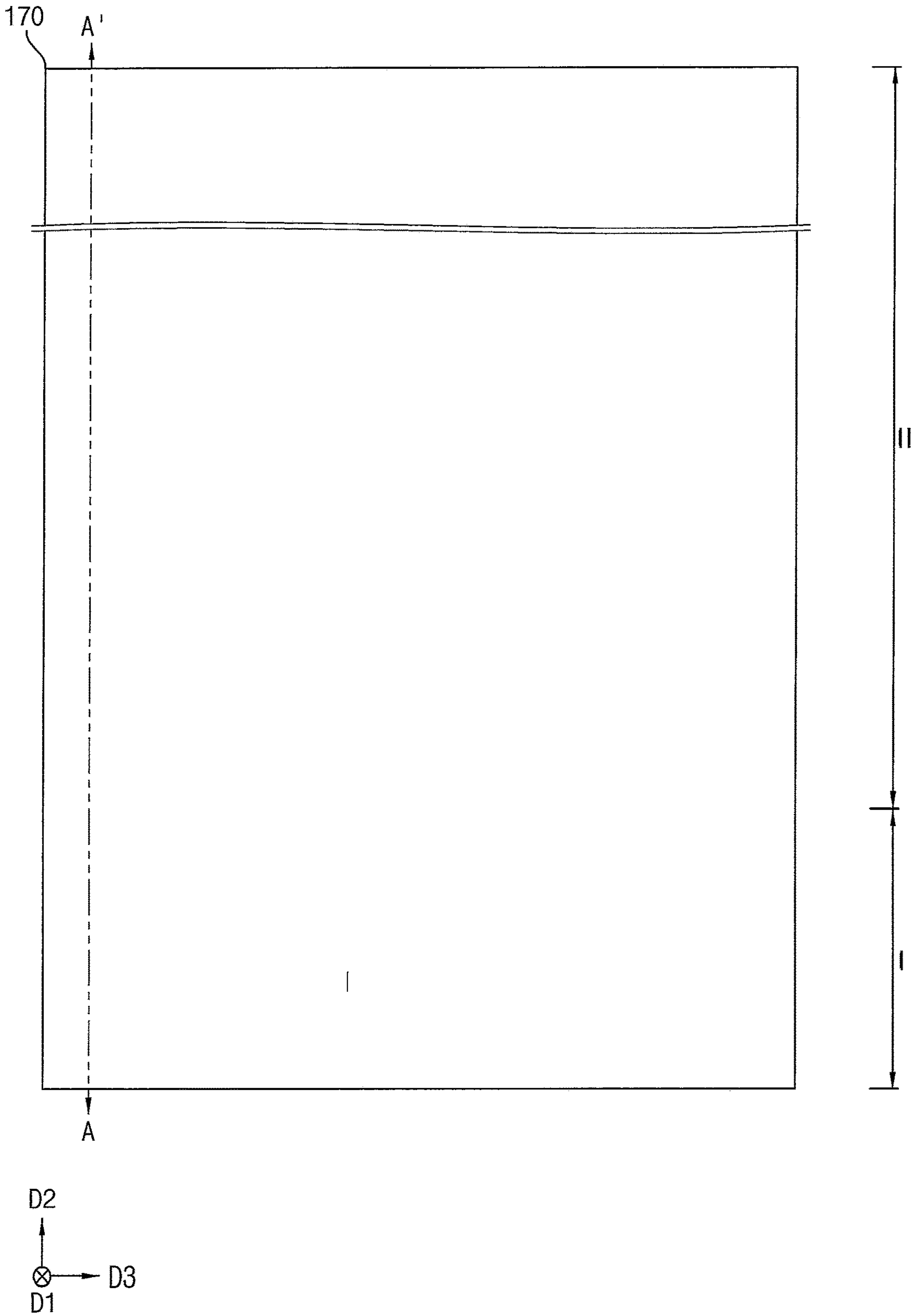
Figure 3:
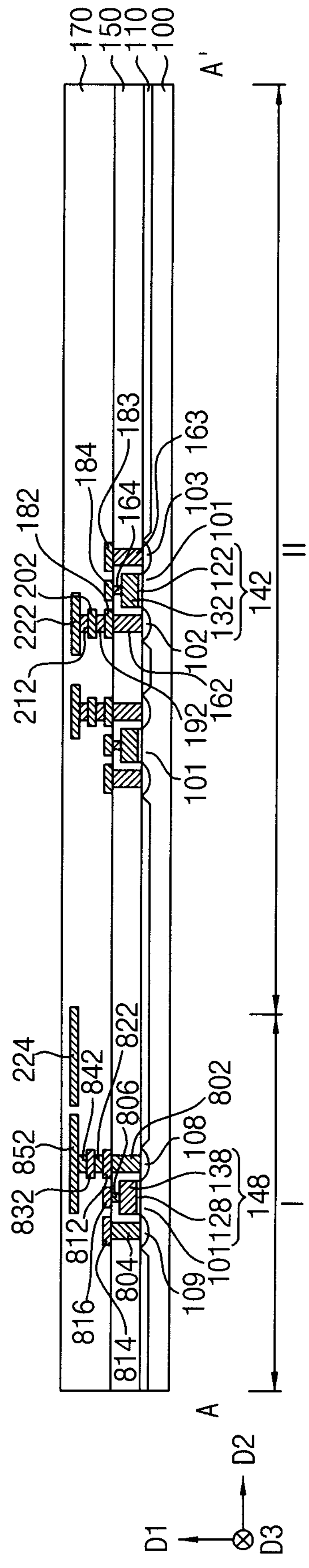

Referring to the exemplary embodiments of FIGS. 2 and 3, a lower circuit pattern may be disposed on the substrate 100, and first and second insulating interlayers 150 and 170 may be sequentially disposed on the substrate 100 to cover the lower circuit pattern. For example, as shown in the exemplary embodiment of FIG. 3, the first and second insulating interlayers 150 and 170 may be consecutively stacked in the first direction D1.

The substrate 100 may include a field region on which an isolation pattern 110 is disposed, and an active region 101 which does not include the isolation pattern 110. In an exemplary embodiment, the isolation pattern 110 may be formed by a shallow trench isolation (STI) process, and may include an oxide, such as silicon oxide, etc. However, exemplary embodiments of the present inventive concepts are not limited thereto.

In an exemplary embodiment, the vertical memory device may have a cell-over-periphery (COP) structure. For example, the lower circuit pattern may be disposed on the substrate 100, and the memory cells, the upper contact plugs and the upper circuit pattern may be disposed over the lower circuit pattern.

The lower circuit pattern may include transistors, lower contact plugs, lower wirings, lower vias, etc.

Figure 11:
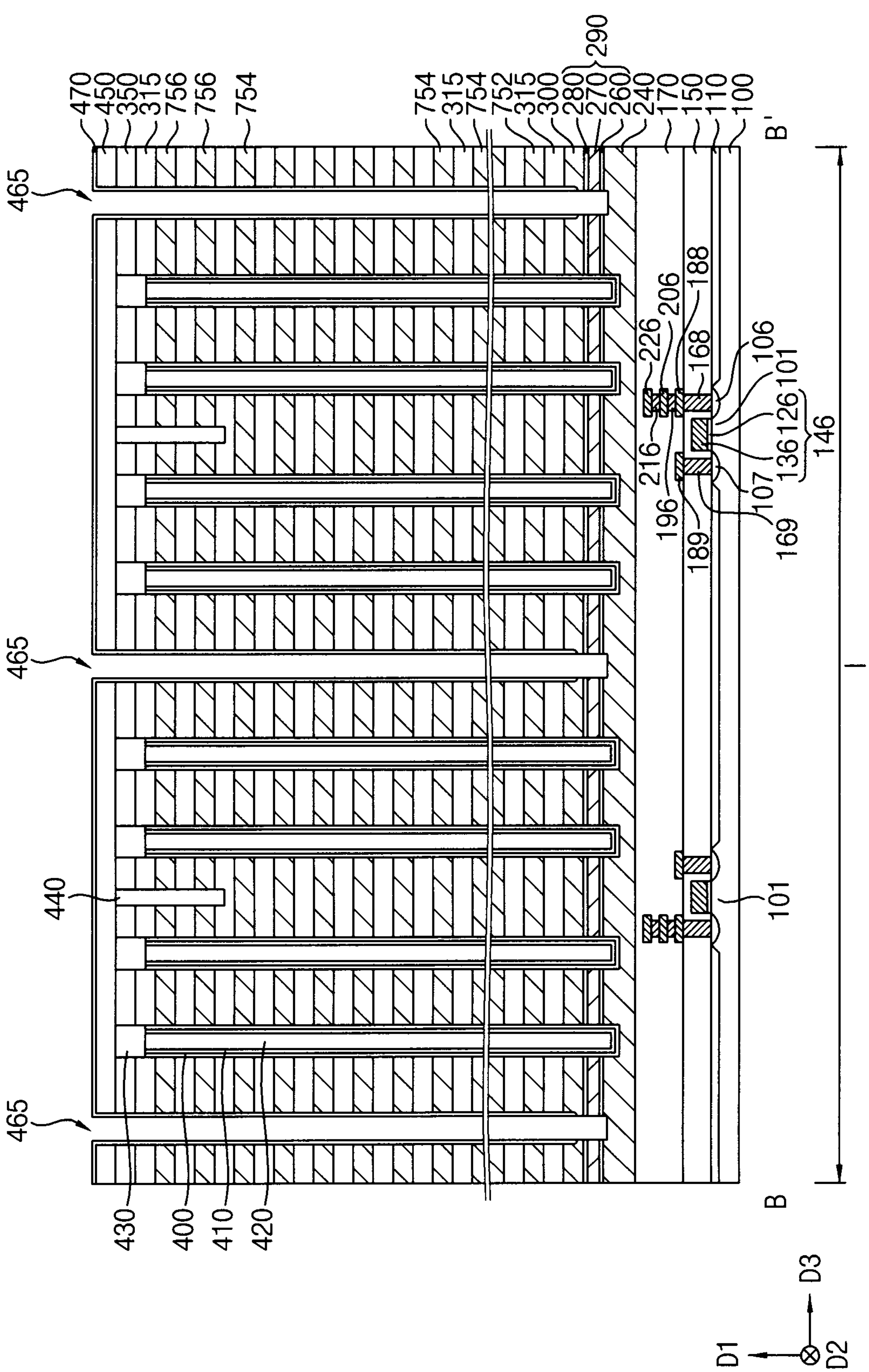

Referring to the exemplary embodiments of FIGS. 2 and 3 together with FIGS. 11 and 20, in an exemplary embodiment, a first transistor may be disposed on the second region II of the substrate 100, and second to fourth transistors may be disposed on the first region I of the substrate 100. The second and fourth transistors may be disposed on a portion of the first region I adjacent to the second region II of the substrate 100. In an exemplary embodiment, each of the first, second and fourth transistors may serve as a pass transistor.

As shown in the exemplary embodiment of FIG. 3, the first transistor may include a first lower gate structure 142, and first and second impurity regions 102 and 103 serving as source/drains, respectively, at upper portions of the active region 101 adjacent thereto. As shown in the exemplary embodiment of FIG. 20, the second transistor may include a second lower gate structure 144, and third and fourth impurity regions 104 and 105 serving as source/drains, respectively, at upper portions of the active region 101 adjacent thereto. As shown in the exemplary embodiment of FIG. 11, the third transistor may include a third lower gate structure 146, and fifth and sixth impurity regions 106 and 107 serving as source/drains, respectively, at upper portions of the active region 101 adjacent thereto. As shown in the exemplary embodiment of FIG. 3, the fourth transistor may include a fourth lower gate structure 148, and seventh and eighth impurity regions 108 and 109 serving as source/drains, respectively, at upper portions of the active region 101 adjacent thereto.

As shown in the exemplary embodiment of FIG. 3, the first lower gate structure 142 may include a first lower gate insulation pattern 122 and a first lower gate electrode 132 sequentially stacked on the substrate 100 (e.g., in the first direction D1). As shown in the exemplary embodiment of FIG. 20, the second lower gate structure 144 may include a second lower gate insulation pattern 124 and a second lower gate electrode 134 sequentially stacked on the substrate 100 (e.g., in the first direction D1). As shown in the exemplary embodiment of FIG. 11, the third lower gate structure 146 may include a third lower gate insulation pattern 126 and a third lower gate electrode 136 sequentially stacked on the substrate 100 (e.g., in the first direction D1). As shown in the exemplary embodiment of FIG. 3, the fourth lower gate structure 148 may include a fourth lower gate insulation pattern 128 and a fourth lower gate electrode 138 sequentially stacked on the substrate 100 (e.g., in the first direction D1).

The first insulating interlayer 150 may be disposed on the substrate 100 to cover the first to fourth transistors. The vertical memory device may include first, second, fourth, fifth, seventh, eighth, tenth and eleventh lower contact plugs 162, 163, 165, 166, 168, 169, 802 and 804 extending through the first insulating interlayer 150 (e.g., in the first direction D1) to contact the first to eighth impurity regions 102, 103, 104, 105, 106, 107, 108 and 109, respectively. The vertical memory device may also include third, sixth and twelfth lower contact plugs 164, 167 and 806 extending through the first insulating interlayer 150 (e.g., in the first direction D1) to contact the first, second and fourth lower gate electrodes 132, 134 and 138, respectively, may be formed. Additionally, the vertical memory device may further include a ninth lower contact plug which extends through the first insulating interlayer 150 to contact the third lower gate electrode 136.

The first, second, fourth, fifth, seventh, eighth, fifteenth, sixteenth and seventeenth lower wirings 182, 183, 185, 186, 188, 189, 812, 814 and 816 may be disposed on the first insulating interlayer 150 to contact the first, second, fourth, fifth, seventh, eighth, tenth, eleventh and twelfth lower contact plugs 162, 163, 165, 166, 168, 169, 802, 804 and 806 respectively. For example, the first, second, fourth, fifth, seventh, eighth, fifteenth, sixteenth and seventeenth lower wirings 182, 183, 185, 186, 188, 189, 812, 814 and 816 may be disposed on an upper surface of the first insulating interlayer 150. The third, sixth and seventeenth lower wirings 184, 187 and 816 may be formed on the first insulating interlayer 150 to contact the third, sixth and twelfth lower contact plugs 164, 167 and 806, respectively. For example, the third, sixth and seventeenth lower wirings 184, 187 and 816 may be disposed on an upper surface of the first insulating interlayer 150.

A first lower via 192, a ninth lower wiring 202, a fourth lower via 212 and a twelfth lower wiring 222 may be sequentially stacked (e.g., in the first direction D1) on the first lower wiring 182. A second lower via 194, a tenth lower wiring 204, a fifth lower via 214 and a thirteenth lower wiring 224 may be sequentially stacked (e.g., in the first direction D1) on the fourth lower wiring 185. A third lower via 196, an eleventh lower wiring 206, a sixth lower via 216 and a fourteenth lower wiring 226 may be sequentially stacked (e.g., in the first direction D1) on the seventh lower wiring 188. A seventh lower via 822, an eighteenth lower wiring 832, an eighth lower via 842 and a nineteenth lower wiring 852 may be sequentially stacked on the fifteenth lower wiring 812.

The second insulating interlayer 170 may be disposed on the first insulating interlayer 150 to cover the first to seventeenth lower wirings 182, 183, 184, 185, 186, 187, 188, 189, 202, 204, 206, 222, 224, 226, 812, 814 and 816 and the first to eighth lower vias 192, 194, 196, 212, 214, 216, 822 and 842.

In an exemplary embodiment, the first lower gate structure 142 of the first transistor may be connected to a driving circuit through the third lower contact plug 164 and the third lower wiring 184, and the second impurity region 103 of the first transistor may be connected to a driving circuit through the second lower contact plug 163 and the second lower wiring 183. For example, the first transistor may transfer electrical signals from the driving circuits to the first lower contact plug 162, the first lower wiring 182, the first lower via 192, the ninth lower wiring 202, the fourth lower via 212 and the twelfth lower wiring 222.

The second lower gate structure 144 of the second transistor may be connected to a driving circuit through the fifth lower contact plug 166 and the fifth lower wiring 186, and the fourth impurity region 103 of the second transistor may be connected to a driving circuit through the sixth lower contact plug 167 and the sixth lower wiring 187. For example, the second transistor may transfer electrical signals from the driving circuits to the fourth lower contact plug 165, the fourth lower wiring 185, the second lower via 194, the tenth lower wiring 204, the fifth lower via 214 and the thirteenth lower wiring 224.

The fourth lower gate structure 148 of the fourth transistor may be connected to a driving circuit through the twelfth lower contact plug 806 and the seventeenth lower wiring 816, and the eighth impurity region 109 of the second transistor may be connected to a driving circuit through the eleventh lower contact plug 804 and the sixteenth lower wiring 814. For example, the fourth transistor may transfer electrical signals from the driving circuits to the tenth lower contact plug 802, the fifteenth lower wiring 812, the seventh lower via 822, the eighteenth lower wiring 832, the eighth lower via 842 and the eighteenth lower wiring 852.

In an exemplary embodiment, each element of the lower circuit pattern may be formed by a patterning process and/or a damascene process.

Figure 4:
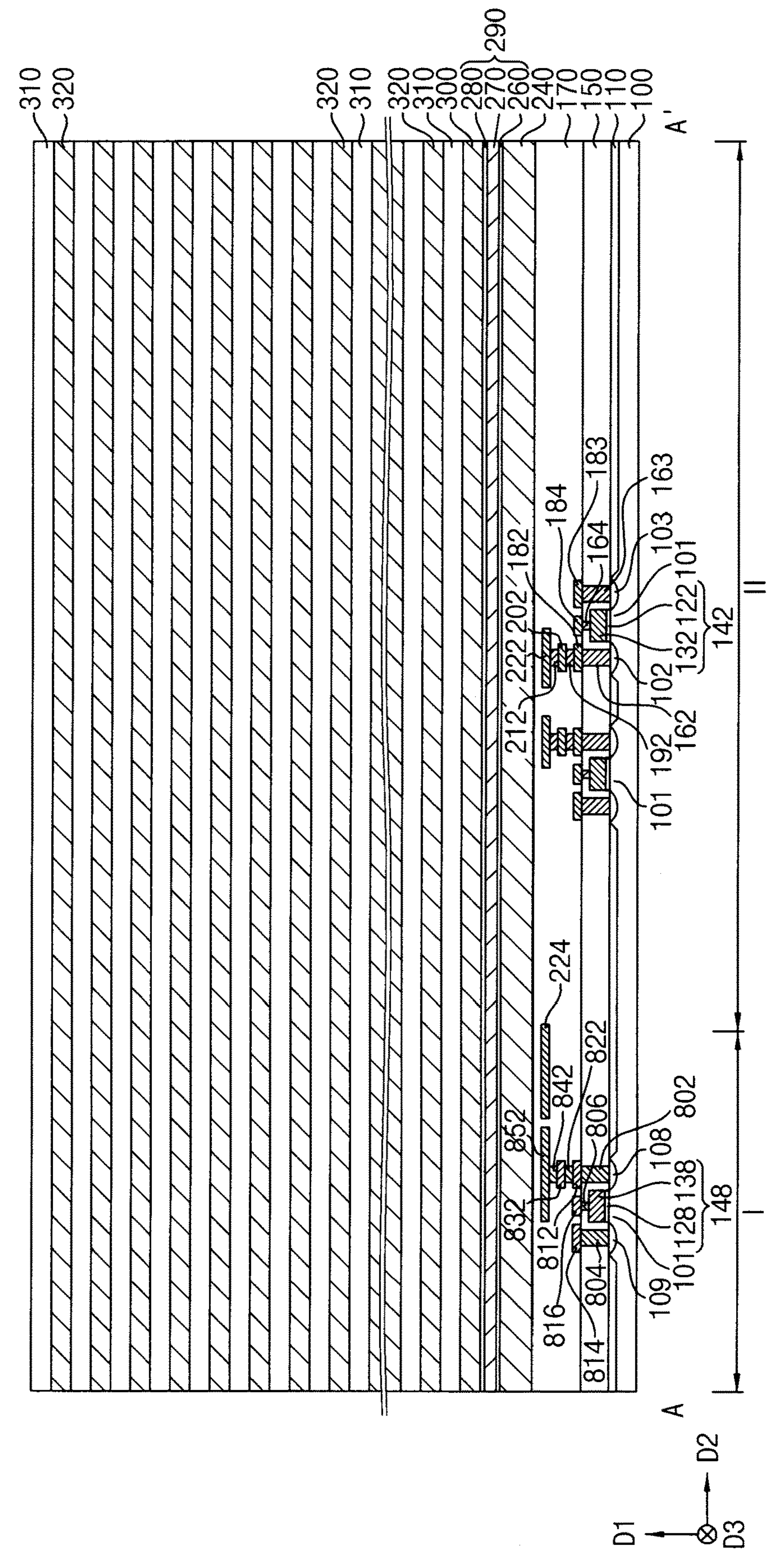

Referring to the exemplary embodiment of FIG. 4, a common source plate (CSP) 240, a sacrificial layer structure 290, and a support layer 300 may be sequentially disposed on the second insulating interlayer 170 (e.g., in the first direction D1).

In an exemplary embodiment, the CSP 240 may include polysilicon doped with n-type impurities. Alternatively, the CSP 240 may include a metal silicide layer and a polysilicon layer doped with n-type impurities that are sequentially stacked (e.g., in the first direction D1). In an exemplary embodiment, the metal silicide layer may include tungsten silicide, etc. However, exemplary embodiments of the present inventive concepts are not limited thereto.

The sacrificial layer structure 290 may include first to third sacrificial layers 260, 270 and 280 sequentially stacked (e.g., in the first direction D1). The first and third sacrificial layers 260 and 280 may include an oxide, such as silicon oxide, etc. and the second sacrificial layer 270 may include a nitride, such as silicon nitride, etc.

The support layer 300 may include a material having an etching selectivity with respect to the first to third sacrificial layers 260, 270 and 280. For example, the support layer 300 may include polysilicon doped with n-type impurities. However, exemplary embodiments of the present inventive concepts are not limited thereto. A portion of the support layer 300 may extend through the sacrificial layer structure 290 to contact an upper surface of the CSP 240, which may form a support pattern.

An insulation layer 310 and a gate electrode layer 320 may be alternately and repeatedly stacked on the support layer 300 in the first direction D1. Accordingly, a mold layer including a plurality of insulation layers 310 and a plurality of gate electrode layers 320 alternately and repeatedly stacked in the first direction D1 may be disposed on the support layer 300. In an exemplary embodiment, the insulation layer 310 may include an oxide, such as silicon oxide, and the gate electrode layer 320 may include, polysilicon doped with n-type impurities. However, exemplary embodiments of the present inventive concepts are not limited thereto.

Figure 5:
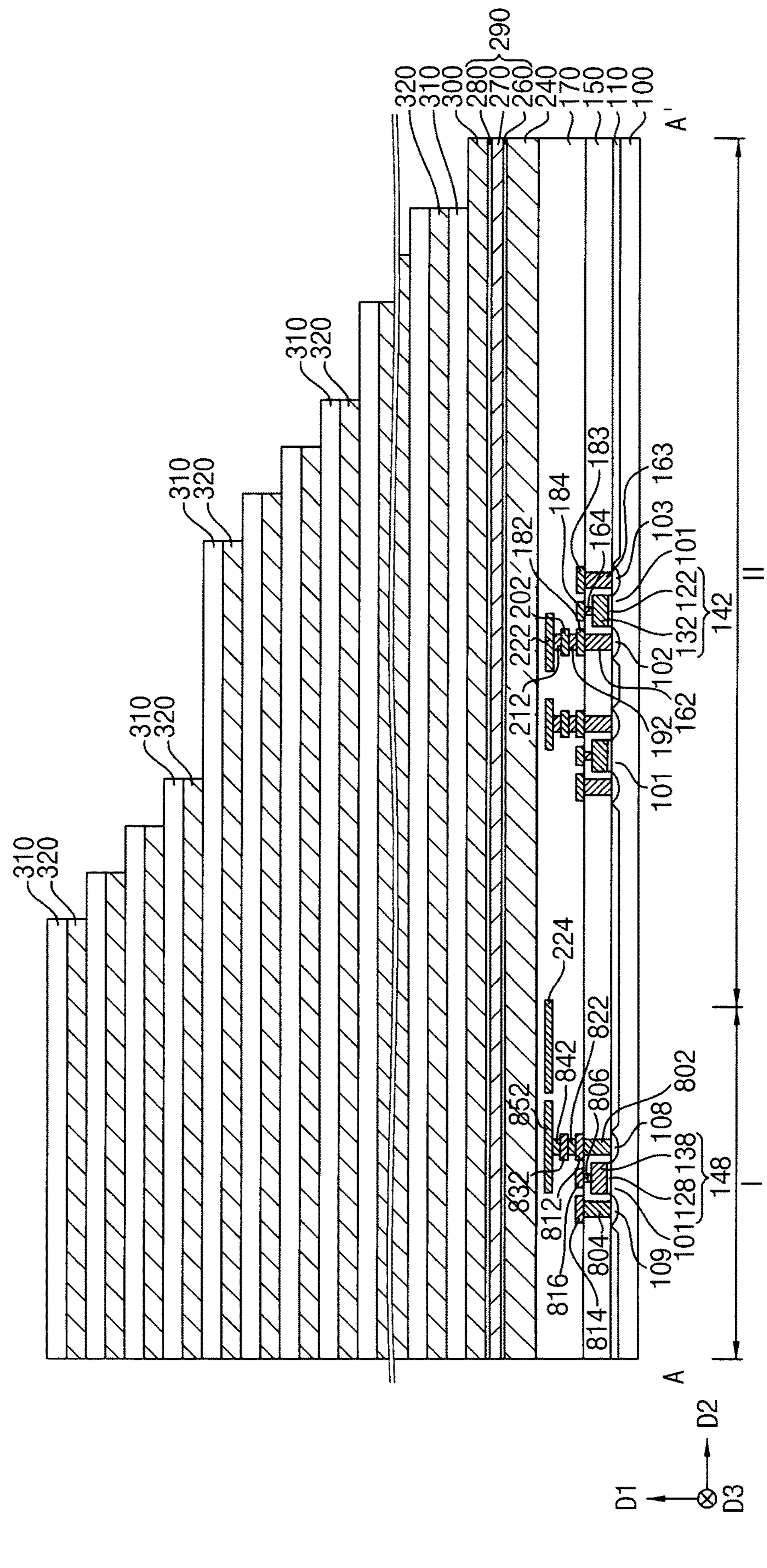

Referring to the exemplary embodiment of FIG. 5, a photoresist pattern partially covering an uppermost one of the insulation layers 310 may be disposed thereon. The uppermost one of the insulation layers 310, and an uppermost one of the gate electrode layers 320 thereunder may be etched using the photoresist pattern as an etching mask. Accordingly, a portion of one of the insulation layers 310 directly under the uppermost one of the gate electrode layers 320 may be exposed.

After a trimming process for reducing an area of the photoresist pattern by a given ratio is performed, an etching process may be performed such that the uppermost one of the insulation layers 310, the uppermost one of the gate electrode layers 320, the exposed one of the insulation layers 310 and one of the gate electrode layers 320 thereunder may be etched using the reduced photoresist pattern as an etching mask. As the trimming process and the etching process are repeatedly performed, a mold including a plurality of step layers which may include the gate electrode layer 320 and the insulation layer 310 sequentially stacked and having a staircase shape may be formed. As shown in the exemplary embodiment of FIG. 5, the step layers may have a width (e.g., length in the second direction D2) that increases as the distance (e.g., in the first direction D1) from an upper surface of the substrate 100 decreases.

Hereinafter, each of the "step layers" may be considered to include not only an exposed portion, but also a portion thereof covered by upper step layers, and thus may refer to an entire portion of the gate electrode layer 320 and an entire portion of the insulation layer 310 at each level. The exposed portion of the step layer not covered by upper step layers may be referred to as a "step." In an exemplary embodiment, the steps may be arranged in the second region II in each of the second and third directions D2 and D3. For example, the steps may be arranged in the second direction D2 on a portion of the second region II of the substrate 100 adjacent to the first region I of the substrate 100 in the second direction D2, and may be arranged in the third direction D3 on a portion of the second region II of the substrate 100 adjacent to the first region I of the substrate 100 in the third direction D3.

In an exemplary embodiment, lengths in each of the second and third directions D2 and D3 of a first plurality of the steps in the mold may be substantially identical. Lengths in each of the second and third directions D2 and D3 of a second plurality of steps may be substantially identical to each other and may be greater than the lengths of the steps in each of the second and third directions D2 and D3 of the first plurality of steps. In an exemplary embodiment, the first plurality of steps may form a majority of the steps of the mold layer. Hereinafter, steps of the first plurality of steps having a relatively small length may be referred as first steps, respectively, and steps of the second plurality of steps having a relatively large length may be referred to as second steps, respectively. FIG. 5 shows two second steps. The steps are shown by dotted lines in each of the plan views figures, such as FIG. 6, etc.

The mold may be disposed on the support layer 300 on the first and second regions I and II of the substrate 100, and an upper surface of a lateral edge of the support layer 300 may not be covered by the mold and may be exposed. Each of the steps in the mold may be disposed on the second region II of the substrate 100.

Figure 6:
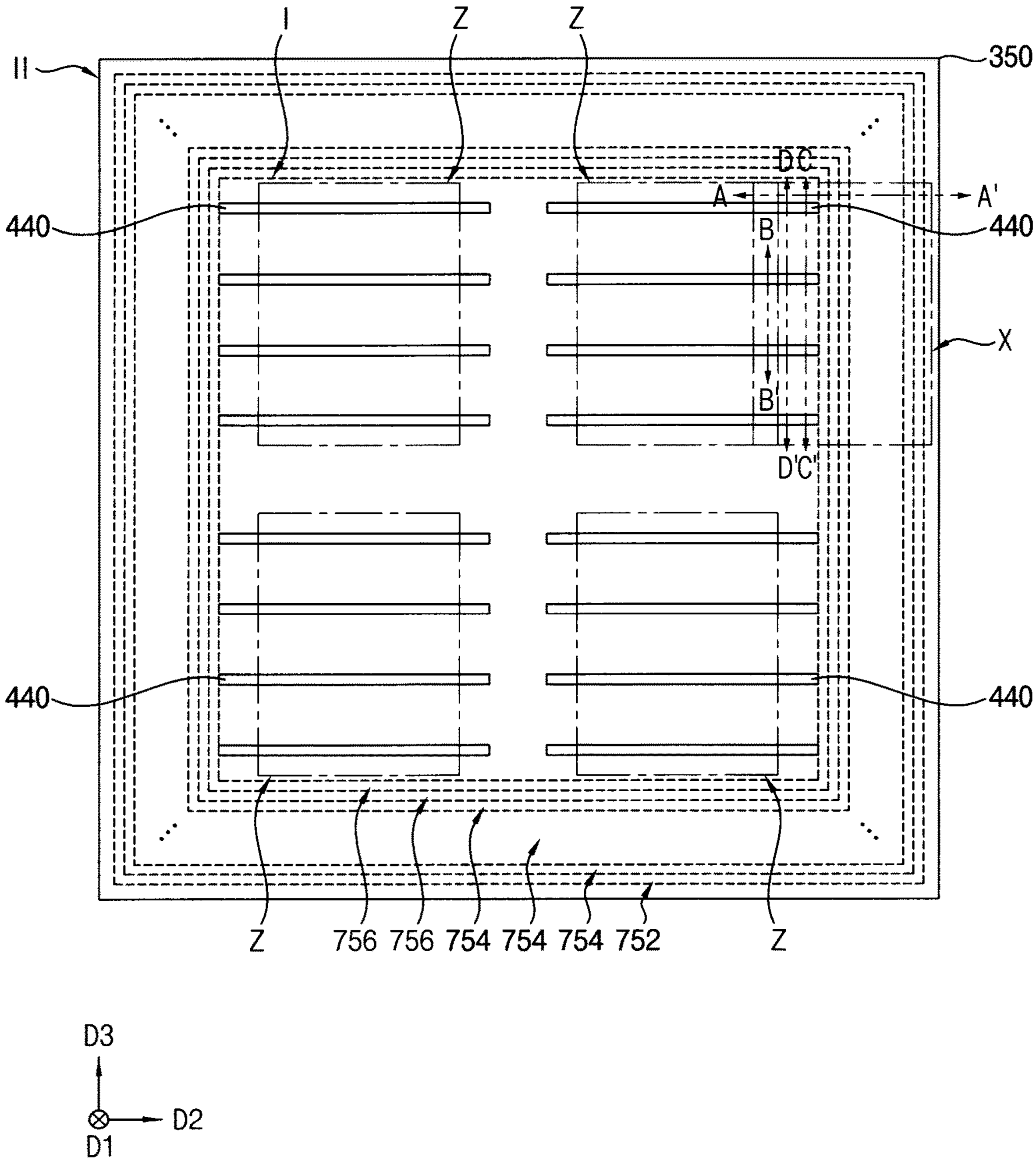
Figure 8A:
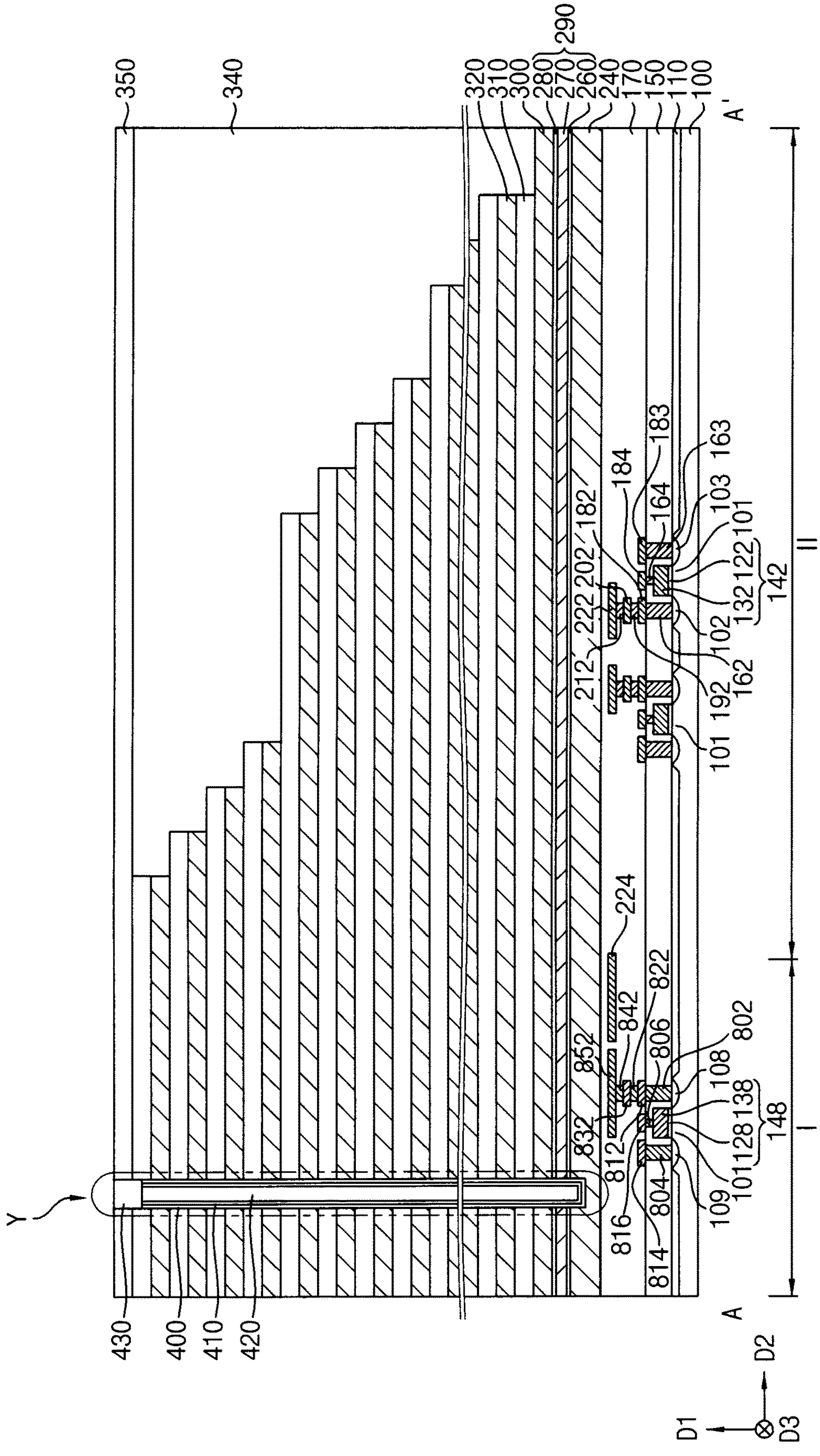
Figure 8B:
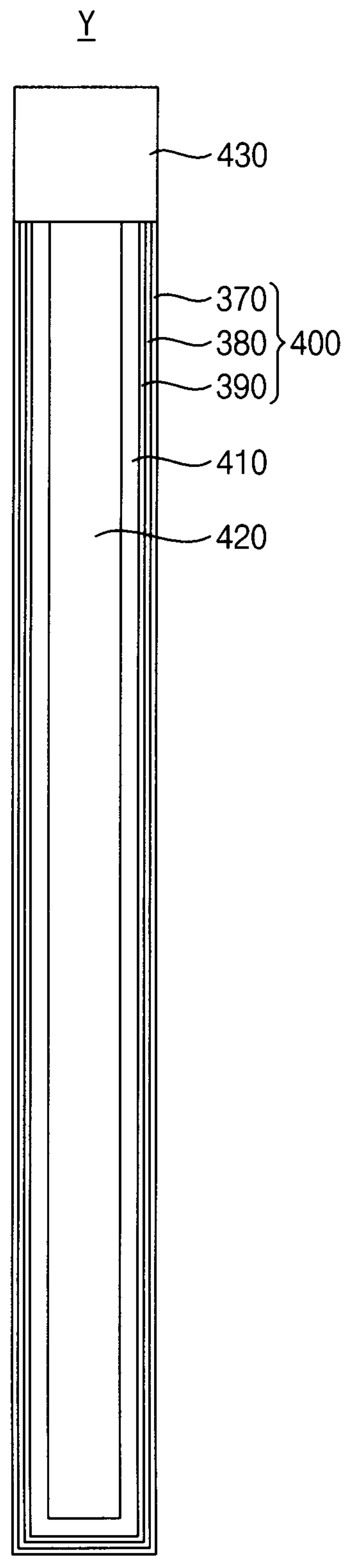

Referring to the exemplary embodiments of FIGS. 6, 8A and 8B, a third insulating interlayer 340 may be disposed on the CSP 240 to cover the mold and the exposed upper surface of the lateral edge of the support layer 300. An upper portion of the third insulating interlayer 340 may be planarized until an upper surface of the uppermost one of the insulation layers 310 is exposed. For example, an upper surface of the insulation layer 310 on the highest level may be exposed. Therefore, a sidewall of the mold may be covered by the third insulating interlayer 340. A fourth insulating interlayer 350 may be disposed on the mold and the third insulating interlayer 340.

A channel hole may be formed through the fourth insulating interlayer 350, the mold, the support layer 300 and the sacrificial layer structure 290 to expose an upper surface of a portion of the CSP 240 on the first region I of the substrate 100 and may extend in the first direction D1. In an exemplary embodiment, a plurality of channel holes may be formed to be spaced apart from each other in each of the second and third directions D2 and D3.

A charge storage structure layer and a channel layer may be sequentially disposed on sidewalls of the channel holes, the exposed upper surface of the CSP 240, and the fourth insulating interlayer 350, and a filling layer may be formed on the channel layer to fill the channel holes. As shown in the exemplary embodiment of FIG. 8A, the filling layer, the channel layer and the charge storage structure layer may be planarized until the upper surface of the fourth insulating interlayer 350 is exposed to form a charge storage structure 400, a first channel 410 and a filling pattern 420 sequentially stacked in each of the channel holes. Each of the charge storage structure 400, the first channel 410 and the filling pattern 420 may extend in the first direction D1, and thus the first channel 410 may be referred to as a vertical channel.

As shown in the exemplary embodiment of FIG. 8B, the charge storage structure 400 may include a tunnel insulation pattern 390, a charge storage pattern 380 and a first blocking pattern 370 sequentially stacked in a horizontal direction substantially parallel to the upper surface of the substrate 100 from an outer sidewall of the first channel 410. The charge storage structure 400 may also include the tunnel insulation pattern 390, the charge storage pattern 380 and the first blocking pattern 370 sequentially stacked in the first direction D1 from a lower surface of the first channel 410. The tunnel insulation pattern 390 and the first blocking pattern 370 may include an oxide, such as silicon oxide, etc. The charge storage pattern 380 may include a nitride, such as silicon nitride, etc. The filling pattern 420 may include an oxide, such as silicon oxide, etc. However, exemplary embodiments of the present inventive concepts are not limited thereto.

Upper portions of the charge storage structure 400, the first channel 410 and the filling pattern 420 sequentially stacked in each of the channel holes may be removed to form a first trench. A capping pattern 430 may be disposed in the first trench to fill the first trench. In an exemplary embodiment, the capping pattern 430 may include polysilicon doped with n-type impurities, etc.

In an exemplary embodiment, a plurality of first channels 410 may be spaced apart from each other in each of the second and third directions D2 and D3, and thus a channel array may be defined. A region where the channel array is formed may be referred to as a vertical channel region Z. As shown in the exemplary embodiment of FIG. 6, four vertical channel regions Z may be spaced apart from each other in each of the second and/or third directions D2 and D3. However, exemplary embodiments of the present inventive concepts are not limited thereto.

Figure 7:
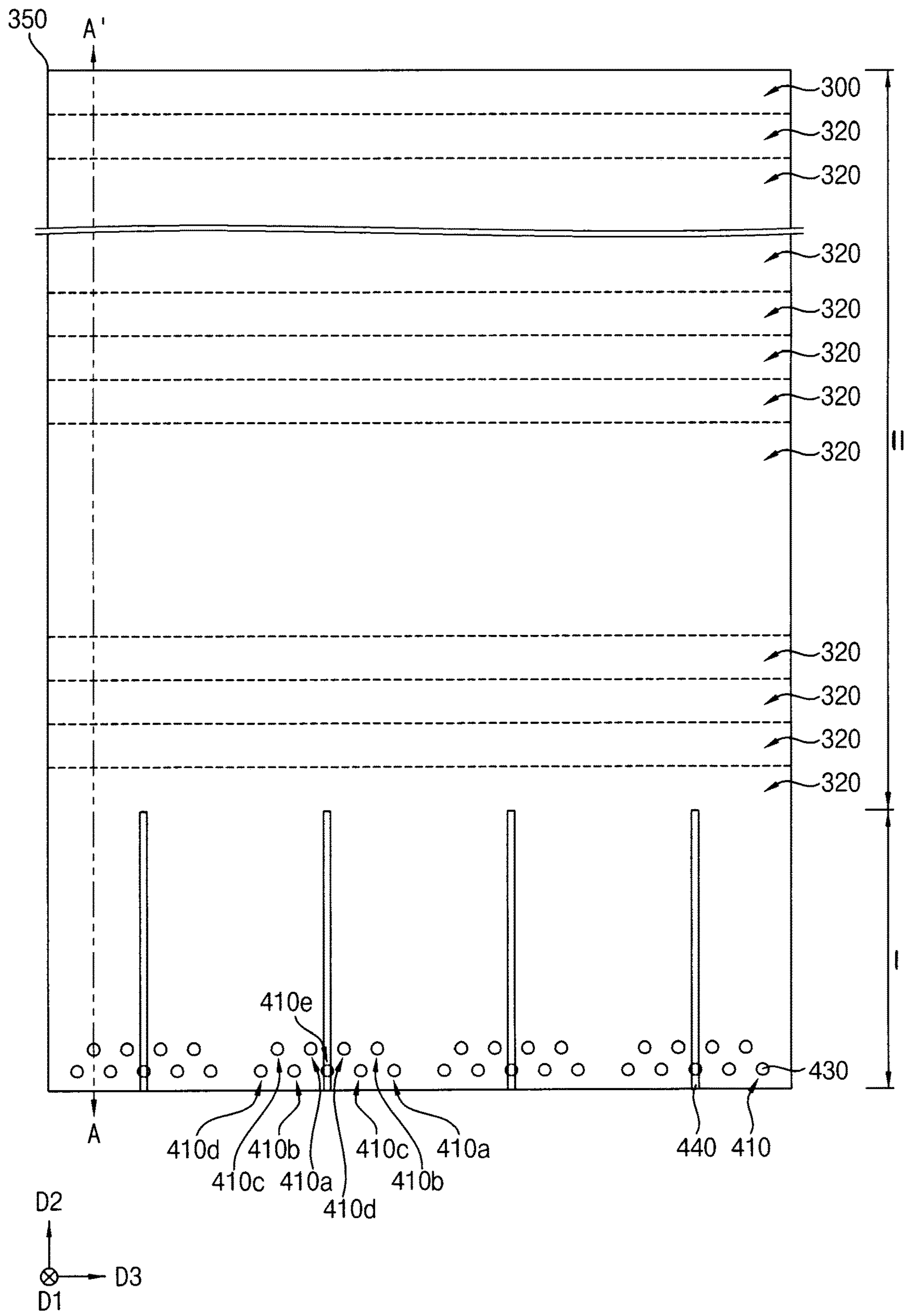

As shown in the exemplary embodiment of FIG. 7, the channel array may include a first channel column 410*a* including the first channels 410 arranged in the second direction D2, and a second channel column 410*b* including the first channels 410 arranged in the second direction D2. The second channel column 410*b* may be spaced apart from the first channel column 410*a* in the third direction D3, in the vertical channel region Z. In an exemplary embodiment, the first channels 410 included in the first channel column 410*a* may be located at an acute angle in the second direction D2 or the third direction D3 with respect to the first channels 410 included in the second channel column 410*b*.

The first and second channel columns 410*a* and 410*b* may be alternately and repeatedly arranged in the third direction D3 in the vertical channel region Z. In an exemplary embodiment, five first channel columns 410*a* and four second channel columns 410*b* may be alternately disposed in the third direction D3, which may form a channel group.

Hereinafter, four channel columns disposed in each channel group may be referred to as first, second, third and fourth channel columns 410*a*, 410*b*, 410*c* and 410*d*, respectively, in this order. A channel column at a central portion (e.g., in the third direction D3) of the channel group may be referred to as a fifth channel column 410*e*, and the other four channel columns may be referred to as first, second, third and fourth channel columns 410*a*, 410*b*, 410*c* and 410*d*, respectively.

Two adjacent channel groups arranged in the third direction D3 may form a channel block. Memory cells each including the first channels 410, the charge storage structures 400, and gate electrodes illustrated later may also define a memory group and a memory block, correspondingly. The unit of the memory block in the vertical memory device may be configured to perform an erase operation. FIG. 7 shows a portion of two memory blocks arranged (e.g., spaced apart) in the third direction D3 and divided by a second opening 465 (refer to FIG. 10) in the vertical channel region Z, and each of the memory blocks includes two memory groups disposed in the third direction D3 and are divided by the second opening 465.

The fourth insulating interlayer 350, and some of the insulation layers 310 and the gate electrode layers 320 of the mold may be partially etched to form first openings extending therethrough in the first direction D1 and the second direction D2. The first openings may be arranged in the third direction D3. As shown in the exemplary embodiment of FIG. 6, a first division pattern 440 may be formed in the first openings.

In an exemplary embodiment, the first division pattern 440 may extend through upper portions of some of the first channels 410. For example, in an exemplary embodiment, the first division pattern 440 may extend through the first channels 410 included in the fifth channel column 410*e* in each channel group. Additionally, as shown in FIG. 11, the first division pattern 440 may extend (e.g., in the first direction D1) through the fourth insulating interlayer 350, gate electrode layers 320 at the upper two levels, respectively, insulation layers 310 at upper two levels, respectively, and partially through insulation layers 310 at a third highest level.

The first division pattern 440 may extend in the second direction D2 in the vertical channel region Z and a region adjacent thereto in the second direction D2, and a plurality of first division patterns 440 may be spaced apart from each other in the third direction D3. The first division pattern 440 may divide the memory blocks from each other (e.g., in the third direction D3). For example, as shown in the exemplary embodiment of FIG. 6, four first division patterns 440 may be disposed to be spaced apart from each other in the third direction D3 in the vertical channel region Z, and one first division pattern 440 may be formed in each memory group so that two first division patterns 440 may be formed in each memory block.

Figure 9:
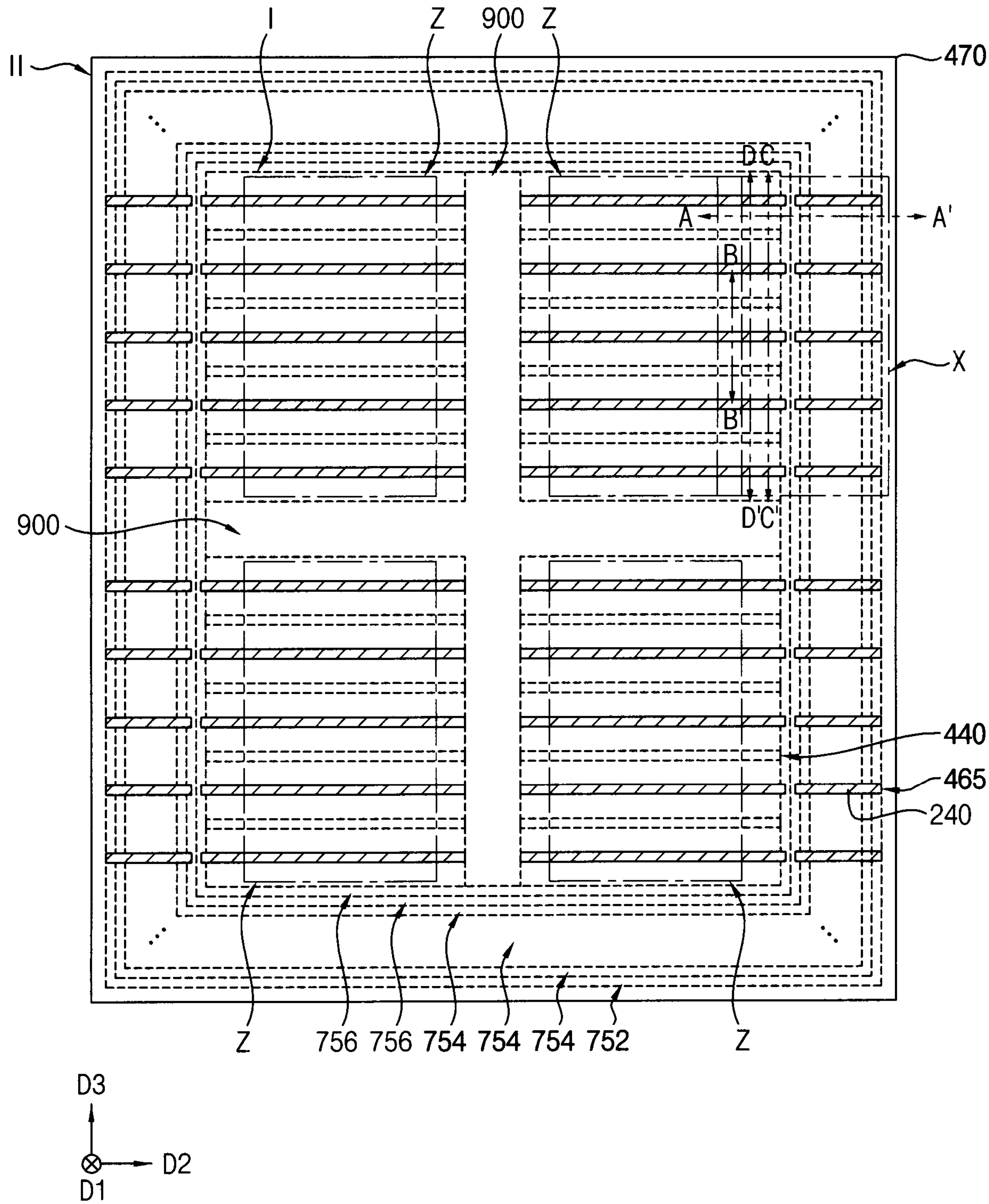
Figure 10:
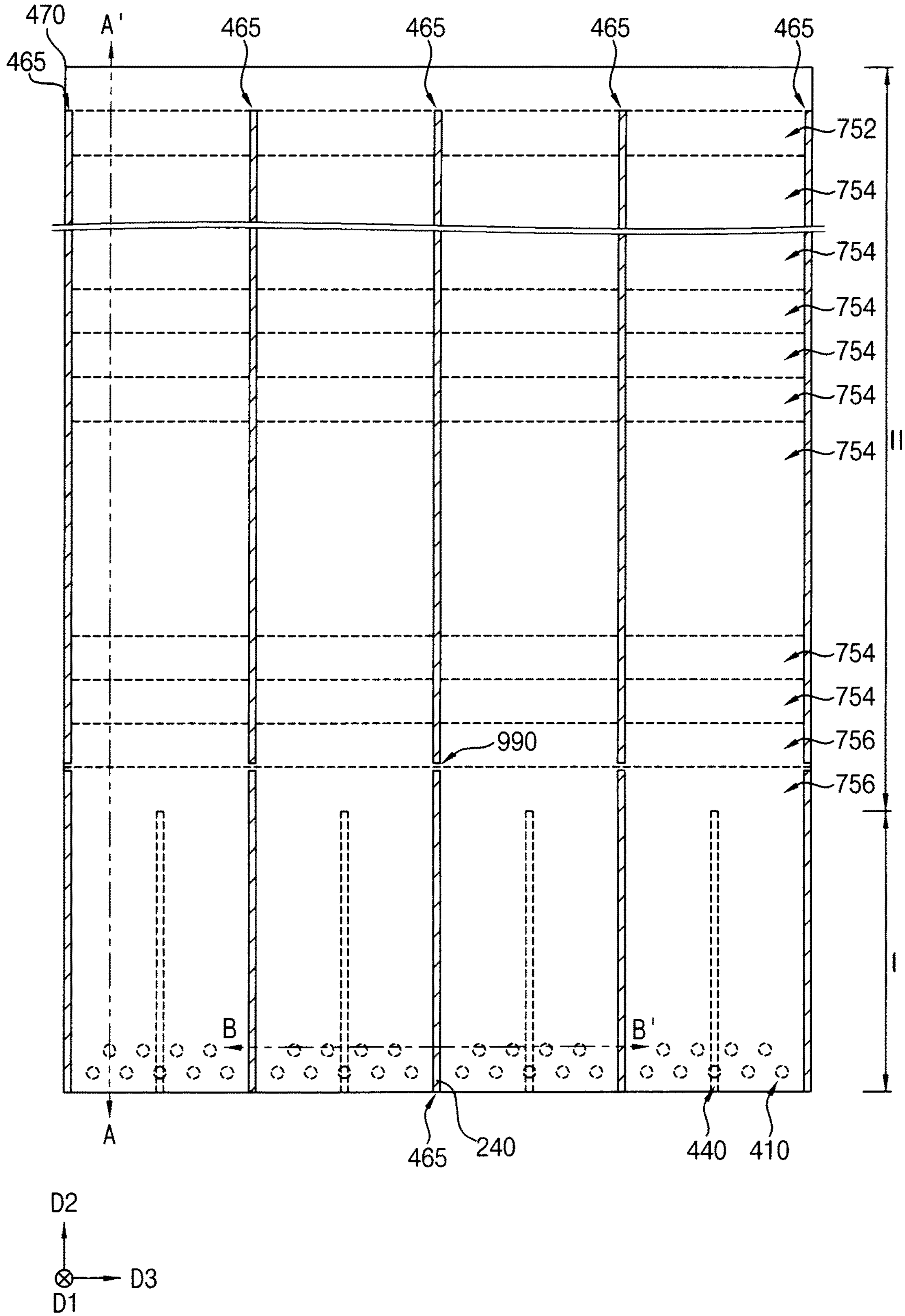

Referring to the exemplary embodiments of FIGS. 9 to 11, a fifth insulating interlayer 450 may be disposed on the fourth insulating interlayer 350, the capping pattern 430 and the first division pattern 440, and the second opening 465 may be formed through the third to fifth insulating interlayers 340, 350 and 450 and the mold (e.g., in the first direction D1).

In an exemplary embodiment, the second opening 465 may extend in the second direction D2 on the first and second regions I and II of the substrate 100. The second opening 465 may extend in the second direction D2 in the vertical channel region Z and an area adjacent thereto in the second direction D2, and may extend to an end in the second direction D2 of the mold having a staircase shape. However, the second opening 465 may be partially discontinuous on the second region II of the substrate 100. Therefore, the mold may not be entirely divided in the third direction D3 by the second opening 465 on the second region II of the substrate 100. As shown in the exemplary embodiment of FIG. 10, molds at opposite lateral sides in the third direction D3 of the second opening 465 may be connected with each other by a first connecting portion 990. In an exemplary embodiment, the first connecting portion 990 may extend downwardly in the first direction D1 from a boundary between an uppermost step and a step at the second highest level. However, exemplary embodiments of the present inventive concepts are not limited thereto.

The etching process may be performed until the second opening 465 exposes an upper surface of the support layer 300, and the second opening 465 may further extend through an upper portion of the support layer 300. As the second opening 465 is formed, sidewalls of the insulation layers 310 and the gate electrode layers 320 of the mold may be exposed, and the insulation layers 310 and the gate electrode layers 320 may be divided into first insulation patterns 315 and gate electrodes, respectively.

As illustrated above, the first insulation patterns 315 and the gate electrodes at opposite lateral sides of the second opening 465 may not entirely divided and may be partially connected with each other by the first connecting portion 990. For example, the first connecting portion 990 of the mold may include a connecting pattern of the first insulation pattern 315 and a connection pattern of the gate electrode. The first insulation patterns 315 disposed at opposite lateral sides (e.g., in the third direction D3) of the second opening 465 may be connected with each other and the gate electrodes at opposite lateral sides of the second opening 465 (e.g., in the third direction D3) may be connected with each other by the first connection portion 990.

Additionally, each of the second openings 465 may be formed in the vertical channel region Z and an area adjacent thereto in the second direction D2, which may be referred to as a switching transistor region. The second openings 465 may be partially discontinuous in the second direction D2. Thus, the insulation layers 310 and the gate electrode layers 320 may partially remain on the first region I of the substrate 100 to form a second connecting portion, and the first insulation patterns 315 and the gate electrodes in the vertical channel regions Z and the switching transistor regions may not be entirely divided in the second and third directions D2 and D3 and may be connected. The second connecting portion of the mold may have a shape of a cross including first and second extension portions extending in the second and third directions D2 and D3, respectively, in a plan view (e.g., in a plane defined in the second and third directions D2, D3).

Hereinafter, portions of the first region I of the substrate 100 that may be divided by the first and second connecting portions of the mold may be referred to as cell array regions, respectively, and the gate electrode layers 320 included in the second connection portion may be referred to as a first conductive path 900. The first conductive path 900 may include a plurality of gate electrode layers 320 spaced apart from each other in the first direction D1. Each of the cell array regions may include the vertical channel region Z and the switching transistor regions disposed at opposite lateral sides in the second direction D2 of the vertical channel region Z. In the exemplary embodiment of FIG. 9, the vertical memory device includes four cell array regions. However, exemplary embodiments of the present inventive concepts are not limited thereto.

In an exemplary embodiment, each of the gate electrodes may extend in the second direction D2 on the cell array region of the substrate 100, and a plurality of gate electrodes stacked in the first direction D1 may form a gate electrode structure. The gate electrode structure may have a staircase shape including step layers of the gate electrodes. A step on each step layer is not overlapped by upper step layers. For example, a lateral end portion of each step layer in the second direction D2 which is exposed may be referred to as a pad. In an exemplary embodiment, the gate electrode structure may have the steps or pads at one lateral end in the second direction D2 that may be distal to the second extension portion of the second connecting portion of the mold.

In an exemplary embodiments, a plurality of gate electrode structures may be disposed in the third direction D3 on the cell array region of the substrate 100, and the plurality of gate electrode structures are spaced apart from each other in the third direction D3 by the second opening 465. However, as illustrated above, the gate electrode structures at opposite lateral sides of the second opening 465 may not be entirely divided from each other in the third direction D3 and are partially connected with each other by the connecting pattern of the gate electrode in the second extension portion of the first connecting portion 990 of the mold. Therefore, the gate electrode structures on the same cell array region may be referred to as one gate electrode structure.

The gate electrode structure may include first, second and third gate electrodes 752, 754 and 756 sequentially stacked in the first direction D1. In an exemplary embodiment, the first gate electrode 752 may be formed at a lowermost level to serve as a ground selection line (GSL), the third gate electrode 756 may be formed at an uppermost level and a second level from above to serve as a string selection line (SSL), and the second gate electrode 754 may be formed at a plurality of levels disposed between the first and third gate electrodes 752 and 756 (e.g., in the first direction D1) to serve as word lines. However, in an exemplary embodiment, a gate electrode through which an erase operation may be performed by using gate induced drain leakage (GIDL) phenomenon may be further disposed under the first gate electrode 752 and/or over the third gate electrode 756.

However, exemplary embodiments of the present inventive concepts are not limited to the number of stacks of each of the first to third gate electrodes 752, 754 and 756 shown in the exemplary embodiment of FIG. 10 and the number of the stacks of each of the first to third gate electrodes 752, 754 and 756 may vary in other exemplary embodiments.

In an exemplary embodiment, the second opening 465 may extend in the second direction D2 between memory groups on the cell array region and a portion of the second region II of the substrate 100 adjacent thereto in the second direction D2, and a plurality of second openings 465 may be arranged in the third direction D3. For example, in an exemplary embodiment, a shared memory block including a plurality of memory blocks that share gate electrodes with each other may be formed on the cell array region of the substrate 100, and the second opening 465 may be formed between the memory blocks in the shared memory block, at opposite lateral ends in the third direction D3 of each of the memory blocks, and between memory groups in each of the memory blocks.

The exemplary embodiment of FIG. 10 shows two memory blocks each including two memory groups that share gate electrodes with each other to form a shared memory block. Therefore, three second openings 465 are formed in the shared memory block and two second openings 465 are formed at opposite lateral sides, respectively, in the third direction D3 of the shared memory block. However, exemplary embodiments of the present inventive concepts are not limited thereto and the number of the memory blocks included in each memory block, and the number of the memory blocks included in each shared memory block may vary in other exemplary embodiments. For example, in another exemplary embodiment, one shared memory block may include, four or eight memory blocks therein.

In the shared memory block shown in the exemplary embodiments of FIGS. 9 and 10, word lines at each level, SSLs at each level, and GSLs at each level may be connected with each other by the connecting pattern of the gate electrode in the first connecting portion 990 of the mold to be shared. Therefore, the shared memory block may include one word line at each level, one SSL at each level, and one GSL at each level. As the shared memory block shares the first to third gate electrodes 752, 754 and 756 at each level, each step of the gate electrode structure at the lateral end (e.g., in the second direction D2) that is distal end to the second extension portion of the second connecting portion of the mold may serve as a pad.

In an exemplary embodiment, a spacer layer may be formed on a sidewall of the second opening 465 and an upper surface of the fifth insulating interlayer 450, and a portion of the spacer layer on a bottom of the second opening 465 may be removed by an anisotropic etching process to form a spacer 470, and a portion of the support layer 300 may be partially exposed.

The exposed portion of the support layer 300 and a portion of the sacrificial layer structure 290 thereunder may be removed to enlarge the second opening 465 downwardly in the first direction D1. Therefore, as shown in the exemplary embodiment of FIG. 11, the second opening 465 may expose an upper surface of the CSP 240, and may further extend through an upper portion of the CSP 240 in the first direction D1.

In an exemplary embodiment, the spacer 470 may include undoped polysilicon. When the sacrificial layer structure 290 is partially removed, the sidewall of the second opening 465 may be covered by the spacer 470. Therefore, the first insulation patterns 315 and the gate electrodes 752, 754 and 756 of the mold may not be removed.

Figure 12:
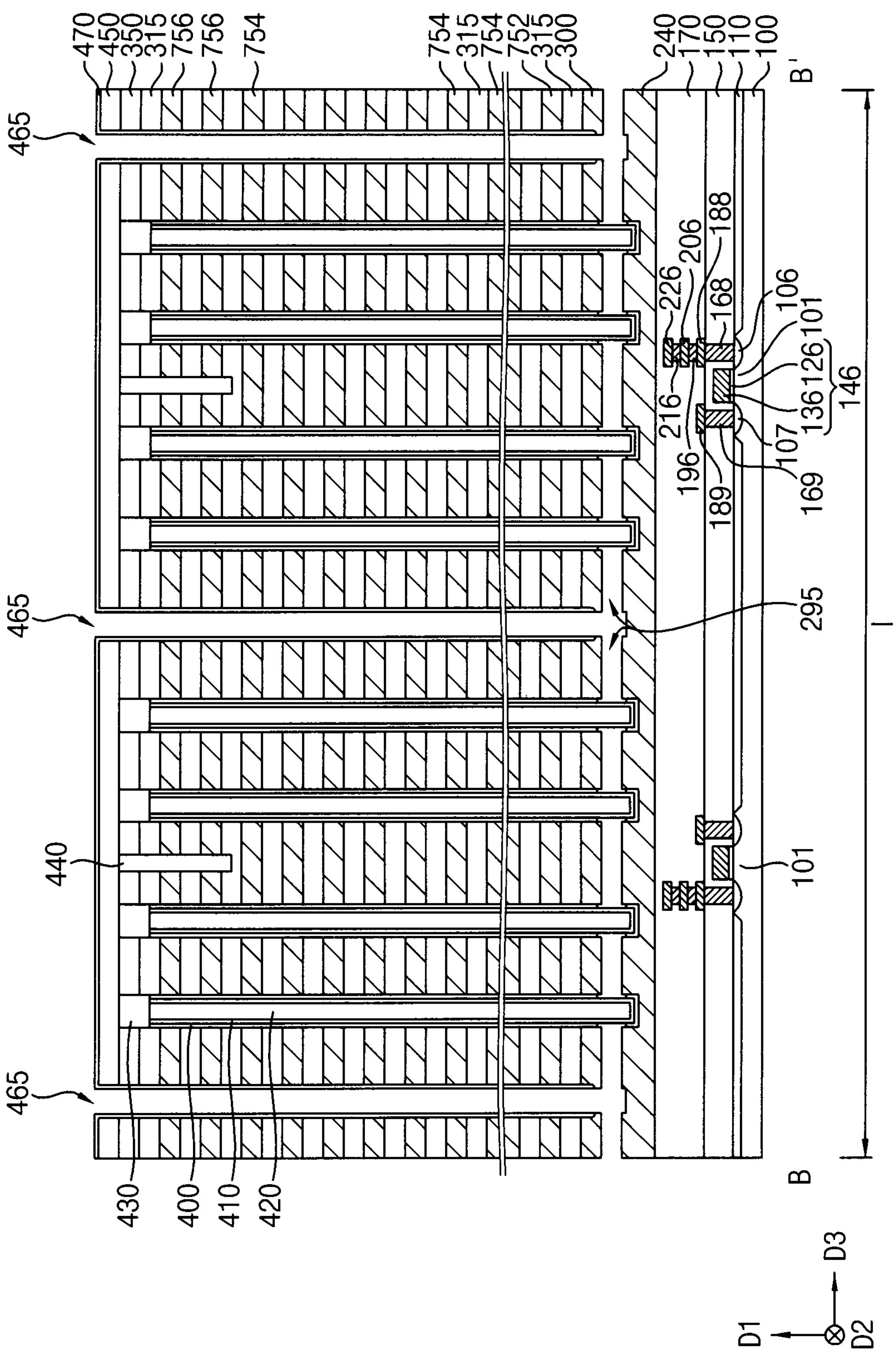

Referring to the exemplary embodiment of FIG. 12, the sacrificial layer structure 290 may be removed through the second opening 465 by a wet etching process, etc., and thus a first gap 295 may be formed. However, exemplary embodiments of the present inventive concepts are not limited thereto.

In an exemplary embodiment, the wet etching process may be performed using hydrofluoric acid (HF) and/or phosphoric acid ($H_3PO_4$). However, exemplary embodiments of the present inventive concepts are not limited thereto.

As the first gap 295 is formed, a lower surface of the support layer 300 and an upper surface of the CSP 240 may be exposed. Additionally, a sidewall of a portion of the charge storage structure 400 may be exposed by the first gap 295, and the exposed sidewall of the portion of the charge storage structure 400 may be further removed during the wet etching process to expose an outer sidewall of the first channel 410. Accordingly, the charge storage structure 400 may include an upper portion extending through the mold to cover a majority of the outer sidewall of the first channel 410 and a lower portion covering a bottom surface of the first channel 410 on the CSP 240.

Figure 13:
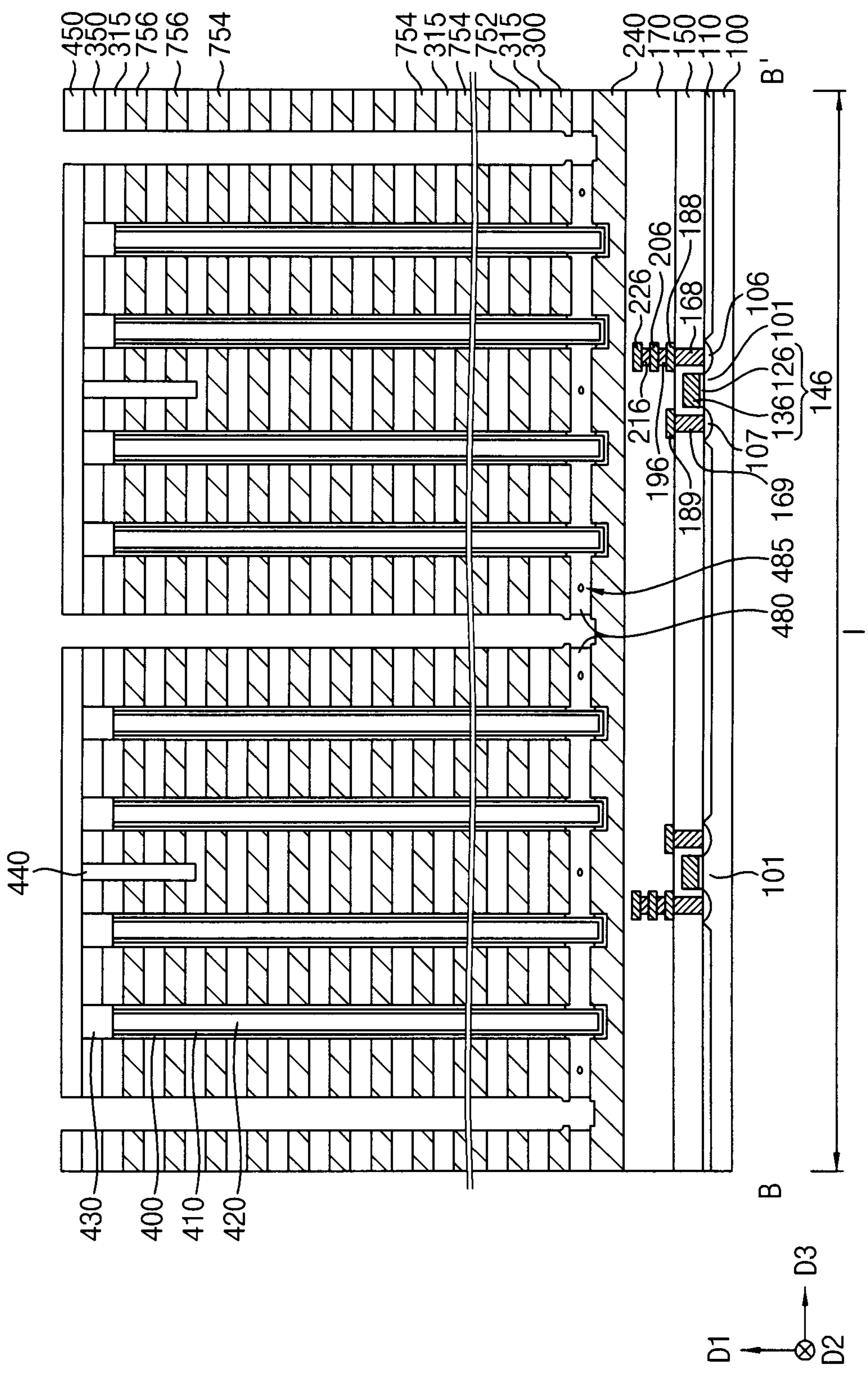

Referring to the exemplary embodiment of FIG. 13, the spacer 470 may be removed, and a channel connection layer may be formed on the sidewall of the second opening 465 and in the first gap 295. A portion of the channel connection layer in the second opening 465 may be removed by an etch back process to form a channel connection pattern 480 in the first gap 295.

The channel connection pattern 480 may connect adjacent first channels 410 disposed between the second opening 465 in the third direction D3. Therefore, the first channels 410 included in each channel group may be connected with each other.

In an exemplary embodiment, the channel connection pattern 480 may include, undoped polysilicon or polysilicon doped with n-type impurities. However, exemplary embodiments of the present inventive concepts are not limited thereto.

In an exemplary embodiment, an air gap 485 may be formed in the channel connection pattern 480, and a portion of the sacrificial layer structure 290 disposed under the second connecting portion of the mold may not be replaced with the channel connection pattern 480 and may remain.

Figure 14:
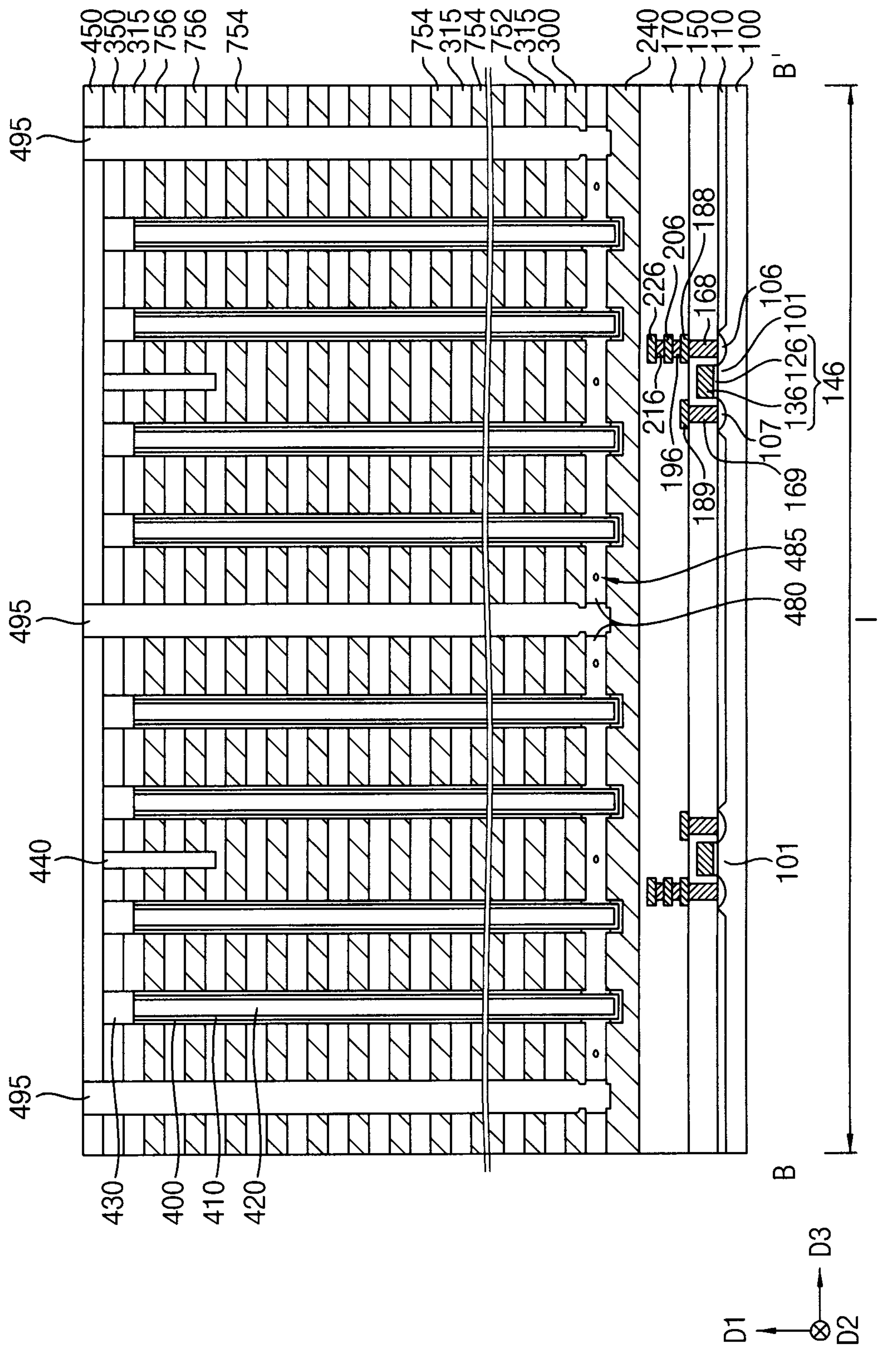

Referring to the exemplary embodiment of FIG. 14, a second division pattern 495 may be formed in the second opening 465.

In an exemplary embodiment, the second division pattern 495 may include an oxide, such as silicon oxide. However, exemplary embodiments of the present inventive concepts are not limited thereto.

Figure 15:
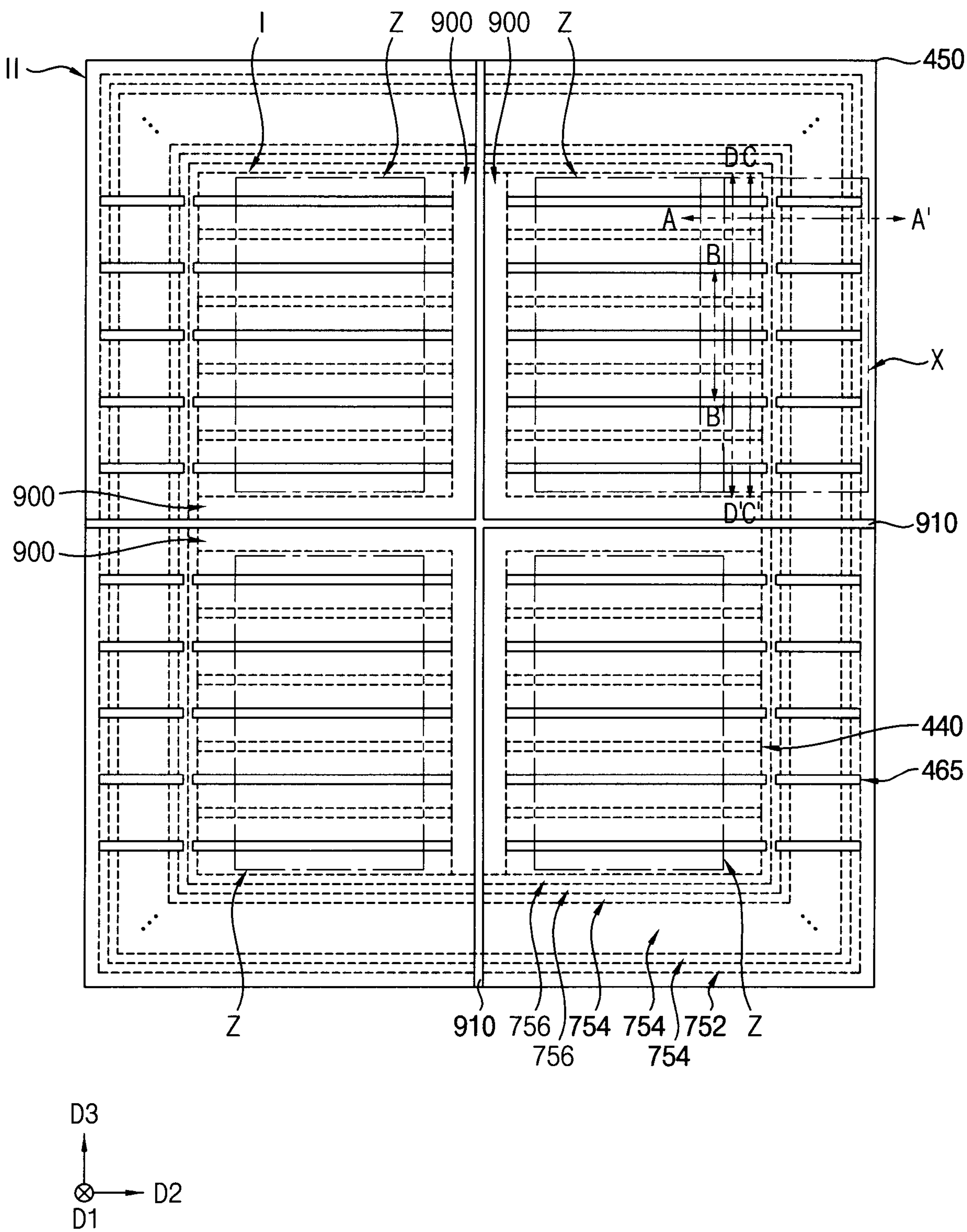

Referring to the exemplary embodiment of FIG. 15, a third division pattern 910 including third and fourth extension portions extending in the second and third directions D2 and D3, respectively, through the second connection portion of the mold, the support layer 300 and the channel connection pattern 480 may be disposed on the first and second regions I and II of the substrate 100. The fourth extension portions of the third division pattern 910 extending in the third direction D3 may divide the conductive path into two separate portions in the second direction which are electrically insulated from each other.

The third division pattern 910 may be disposed not only on the first region I of the substrate 100 but also on the second region II of the substrate 100 to extend through steps of the mold. In an exemplary embodiment, the third division pattern 910 may include an oxide, such as silicon oxide. Therefore, the cell array regions may be electrically insulated from each other.

In an exemplary embodiment, the third division pattern 910 may be formed during the formation of the second opening 465 illustrated with reference to the exemplary embodiments of FIGS. 9 to 11. The third division pattern 910 may be formed by forming an opening for the third division pattern 910 and filling the opening with an insulating material, instead of forming the third division pattern 910 after the second division pattern 495 is formed.

Figure 16:
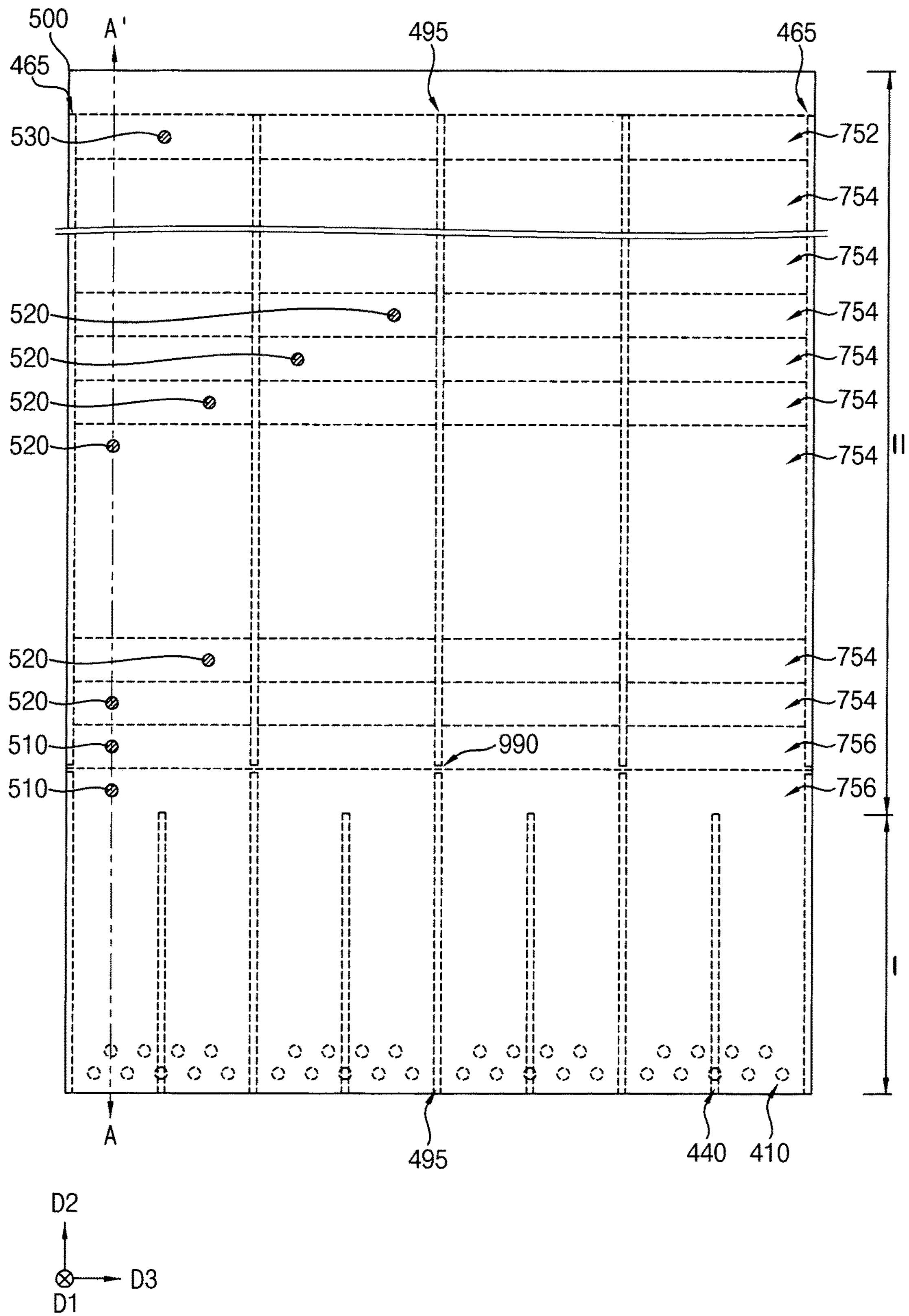
Figure 17:
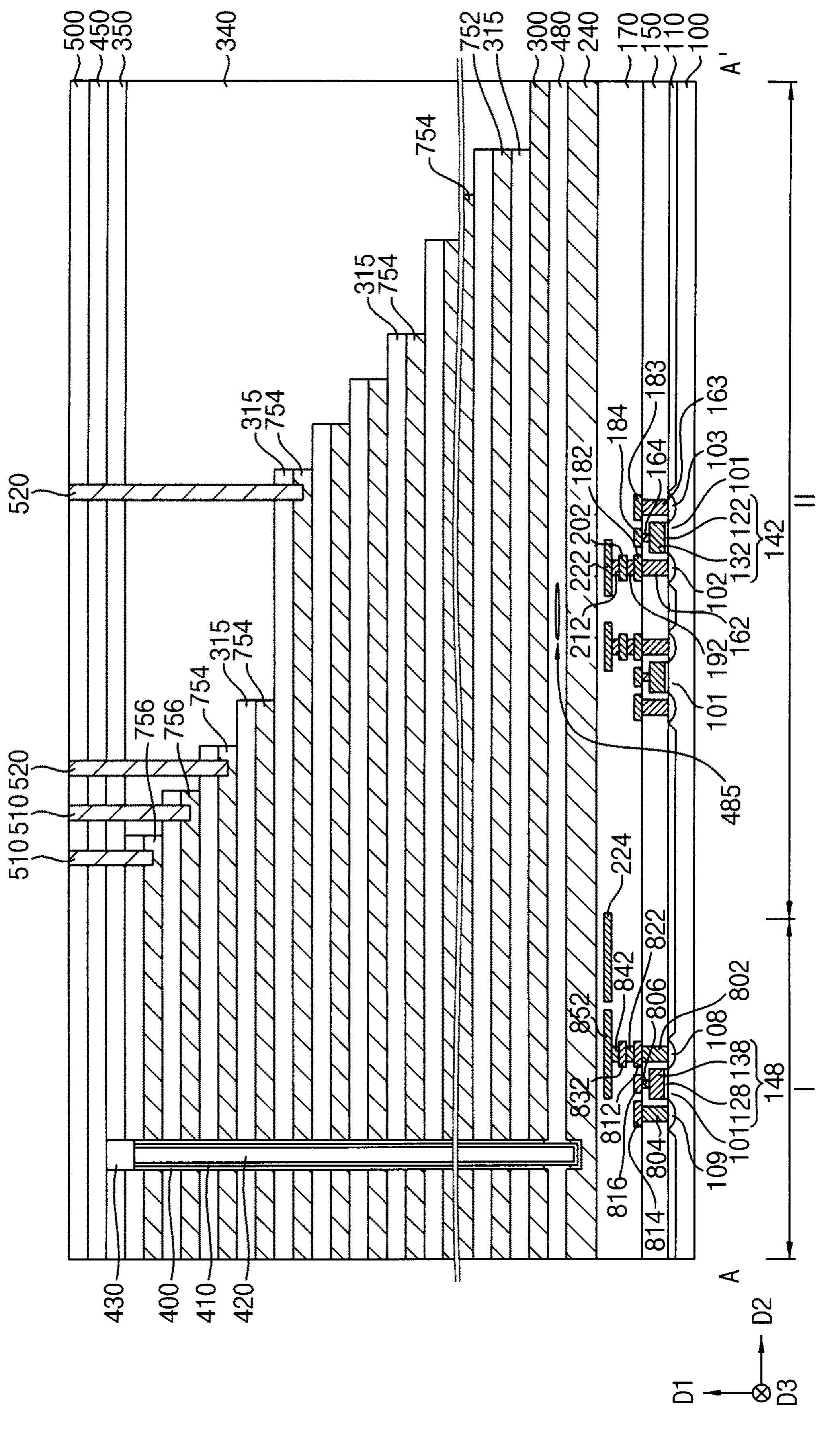
Figure 18:
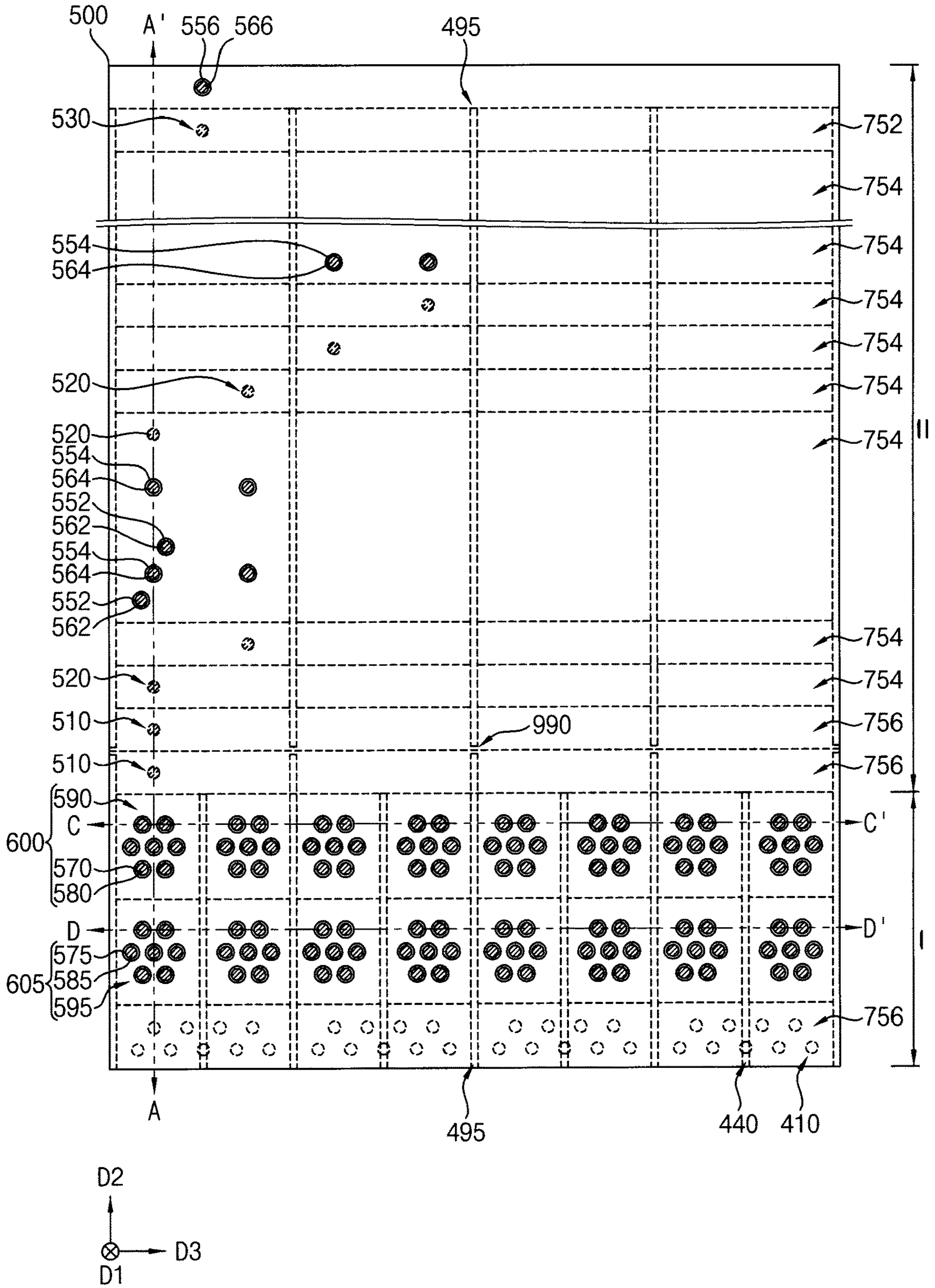

Referring to the exemplary embodiments of FIGS. 16 and 17, a sixth insulating interlayer 500 may be disposed on the fifth insulating interlayer 450 and the second and third division patterns 495 and 910. First to third upper contact plugs 510, 520 and 530 may be disposed on the second region II of the substrate 100.

Each of the first to third upper contact plugs 510, 520 and 530 may extend through the third to sixth insulating interlayers 340, 350, 450 and 500 and the first insulation pattern 315 (e.g., in the first direction D1), and may contact pads of the third, second and first gate electrodes 756, 754 and 752, respectively. The exemplary embodiment of FIG. 16 shows one shared memory block sharing word lines of two memory blocks, and thus one first upper contact plug 510 at each level, one second upper contact plug 520 at each level, and one third upper contact plug 530 at each level are shown in correspondence with one third gate electrode 756 serving as an SSL, one second gate electrode 754 serving as a word line, and one first gate electrode 752 serving as a GSL.

However, exemplary embodiments of the present inventive concepts are not limited to the specific arrangement of the first to third upper contact plugs 510, 520, 530 shown in the exemplary embodiment of FIG. 16 and each of the first to third upper contact plugs 510, 520 and 530 may not be limited to the shown position but may be freely disposed on the pad of corresponding one of the third, second and first gate electrodes 756, 754 and 752.

Referring to the exemplary embodiments of FIGS. 18, 19A, 20 and 21, a seventh insulating interlayer 540 may be disposed on the sixth insulating interlayer 500 and the first to third upper contact plugs 510, 520 and 530, first to third through vias 562, 564 and 566 may be disposed on the second region II of the substrate 100. First and second vertical gate electrodes 580 and 585 may be disposed on the first region I of the substrate 100.

In an exemplary embodiment, the first to third through vias 562, 564 and 566 and the first and second vertical gate electrodes 580 and 585 may be formed by forming holes through the third to seventh insulating interlayers 340, 350, 450, 500 and 540, the mold, the support layer 300, the channel connection pattern 480, the CSP 240, and upper portion of the second insulating interlayer 170, and filling the holes with a conductive material to extend in the first direction D1. Each of the first to third through vias 562, 564 and 566 may contact the twelfth lower wiring 222. The first and second vertical gate electrodes 580 and 585 may contact the thirteenth and eighteenth lower wirings 224 and 852, respectively. Each of the first to third gate electrodes 752, 754 and 756 extending in the second direction D2 which is a horizontal direction may be referred to as a horizontal gate electrode in comparison with the first and second vertical gate electrodes 580 and 585 each extending in the first direction D1 which is a vertical direction.

Second to fourth insulation patterns 552, 554 and 556 may be disposed on the sidewalls of the first to third through vias 562, 564 and 566, respectively, and fifth and sixth insulation patterns 570 and 575 may be disposed on the sidewalls of the first and second vertical gate electrodes 580 and 585, respectively. Therefore, the first to third through vias 562, 564 and 566 and the first and second vertical gate electrodes 580 and 585 may be electrically insulated from the first to third gate electrodes 752, 754 and 756, the support layer 300, the channel connection pattern 480 and the CSP 240.

In an exemplary embodiment, the first to third through vias 562, 564 and 566 and the first and second vertical gate electrodes 580 and 585 may include at least one material selected from a metal, a metal nitride, a metal silicide, etc., and the second to sixth insulation patterns 552, 554, 556, 570 and 575 may include an oxide, such as silicon oxide, etc. However, exemplary embodiments of the present inventive concepts are not limited thereto.

In an exemplary embodiment, the first to third through vias 562, 564 and 566 may extend through the second steps at positions corresponding to the first to third upper contact plugs 510, 520 and 530, respectively. For example, as shown in the exemplary embodiment of FIG. 19A, the second through via 564 may extend through the same second step as the second contact plug 520 and may be spaced apart from the second contact plug in the second direction D2. However, the third through via 566 may extend through a portion of the support layer 300 not covered by the mold.

A common source contact plug may be further disposed on the portion of the support layer 300 not covered by the mold.

In an exemplary embodiment, a plurality of first vertical gate electrodes 580 and a plurality of second vertical gate electrodes 585 may be disposed in an area adjacent to the vertical channel region Z in the second direction D2, such as in the switching transistor region at each of opposite lateral end portions in the second direction D2 of the cell array region. In an exemplary embodiment, each of the first and second vertical gate electrodes 580 and 585 may be disposed at each of opposite lateral sides in the third direction D3 of the first division pattern 440 in each memory group on the cell array region and may be spaced apart from each other (e.g., in the second direction D2). For example, as shown in the exemplary embodiment of FIG. 18, seven first vertical gate electrodes 580 are spaced apart from each other by a constant distance and seven second vertical gate electrodes 585 spaced apart from each other by a constant distance are shown at each of opposite sides of the first division pattern 440 in each memory group in a plan view (e.g., in a plane defined in the second and third directions D2, D3). However, exemplary embodiments of the present inventive concepts are not limited thereto. For example, in other exemplary embodiments, the number of each of the first and second vertical gate electrodes 580 and 585 at each of opposite lateral sides of the first division pattern 440 in each memory group may vary.

In an exemplary embodiment, each of the first and second vertical gate electrodes 580 and 585 may have a shape of a circle, ellipse, regular polygon, etc., in a plan view (e.g., in a plane defined in the second and third directions D2 and D3). For example, as shown in the exemplary embodiment of FIG. 18, the first and second vertical gate electrodes 580 and 585 may have a shape of a circle in a plan view in a plane defined in the second and third directions D2 and D3.

In an exemplary embodiment, the first vertical gate electrode 580, the fifth insulation pattern 570 covering a sidewall of the first vertical gate electrode 580, and portions of the second gate electrodes 754 at a plurality of levels, respectively, surrounding the fifth insulation pattern 570 may form a first switching transistor 600. The portions of the second gate electrodes 754 surrounding the fifth insulation pattern 570 may serve as a channel of the first switching transistor, and thus may be referred to as a second channel 590. The second channel 590 may be disposed at a portion of each of the word lines that is adjacent to the first vertical gate electrode. For example, the first switching transistor 600 may include the first vertical gate electrode 580, the fifth insulation pattern 570 surrounding the first vertical gate electrode 580 and serving as a gate insulation pattern for the first vertical gate electrode 580, and the second channel 590 surrounding the gate insulation pattern and serving as a channel.

In an exemplary embodiment, a second transistor serving as a pass transistor may be disposed under each memory block on the cell array region of the substrate 100. The second transistor may be electrically connected to a plurality of first vertical gate electrodes 580 in each memory block through the thirteenth lower wiring 224. Therefore, as many second transistors as the number of memory blocks in each shared memory block may be disposed under the shared memory block, and each second transistor may selectively apply electrical signal to a corresponding memory block, which may be referred to as a memory block selection transistor. In the drawings, two memory block selection transistors are shown under one shared memory block.

Electrical signals applied to the second horizontal gate electrodes 754, that is, the word lines, may be controlled by the first switching transistor 600 including the first vertical gate electrodes 580 of a corresponding memory block to which electrical signal is applied by the memory block selection transistor.

In an exemplary embodiment, the second switching transistor 605 may be disposed adjacent to the first switching transistor 600 in the second direction D2 in each switching transistor region. The second switching transistor 605 may include the second vertical gate electrode 585, the sixth insulation pattern 575 surrounding the second vertical gate electrode 585, and the third channel 595 surrounding the sixth insulation pattern 575. The third channel 595 may be a portion of each of the third gate electrodes 756. The third channel 595 may be disposed at a portion of each of the selection lines that is adjacent to the second vertical gate electrode 585. In an exemplary embodiment, the second switching transistor 605 may be disposed between the first switching transistor 600 and the vertical channel region Z in a plan view (e.g., in a plane defined in the second and third directions D2 and D3). Alternatively, the first switching transistor 600 may be formed between the second switching transistor 605 and the vertical channel region Z in a plan view (e.g., in a plane defined in the second and third directions D2 and D3).

In an exemplary embodiment, a fourth transistor serving as a pass transistor may be disposed under the second switching transistor 605 to be electrically connected thereto. The fourth transistor serving as a pass transistor may be electrically connected to a plurality of second vertical gate electrodes 585 in each memory block through the eighteenth wiring 852.

As the shared memory block shares the SSLs at each level, eight fourth transistors in the shared memory block, such as four fourth transistors in each memory block of the shared memory block, may be disposed under the shared memory block so that eight portions of the shared SSL may be selectively operated in the shared memory block. Therefore, the fourth transistor may be referred to as an SSL selection transistor.

In an exemplary embodiment, as the shared memory block also shares the GSLs at each level, each of the fourth transistors may be used so that four portions of the shared GSL may be selectively operated in the shared memory block. For example, a portion of the first gate electrode 752 surrounding the second vertical gate electrode 585 of the second switching transistor 605 (e.g., in the second direction D2) may form a fourth channel 597. The second vertical gate electrode 585, the fifth insulation pattern 570 surrounding the second vertical gate electrode 585 and serving as a gate insulation pattern for the second vertical gate electrode 585, and the fourth channel 597 surrounding the fifth insulation pattern 570 and serving as a channel may form a third switching transistor. Therefore, the second vertical gate electrode 585 and the fifth insulation pattern 570 may be used commonly in the second switching transistor 605 and the third switching transistor.

In an exemplary embodiment, the third switching transistor may selectively apply electrical signal so that four portions of the shared GSL may be independently operated in the shared memory block, such as two portions of the shared GSL may be independently operated in each memory block of the shared memory block, and thus may be referred to as a GSL selection transistor.

Each of the second to fourth channels 590, 595 and 597 may be referred to as a horizontal channel in comparison with the first channel 410 extending in the first direction D1 which is a vertical direction.

Figure 19A:
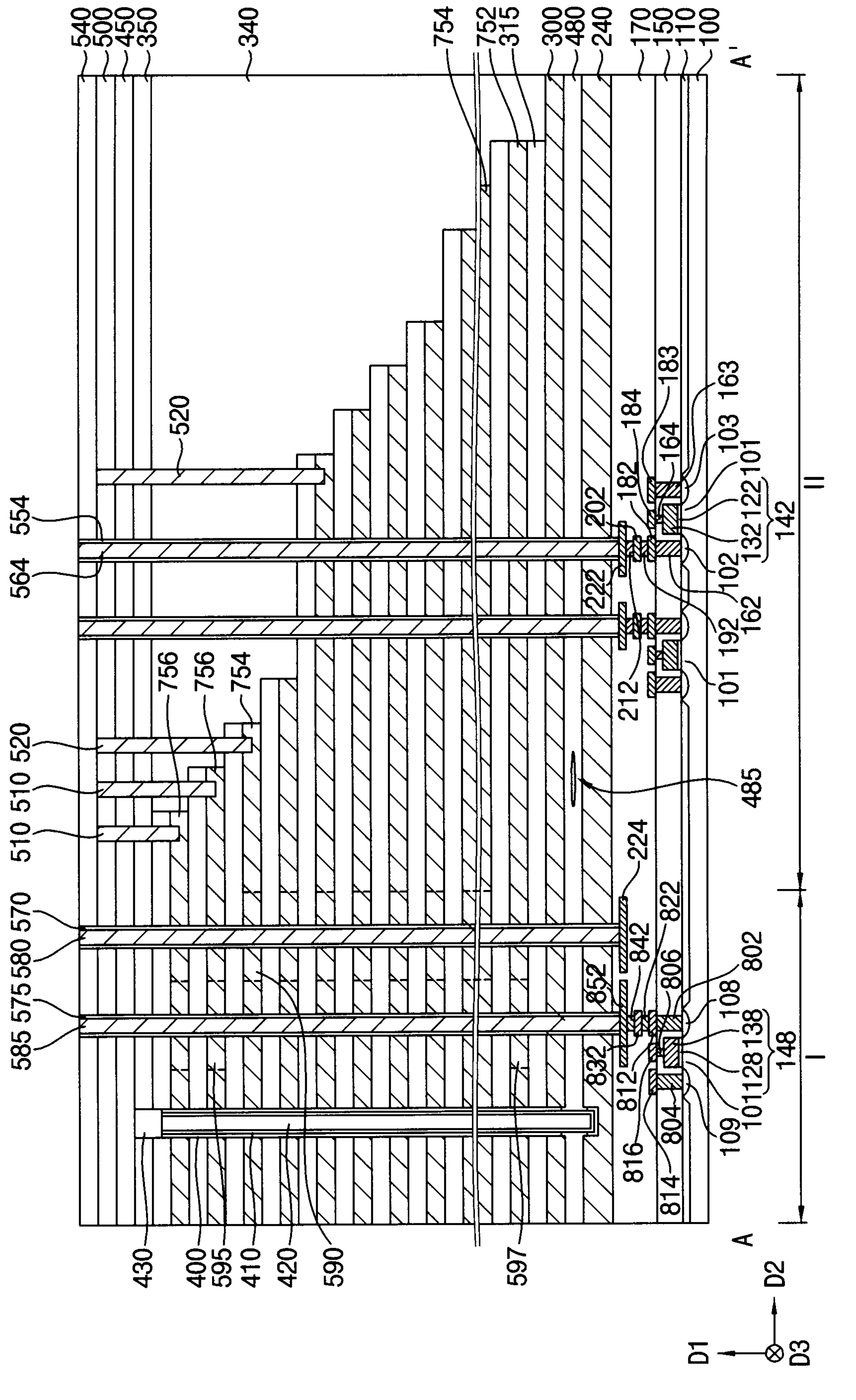
Figure 19B:
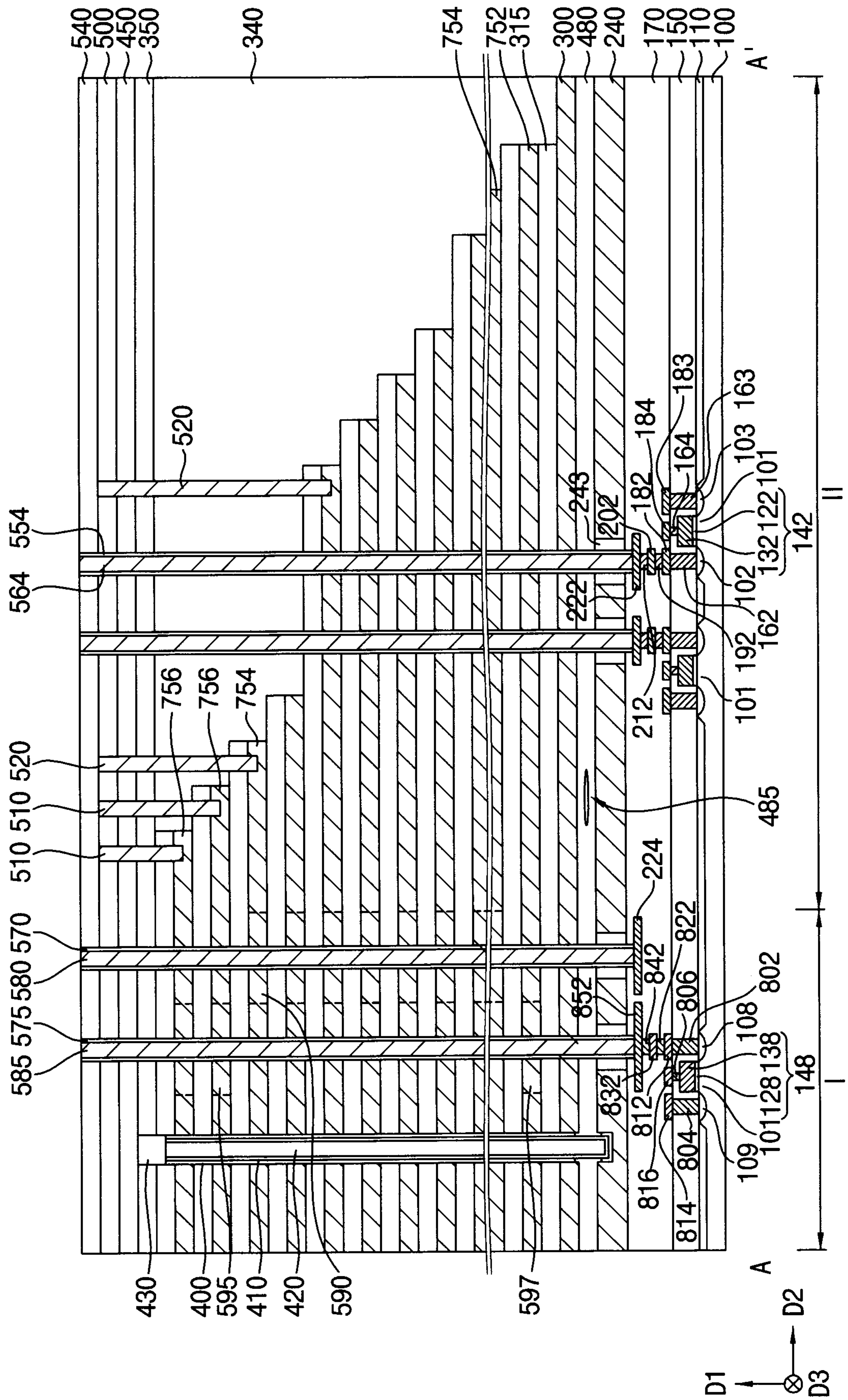

Referring to the exemplary embodiment of FIG. 19B, a filling insulation pattern 243 may be further formed in a portion of the CSP 240 through which the first to third through vias 562, 564 and 566 and the first and second vertical gate electrodes 580 and 585 extend.

As illustrated with reference to the exemplary embodiment of FIG. 4, the CSP 240 may be disposed on the second insulating interlayer 170, and a hole may be formed in an area through which the first to third through vias 562, 564 and 566 and the first and second vertical gate electrodes 580 and 585 extend (e.g., in the first direction D1), and the filling insulation pattern 243 may fill the hole. In an exemplary embodiment, the filling insulation pattern 243 may include an oxide, such as silicon oxide or a nitride, such as silicon nitride. However, exemplary embodiments of the present inventive concepts are not limited thereto.

Since the filling insulation pattern 243 is formed prior to when the holes for the first to third through vias 562, 564 and 566 and the first and second vertical gate electrodes 580 and 585 are formed, an etching process for removing a portion of the CSP 240 may be easily performed.

Figure 22:
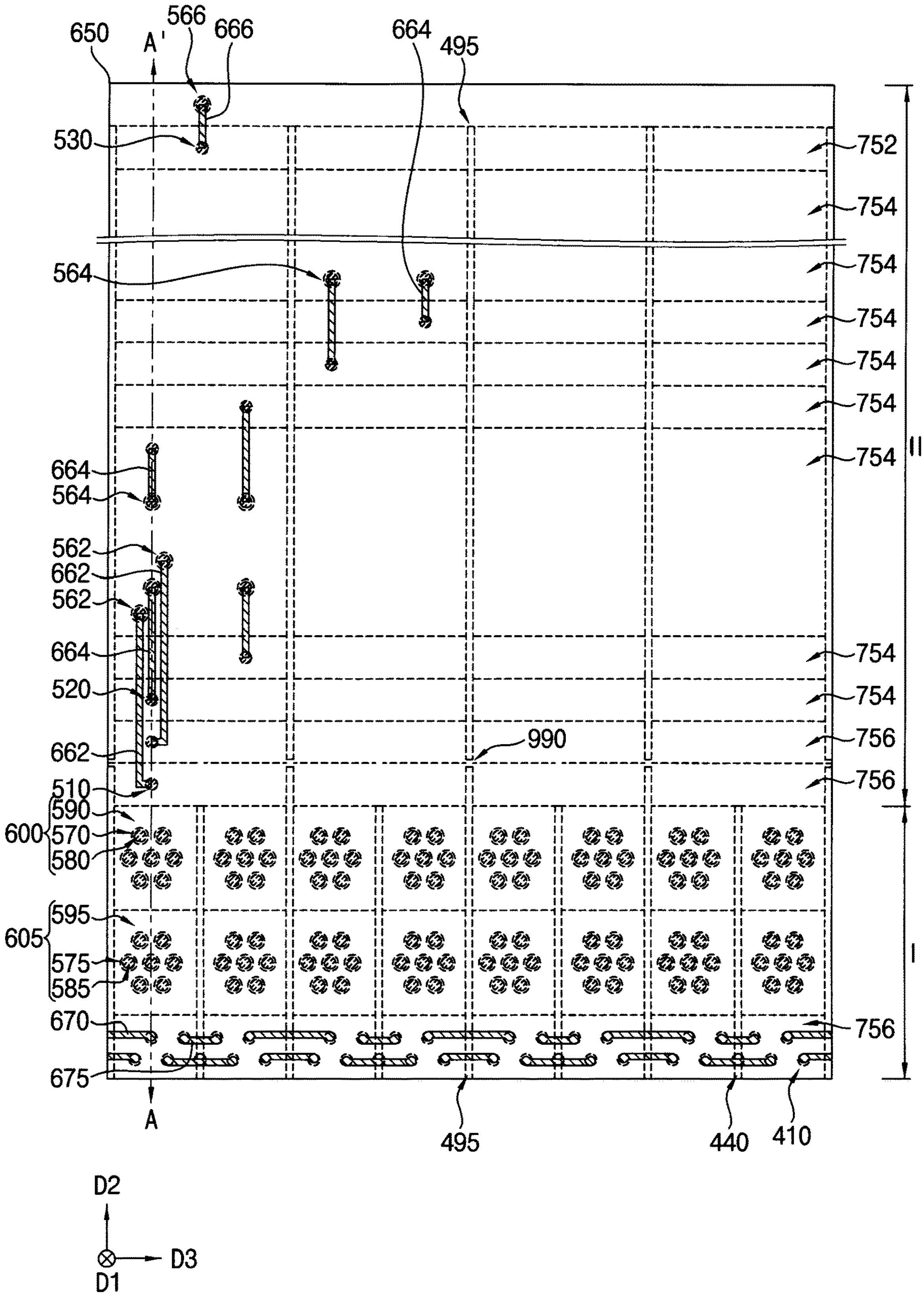
Figure 23:
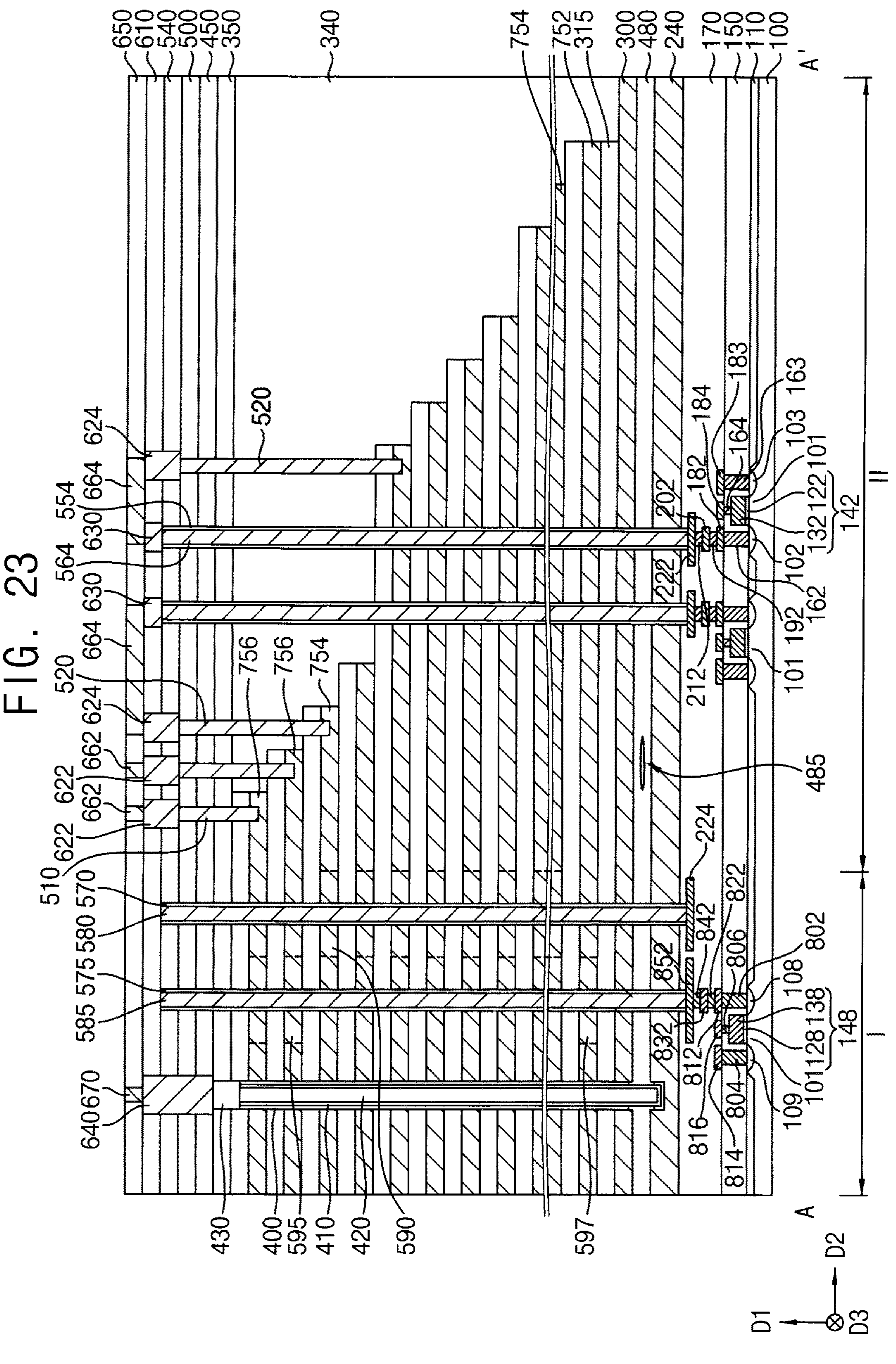

Referring to the exemplary embodiments of FIGS. 22 and 23, an eighth insulating interlayer 610 may be disposed on the seventh insulating interlayer 540, the first to third through vias 562, 564 and 566, and the first and second vertical gate electrodes 580 and 585. Fourth and fifth upper contact plugs 622 and 624, a sixth upper contact plug, and seventh and eighth upper contact plugs 630 and 640 may be formed.

The fourth and fifth upper contact plugs 622 and 624 and the sixth upper contact plug may extend through the seventh and eighth insulating interlayers 540 and 610 (e.g., in the first direction D1) to contact the first to third upper contact plugs 510, 520 and 530, respectively. The seventh upper contact plug 630 may extend through the eighth insulating interlayer 610 to contact a corresponding one of the first to third through vias 562, 564 and 566, and the eighth upper contact plug 640 may extend through the fifth to eighth insulating interlayers 450, 500, 540 and 610 to contact the capping pattern 430.

A ninth insulating interlayer 650 may be disposed on the eighth insulating interlayer 610, the fourth and fifth upper contact plugs 622 and 624, the sixth upper contact plug, and the seventh and eighth upper contact plugs 630 and 640. First to fifth upper wirings 662, 664, 666, 670 and 675 may be formed through the ninth insulating interlayer 650.

The first upper wiring 662 may contact the fourth upper contact plug 622 and the seventh upper contact plug 630 on the first through via 562. The second upper wiring 664 may contact the fifth upper contact plug 624 and the seventh upper contact plug 630 on the second through via 564, and the third upper wiring 666 may contact the sixth upper contact plug and the seventh upper contact plug 630 on the third through via 566.

Two adjacent eighth upper contact plugs 640 (e.g., adjacent in the third direction D3) may form a pair. The pair of adjacent eight upper contact plugs 640 may be electrically connected with each other by a corresponding one of the fourth and fifth upper wirings 670 and 675. In an exemplary embodiment, the fourth and fifth upper wirings 670 and 675 may be arranged in a zigzag pattern along the third direction D3.

Figure 24:
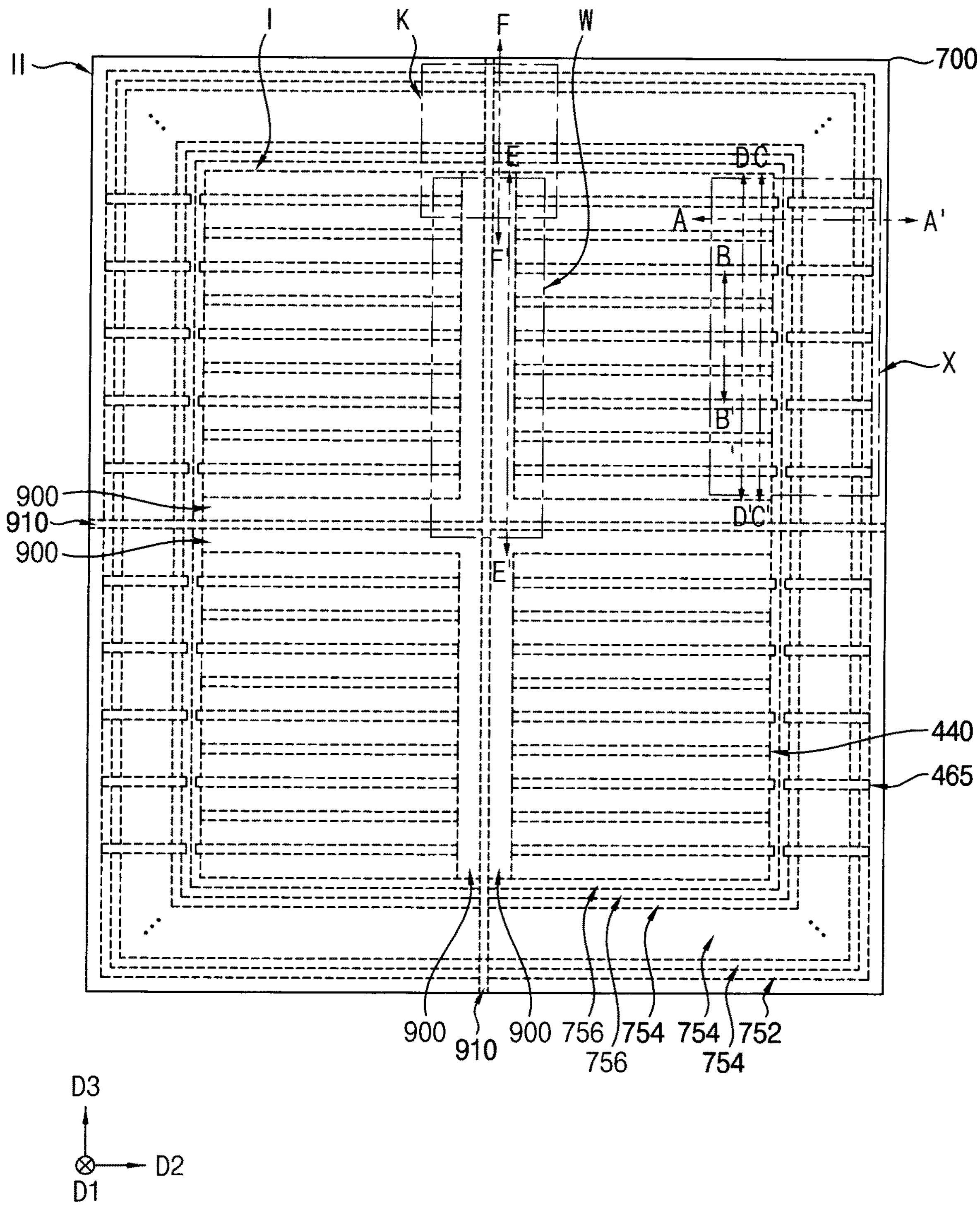
Figure 25:
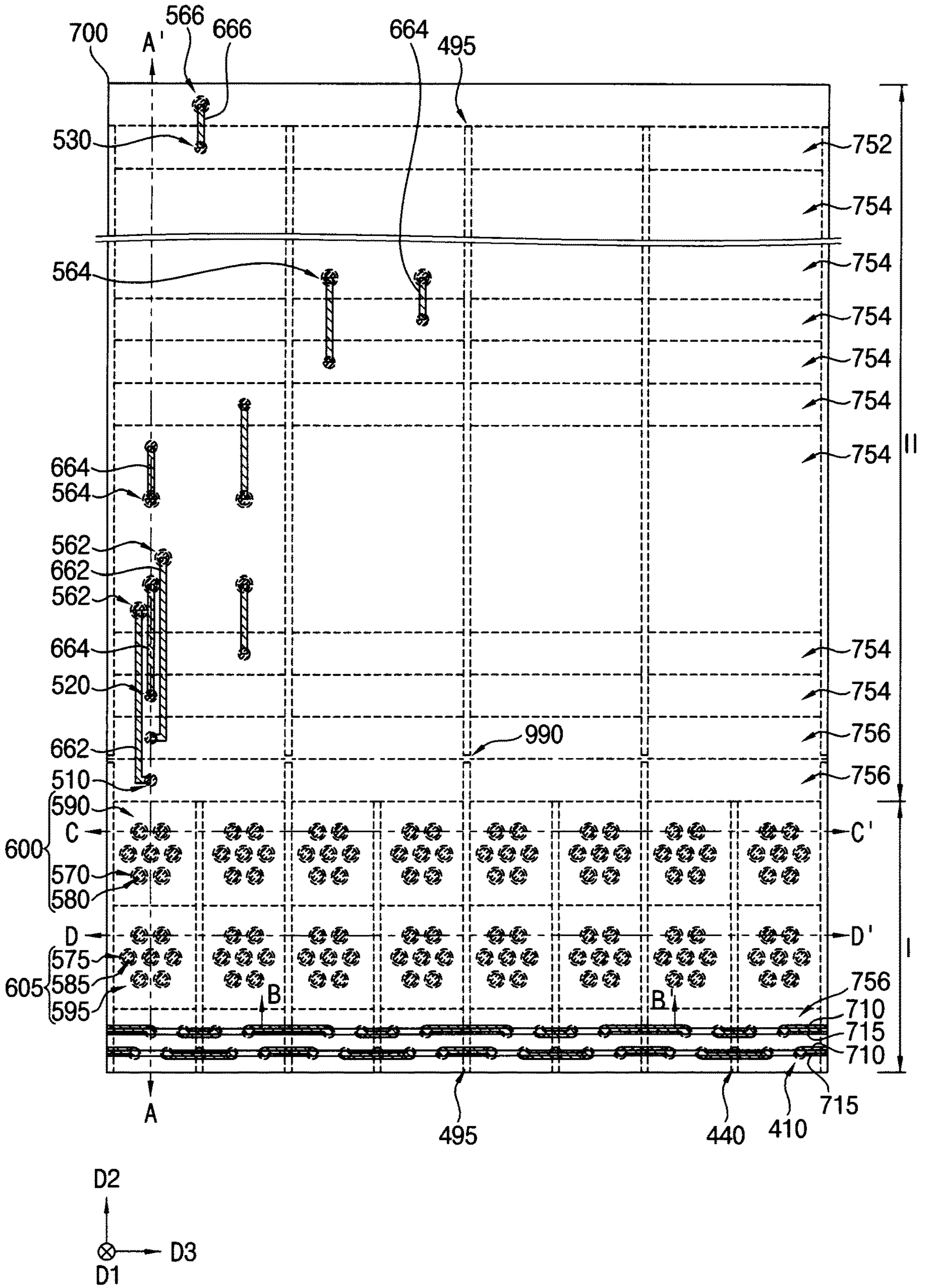
Figure 26A:
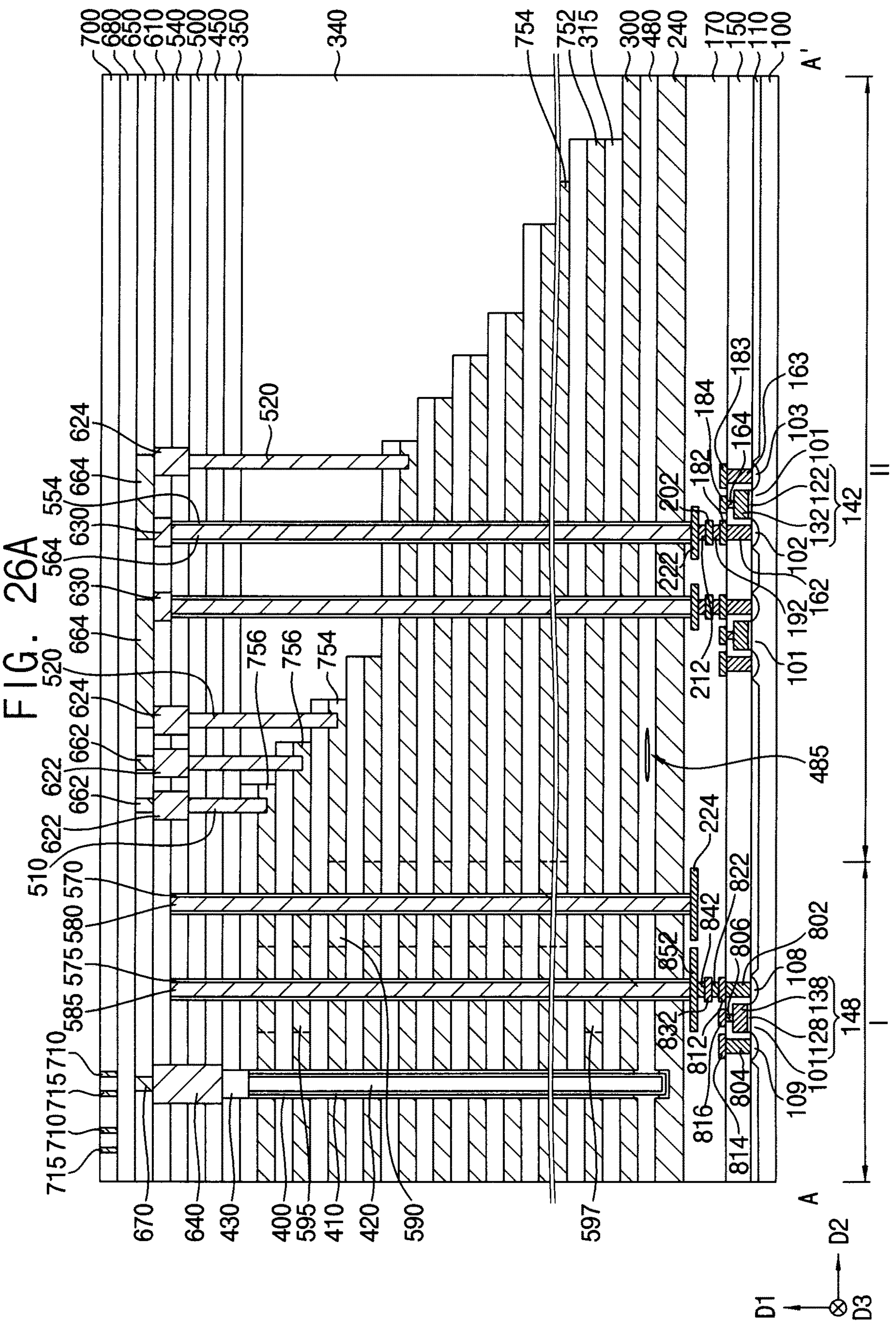

Referring to the exemplary embodiments of FIGS. 24, 25 and 26A, a tenth insulating interlayer 680 may be disposed on the ninth insulating interlayer 650 and the first to fifth upper wirings 662, 664, 666, 670 and 675. A first upper via 690 (FIG. 27) and a second upper via may be formed therethrough.

The first upper via 690 may contact the fourth upper wiring 670, and the second upper via may contact the fifth upper wiring 675.

As shown in the exemplary embodiments of FIGS. 24-26B, an eleventh insulating interlayer 700 may be disposed on the tenth insulating interlayer 680, the first upper via 690 and the second upper via. A sixth upper wiring 710 extends through the eleventh insulating interlayer 700 (e.g., in the first direction D1) to contact the first upper via 690. A seventh upper wiring 715 extends through the eleventh insulating interlayer 700 (e.g., in the first direction D1) to contact the second upper via.

In an exemplary embodiment, each of the sixth and seventh upper wirings 710 and 715 may extend in the third direction D3, and may be connected to a plurality of first upper vias 690 and a plurality of second upper vias, respectively. The sixth and seventh upper wirings 710 and 715 may serve as a bit line of the vertical memory device.

The vertical memory device may be manufactured by the above processes.

In an exemplary embodiment, a circuit pattern, such as contact plugs, through vias, wirings, etc., may be further disposed to be electrically connected to the upper circuit pattern and/or the lower circuit pattern in an area where the first conductive path 900 is formed.

Figure 26B:
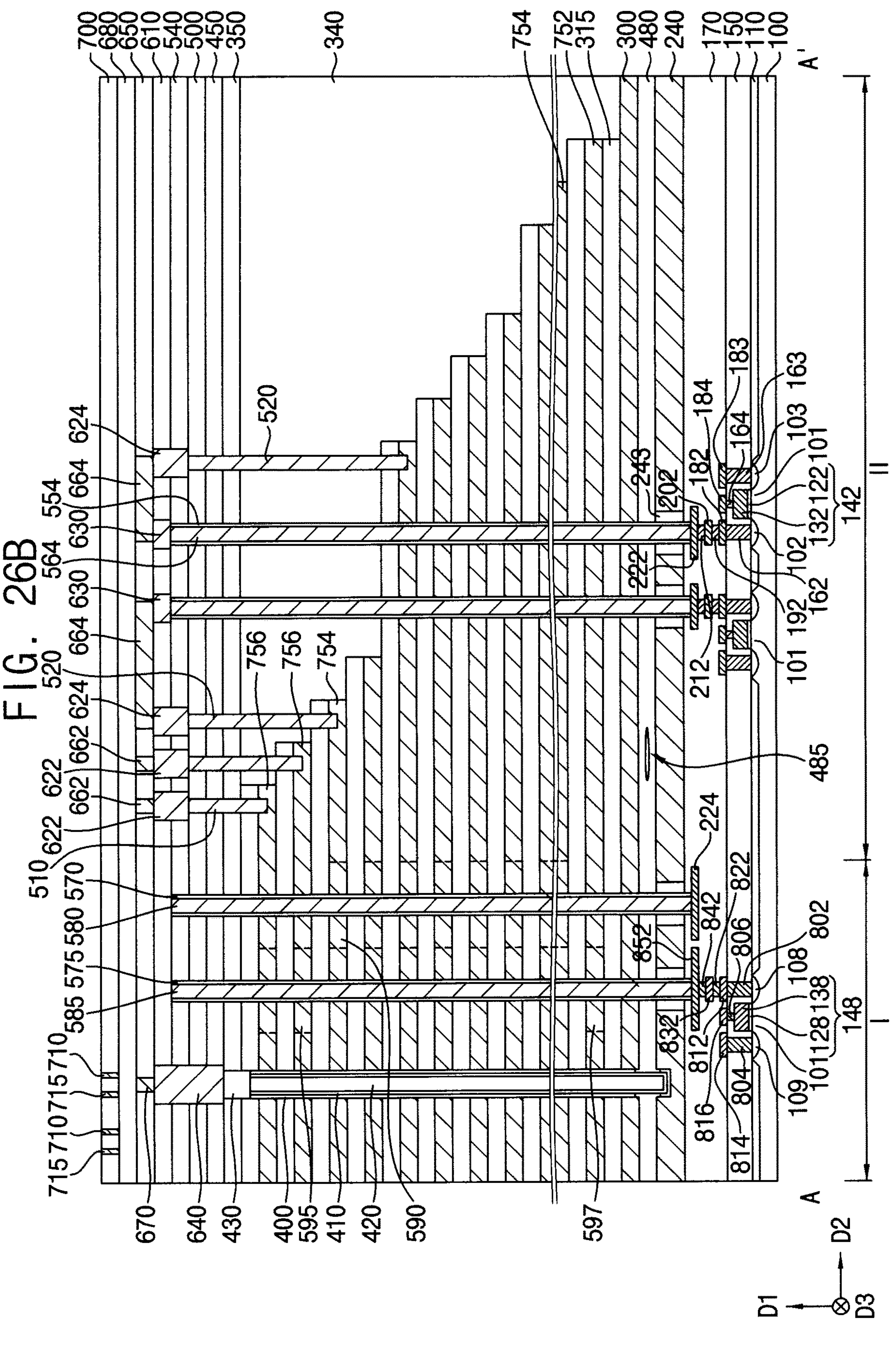
Figure 27:
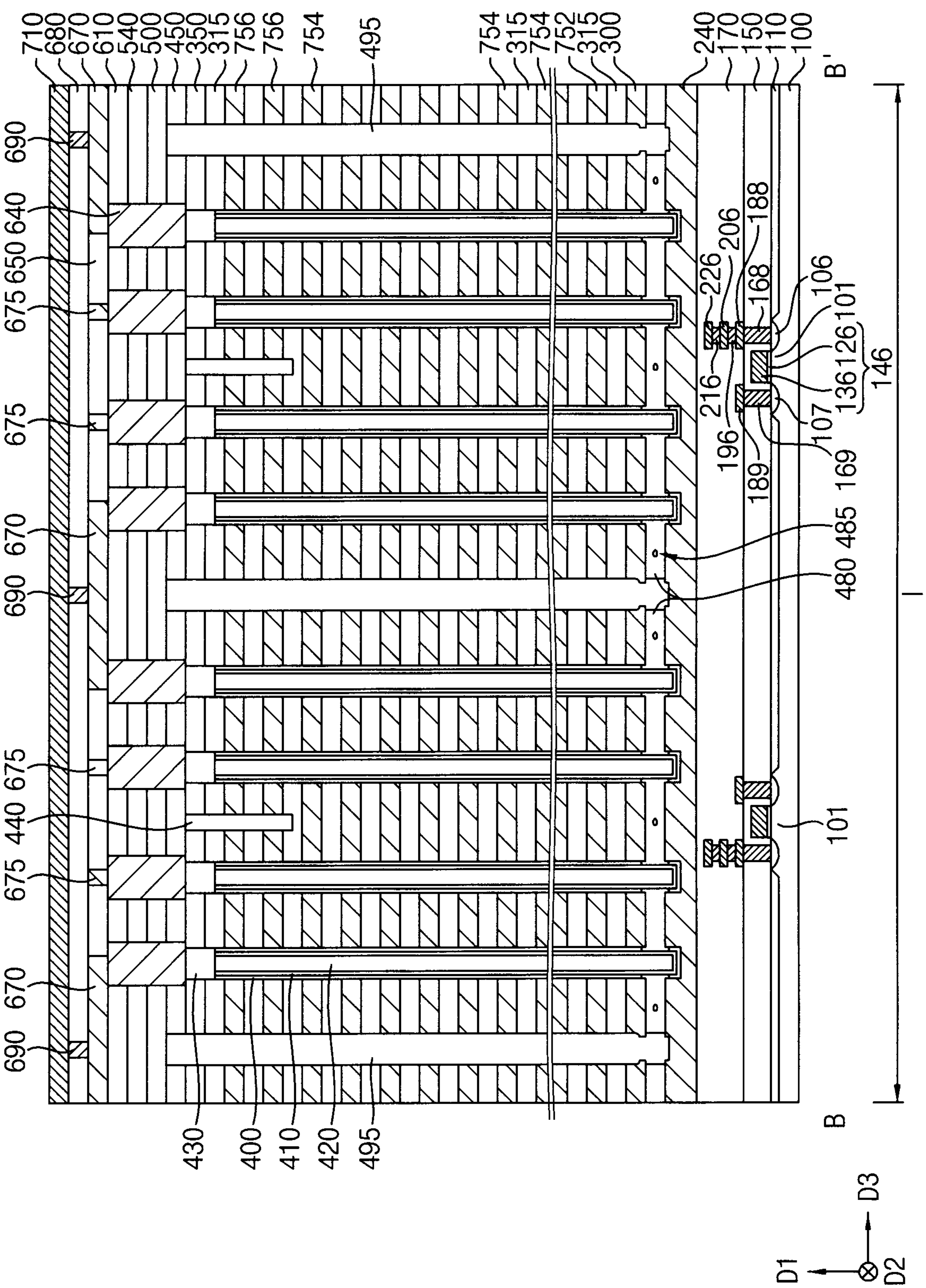

Referring to the exemplary embodiment of FIG. 26B, as illustrated with reference to the exemplary embodiment of FIG. 19B, the filling insulation pattern 243 may be further disposed in the portion of the CSP 240 through which the first to third through vias 562, 564 and 566 and the first and second vertical gate electrodes 580 and 585 extend therethrough.

The vertical memory device may have the following structural characteristics.

The vertical memory device may include the first conductive path 900 having a plurality of gate electrode layers 320 spaced apart from each other in the first direction D1 on the memory cell region I of the substrate 100 and extending at least in one direction of the second and third directions D2 and D3. The vertical memory device further includes the shared memory blocks on the cell array regions, respectively, which may be spaced apart from each other by the first conductive path 900 in the memory cell region I of the substrate 100. Each of the shared memory blocks may include a plurality of memory blocks arranged in the third direction D3, which may be spaced apart from each other by the first division pattern 440 extending in the second direction D2 on a corresponding one of the cell array regions of the substrate 100. Each memory block may include the first to third gate electrodes 752, 754 and 756, each of which may extend in the second direction D2 and are spaced apart from each other in the first direction D1. The first channels 410 each extend in the first direction D1 through the first to third gate electrodes 752, 754 and 756, and the charge storage structures 400 each of which may be formed between a corresponding one of the first channels 410 and each of the first to third gate electrodes 752, 754 and 756. The first to third gate electrodes 752, 754 and 756 at each level of the memory blocks included in each of the shared memory blocks may be electrically connected to the first conductive path 900 at a lateral side of each of the shared memory blocks in the second direction D2 and/or in the third direction D3 so as to be shared by the shared memory block.

In an exemplary embodiments, the first conductive path 900 may include a first extension portion extending in the third direction D3 at a first lateral side in the second direction D2 of each of the shared memory blocks, and a second extension portion extending in the second direction D2 at a second lateral side in the third direction D3 of each of the shared memory blocks to be connected with the first extension portion. Therefore, the first extension portion or the second extension portion of the first conductive path 900 may be formed between each of the shared memory blocks, and each of the first extension portion and the second extension portion may be connected to the first to third gate electrodes 752, 754 and 756 at each level included in at least one of the shared memory blocks.

In an exemplary embodiment, the first and third gate electrodes 752 and 756 may serve as (e.g., are configured to provide) a GSL and an SSL, respectively, and the second gate electrodes 754 may serve as word lines, respectively. Each of the memory blocks may further include the first switching transistor 600, the second switching transistor 605, and the third switching transistor. The first switching transistor 600 may include the first vertical gate electrode 580 extending through the word lines in the first direction D1 and are insulated therefrom and the second channel 590 disposed at a portion of each of the word lines adjacent to the first vertical gate electrode 580. The first switching transistor 600 may control electrical signals applied to the word lines. The second switching transistor 605 may include the second vertical gate electrode 585 extending through the SSL and are insulated therefrom and are spaced apart from the first vertical gate electrode 580 in the second direction D2, and the third channel 595 at a portion of the SSL adjacent to the second vertical gate electrode 585. The third switching transistor may include a second vertical gate electrode 585 extending through the GSL and are insulated therefrom and the fourth channel 597 disposed at a portion of the GSL adjacent to the second vertical gate electrode 585. The third switching transistor may control electrical signals applied to the GSL.

In an exemplary embodiment, the first and second switching transistors 600 and 605 and the third switching transistor may be formed at each of opposite lateral end portions in the second direction D2 of each of the cell array regions of the substrate 100, and one or more of the first and second switching transistors 600 and 605 and the third switching transistor may contact the first conductive path 900 and remaining first, second and third switching transistors 600, 605 may contact the pads of the first to third gate electrodes 752, 754 and 756.

In an exemplary embodiment, the second transistor may be disposed under the first vertical gate electrode 580 to be electrically connected thereto, and a fourth pass transistor may be disposed under the second vertical gate electrode 585 to be electrically connected thereto. In an exemplary embodiment, one second transistor may be formed in each memory block, and four fourth pass transistors may be formed in each memory block.

In an exemplary embodiment, the first to third gate electrodes 752, 754 and 756 of each memory block included in each of the shared memory blocks may extend on the second region II (e.g., a pad region) of the substrate 100, and lateral end portions in the second direction D2, such as the pads of the first to third gate electrodes 752, 754 and 756, may be stacked in the first direction D1 in a staircase shape. The pads of the first to third gate electrodes 752, 754 and 756 at each level in the memory blocks may be partially connected with each other to be shared in the shared memory block.

In an exemplary embodiment, the first to third upper contact plugs 510, 520 and 530 may be formed on the pads of the first to third gate electrodes 752, 754 and 756, respectively, to be electrically connected thereto in the shared memory block. The first to third through vias 562, 564 and 566 may each extend through the first to third gate electrodes 752, 754 and 756 and are electrically insulated therefrom. The first to third through vias 562, 564 and 566 may be formed on a portion of the second region II (e.g., a pad region) of the substrate 100 at each of opposite lateral sides in the second direction D2 of the memory cell region I of the substrate 100 in correspondence with the first to third upper contact plugs 510, 520 and 530, respectively. The first transistors may be disposed on the second region II (e.g., a pad region) of the substrate 100 to be electrically connected with the first to third through vias 562, 564 and 566, respectively.

In an exemplary embodiment, the first to third lower circuit patterns may be disposed on the substrate 100 to be electrically connected to the first, second and fourth transistors, respectively, and the CSP 240 may be disposed on the first to third lower circuit patterns.

As illustrated above, in the vertical memory device, the first region I of the substrate 100 may be divided into a plurality of cell array regions by the first conductive path 900 formed by the second connecting portion of the mold. The shared memory block sharing the first to third gate electrodes 752, 754 and 756 at each level may be disposed on each of the cell array regions and a portion of the second region II of the substrate 100 adjacent thereto in the second direction D2. The pads of the first to third gate electrodes 752, 754 and 756 in the shared memory block may be stacked in a staircase shape at a lateral side of each of the cell array regions in each of the second and third directions D2 and D3, and the second connecting portion of the mold may be disposed at another lateral side of each of the cell array regions in each of the second and third directions D2 and D3. Therefore, the first conductive path 900 formed by the gate electrode layers 320 included in the second connecting portion of the mold may be electrically connected to the first to third gate electrodes 752, 754 and 756 at each level in the shared memory block.

Electrical signals may be transferred to the first to third gate electrodes 752, 754 and 756 at each level in the shared memory block not only through the pads (e.g., second pads) of the gate electrodes 752, 754 and 756 at a lateral end portion thereof in the second direction D2, but also through the pads of the gate electrodes 752, 754 and 756 at a lateral end portion thereof in the third direction D3. Additionally, the electrical signals may be transferred to the first to third gate electrodes 752, 754 and 756 at each level in the shared memory block through the gate electrode layer 320 at another lateral end portion thereof in the second direction D2 or the third direction D3.

Accordingly, the gate electrode layer 320 may serve as a path for current flowing through the first to third gate electrodes 752, 754 and 756 at each level, and thus may reduce the total resistance. For example, when compared to upper circuit patterns for transferring electrical signal to the first to third gate electrodes 752, 754 and 756 that are formed only on the pads at a lateral end portion thereof in the second direction D2, upper circuit patterns for transferring electrical signal to the first to third gate electrodes 752, 754 and 756 that are formed not only on the pads at a lateral end portion thereof in the second direction D2 but also on the pads at a lateral end portion in the third direction D3 may have a lower resistance. Additionally, some of the upper circuit patterns may be formed on the pads at the lateral end portion in the second direction D2 of the first to third gate electrodes 752, 754 and 756, and other upper circuit patterns may be formed on the pads at the lateral end portion in the third direction D3, which may increase the freedom of layout of the upper circuit patterns.

The first switching transistors 600 are electrically connected to the word lines, respectively, so that the word lines of the memory blocks shared in the shared memory block may be independently operated. The first switching transistors may be formed in the switching transistor region at each of the opposite lateral end portions in the second direction D2 of each cell array region. The second transistor serving as a pass transistor, such as the memory block selection transistor, may be formed to be electrically connected to the first switching transistors 600. Additionally, the SSLs of the memory blocks shared in the shared memory block may be independently operated based on the electrical connection of the second switching transistors 605 to the SSLs, respectively. The second switching transistors 605 may be disposed to be adjacent to the first switching transistors 600 in the second direction D2 in the switching transistor region. The fourth transistor serving as a pass transistor, such as the SSL selection transistor, may be formed to be electrically connected to the second switching transistors 605. Further, the GSLs of the memory blocks shared in the shared memory block may be independently operated based on the electrical connection of the third switching transistors to the GSLs, respectively. The third switching transistors may be formed under the second switching transistor 605 in the switching transistor region. The fourth transistor may also serve as a pass transistor, and thus may be referred to as a GSL selection transistor.

For example, the first to third gate electrodes 752, 754 and 756 at each level of the memory blocks disposed on each cell array region of the first region I of the substrate 100 and a portion of the second region II of the substrate 100 adjacent thereto in the second direction D2 may be shared so that the shared memory block may be formed. Even though the first to third gate electrodes 752, 754 and 756 at each level in the memory blocks in the shared memory block are electrically connected to each other, the first to third gate electrodes 752, 754 and 756 in the memory blocks may be independently operated by the first and second switching transistors 600 and 605, the third switching transistor, and the second and fourth transistors serving as the pass transistors.

Figure 32:
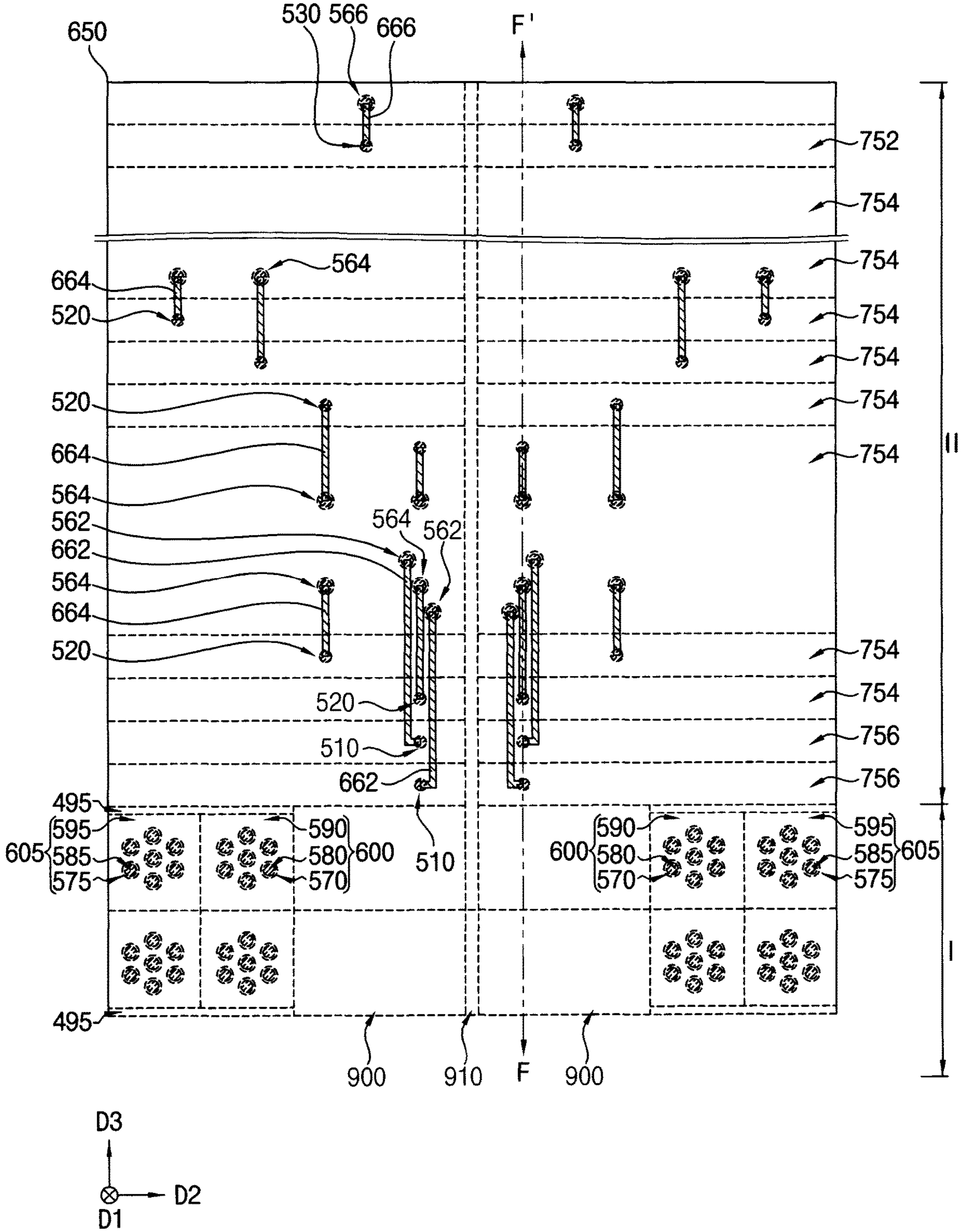
FIGS. 32 and 33 are a plan view and a cross-sectional view, respectively, illustrating a vertical memory device in accordance with exemplary embodiments of the present inventive concepts.
Figure 33:
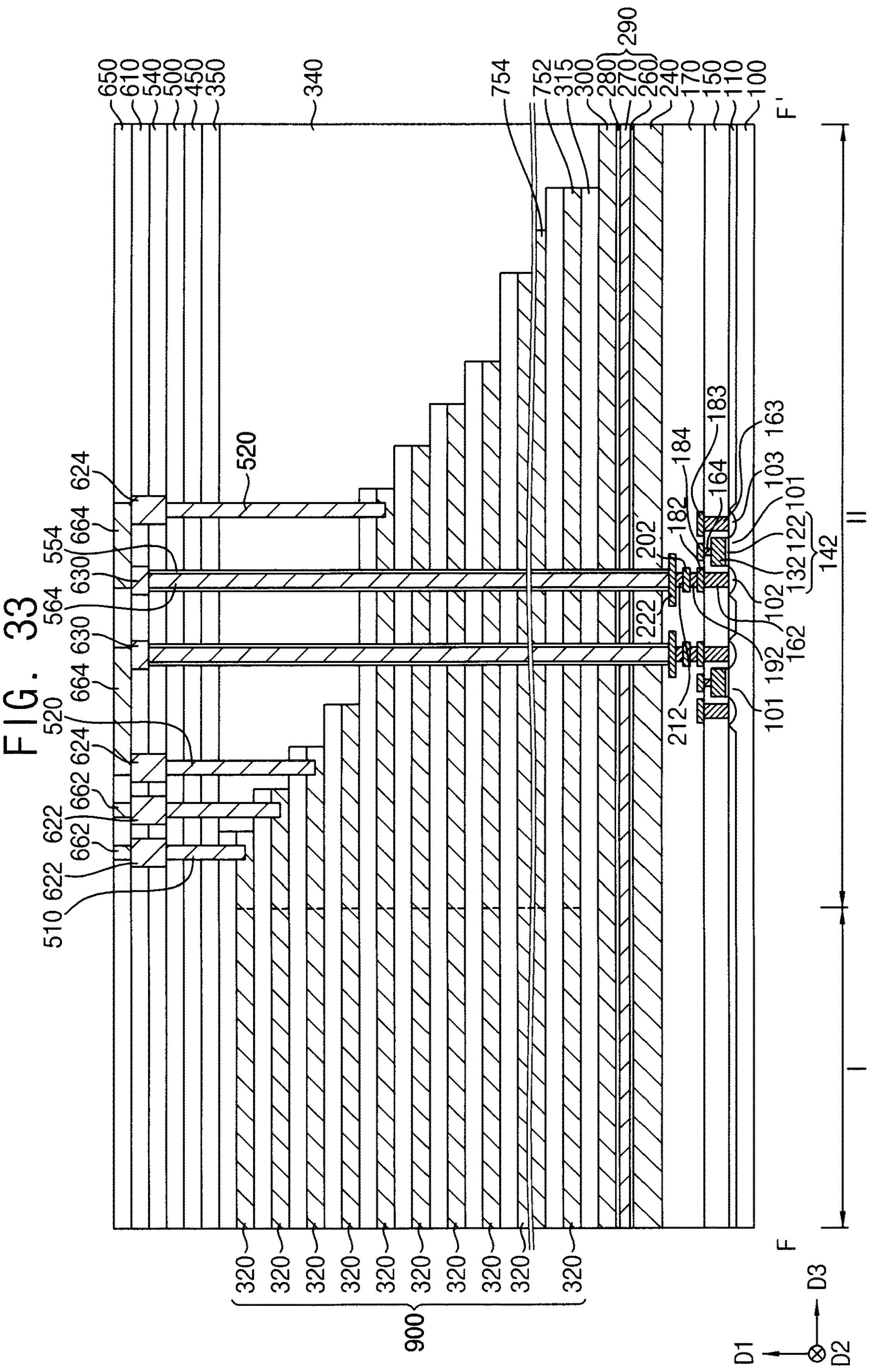

FIGS. 32 and 33 are a plan view and a cross-sectional view, respectively, illustrating a vertical memory device in accordance with exemplary embodiments of the present inventive concepts. FIG. 32 is a plan view of a region K of FIG. 1, which may correspond to FIG. 22. FIG. 33 is a cross-sectional view taken along a line F-F' of FIG. 32.

Referring to the exemplary embodiments of FIGS. 32 and 33, the upper circuit pattern shown in the exemplary embodiment of FIG. 22 may be disposed on steps of the mold, such as the pads of the first to third gate electrodes 752, 754 and 756 that are disposed in the third direction D3 from each cell array region of the substrate 100 and the second connecting portion of the mold adjacent to each cell array region in the second direction D2.

As shown in the exemplary embodiment of FIG. 32, the first conductive path 900 may be disposed at a lateral side of each cell array region in each of the second and third directions D2 and D3 on the first region I of the substrate 100 to be electrically connected to the first to third gate electrodes 752, 754 and 756 at each level. The upper circuit pattern may be also formed on pads of the first to third gate electrodes 752, 754 and 756 at a lateral end portion thereof in the third direction D3. In an exemplary embodiment, the upper circuit pattern may or may not be formed on the pads of the electrodes 752, 754 and 756 at a lateral end portion thereof in the second direction D2. If the first to third gate electrodes 752, 754 and 756 need a relatively high power, a plurality of upper circuit patterns may be formed on the pads of the first to third electrodes 752, 754 and 756 at the lateral end portion thereof in the third direction D3.

The adjacent shared memory blocks on the cell array regions (e.g., adjacent in the second direction D2), respectively, of the substrate 100 may be electrically insulated from each other by the third division pattern 910, and thus the upper circuit pattern may be formed at each of the opposite lateral sides of the third division pattern 910 (e.g., in the second direction D2).

Figure 34:
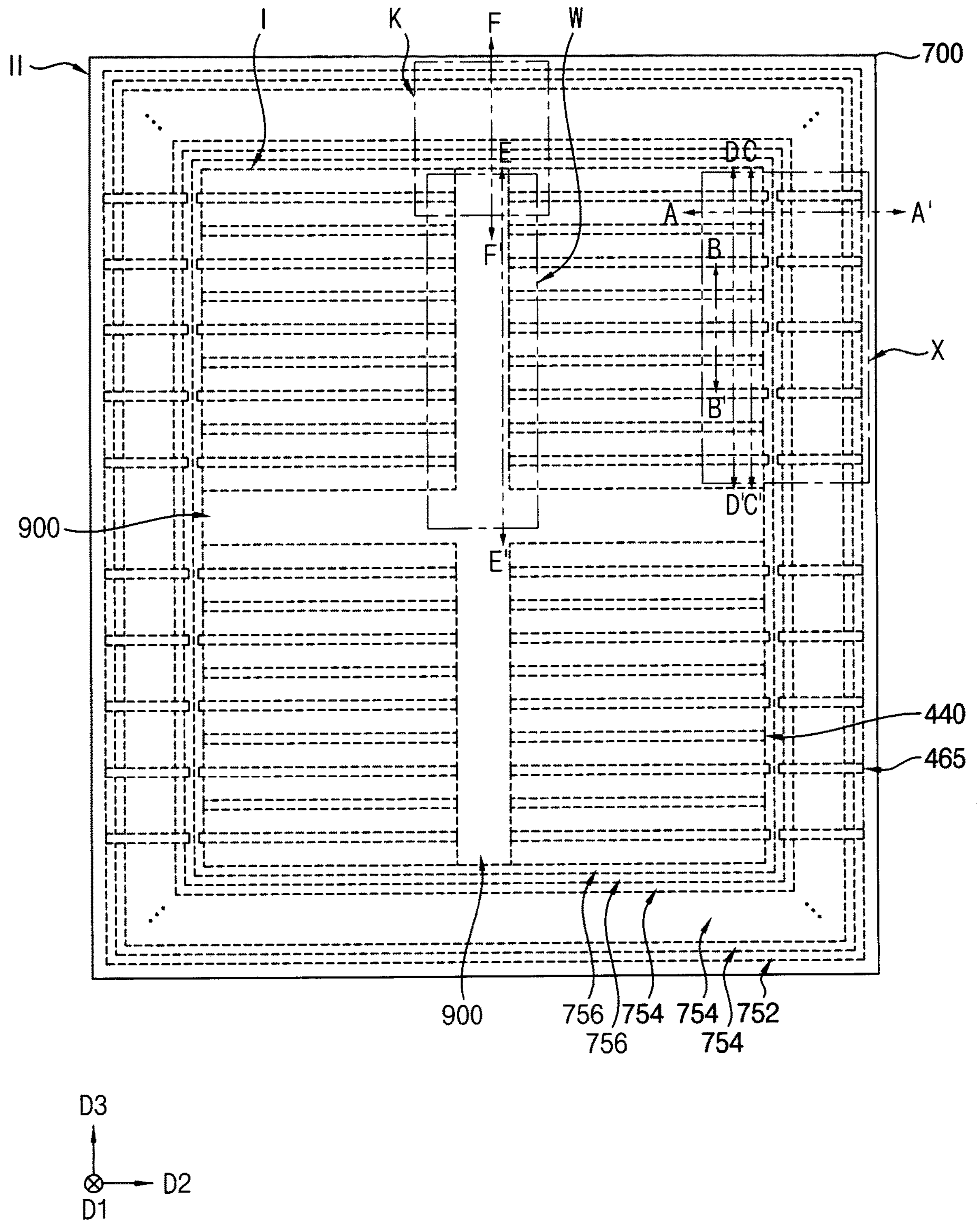
FIGS. 34 and 35 are plan views illustrating a vertical memory device in accordance with exemplary embodiments of the present inventive concepts.
Figure 35:
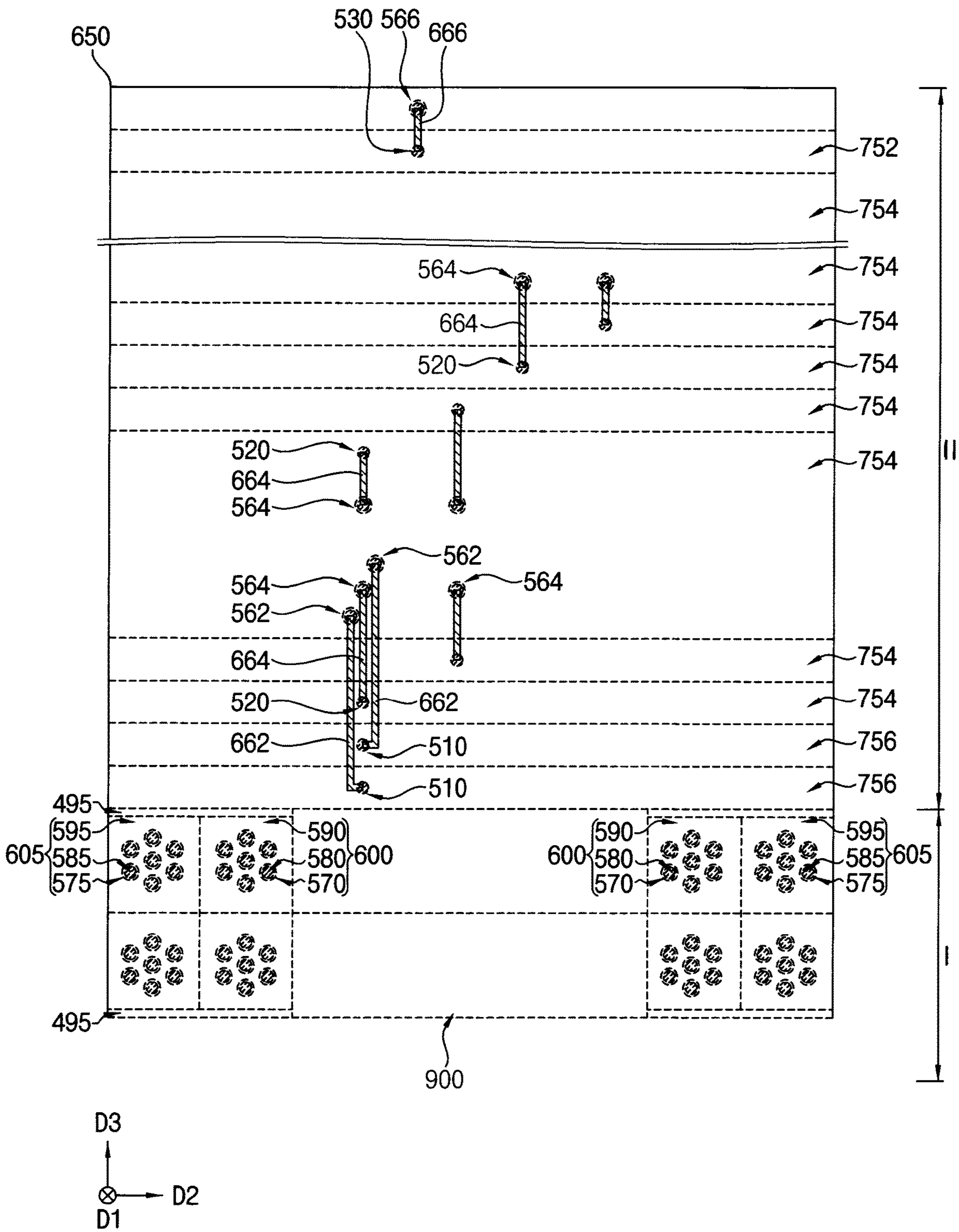

FIGS. 34 and 35 are plan views illustrating a vertical memory device in accordance with exemplary embodiments of the present inventive concepts. FIG. 35 is a plan view of a region K of FIG. 34. FIGS. 34 and 35 may correspond to FIGS. 24 and 32, respectively.

Referring to the exemplary embodiments of FIGS. 34 and 35, the vertical memory device may not include the third division pattern 910 as shown in the exemplary embodiment of FIG. 15. Therefore, adjacent shared memory blocks (e.g., adjacent in the second direction D2) disposed on the cell array regions, respectively, of the substrate 100 may be electrically connected thereto.

Accordingly, the upper circuit pattern for applying electrical signals to the first to third gate electrodes 752, 754 and 756 may be disposed on the pads at the lateral end portions of the first to third gate electrodes 752, 754 and 756 in the third direction D3, and may be shared by the shared memory blocks on the adjacent cell array regions (e.g., adjacent in the second direction D2), respectively, of the substrate 100. In an exemplary embodiment, the upper circuit pattern may be disposed on pads of the first to third gate electrodes 752, 754 and 756 adjacent to the second connecting portion of the mold, such as the first conductive path 900 in the third direction D3.

However, in instances in which the first to third gate electrodes 752, 754 and 756 need high power, a plurality of upper circuit patterns may be disposed on the pads of the first to third gate electrodes 752, 754 and 756 at the lateral end portions thereof in the third direction D3, and the layout of the upper circuit patterns may not be limited to the layout shown in the exemplary embodiment of FIG. 35.

As illustrated above, the first to third gate electrodes 752, 754 and 756 at each level of the memory blocks in the shared memory block may be electrically connected thereto through the first conductive path 900 extending in the second and third directions D2 and D3 and the first connection portion 990 of the mold. Therefore, the upper circuit pattern may be disposed not only on a portion of the second region II of the substrate 100 where lateral end portions in the second direction D2 of the shared memory block are formed but may also be disposed on a portion of the second region II of the substrate 100 adjacent to lateral end portions in the third direction D3 of the shared memory block. Additionally, the upper circuit pattern may also be disposed on a portion of the second region II of the substrate 100 adjacent to the first conductive path 900 between shared memory blocks in the third direction D3 or in the second direction D2.

Figure 36:
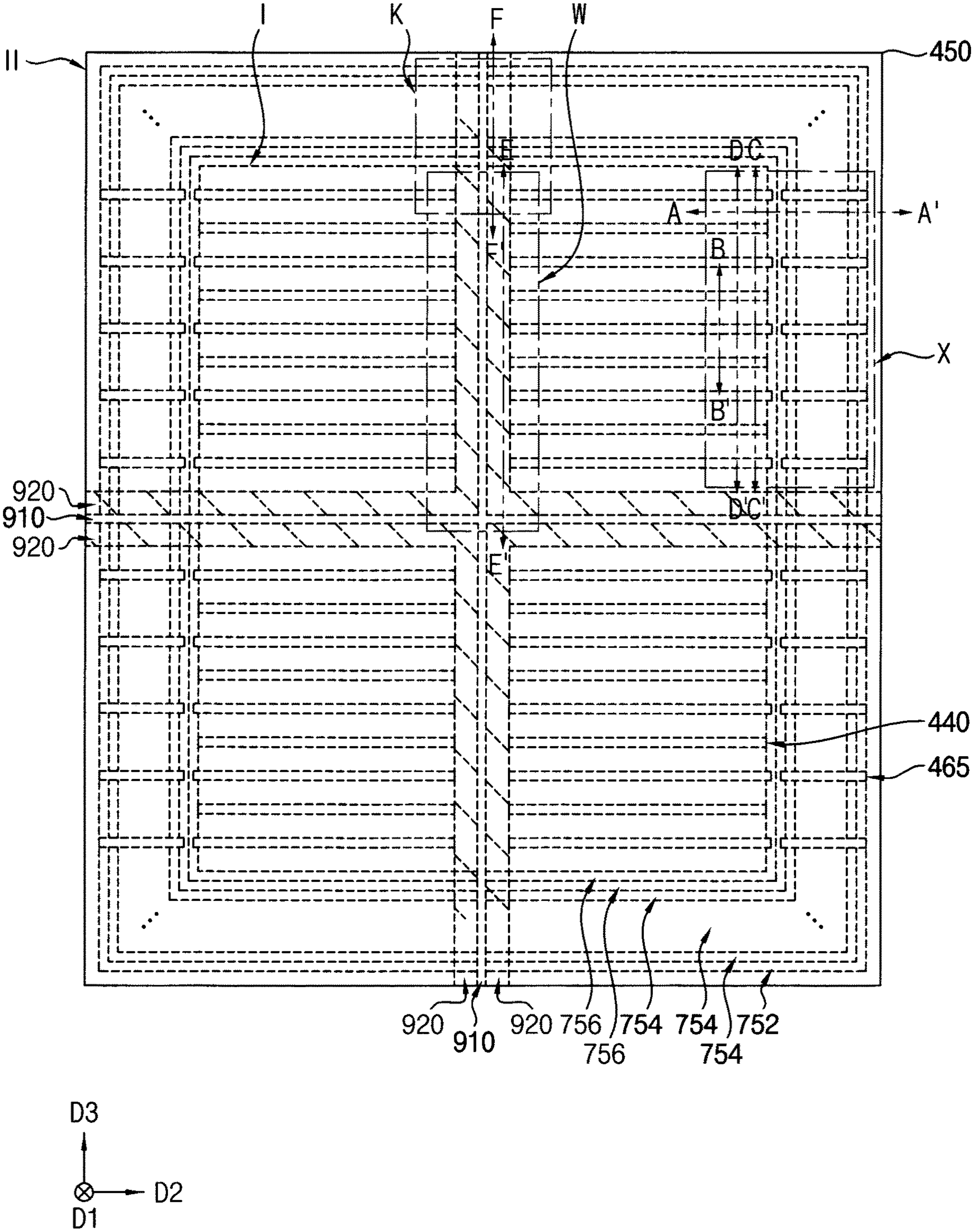
FIGS. 36 and 37 are a plan view and a cross-sectional view illustrating a vertical memory device in accordance with exemplary embodiments of the present inventive concepts.
Figure 37:
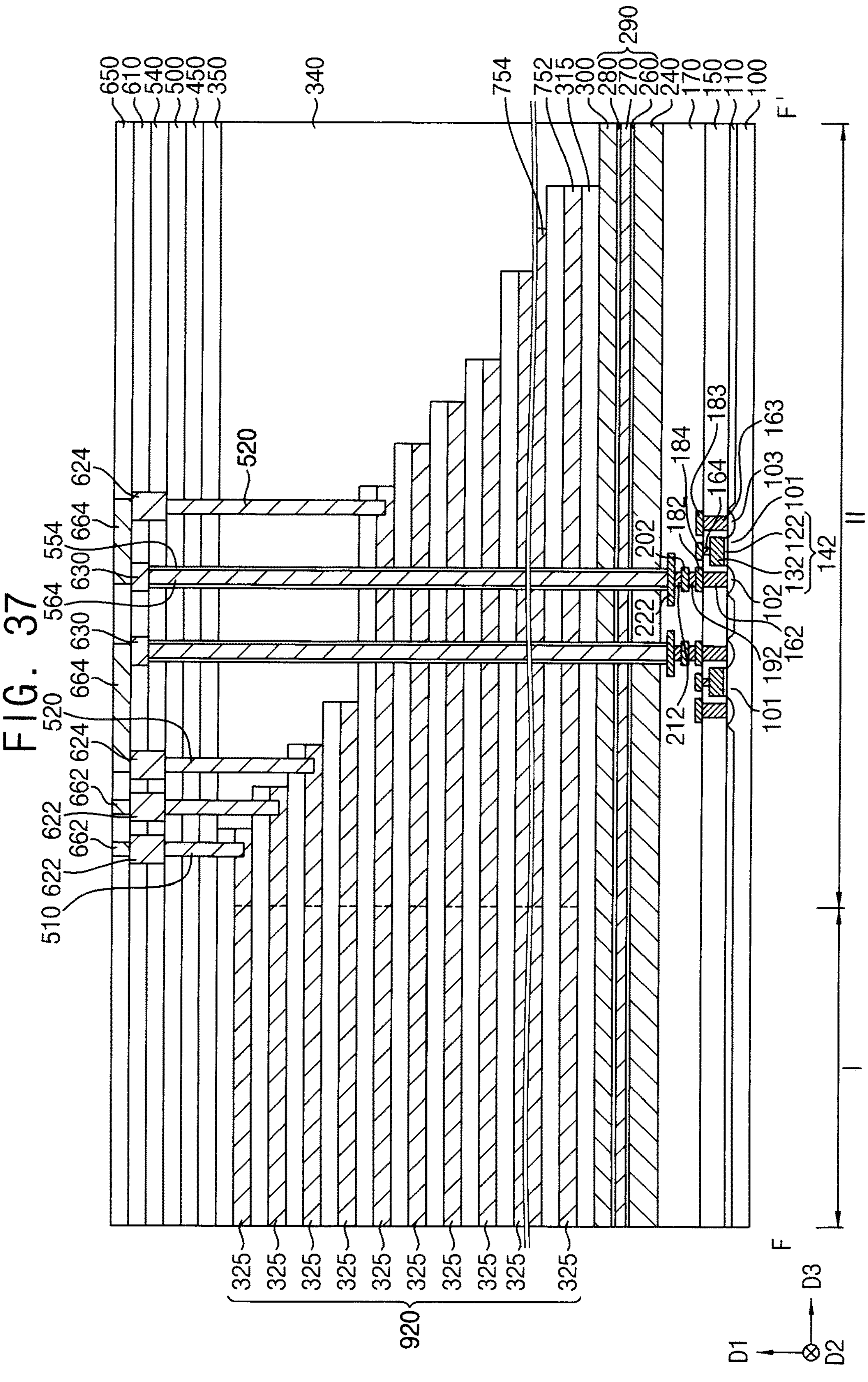

FIGS. 36 and 37 are a plan view and a cross-sectional view illustrating a vertical memory device in accordance with exemplary embodiments of the present inventive concepts. FIG. 37 is a cross-sectional view taken along a line F-F' of FIG. 36. FIGS. 36 and 37 may correspond to FIGS. 24 and 33, respectively.

Referring to the exemplary embodiment of FIGS. 36 and 37, the vertical memory device may include a second conductive path 920 instead of the first conductive path 900.

In an exemplary embodiment, the second conductive path 920 may include a metal, such as tungsten, and may include metal patterns 325 at respective levels. However, exemplary embodiments of the present inventive concepts are not limited thereto.

In an exemplary embodiment, the second conductive path 920 may be formed by forming a third opening for the third division pattern 910, removing portions of the first to third gate electrodes 752, 754 and 756 adjacent to the third opening to form a second gap, and filling the second gap with a conductive material. The second conductive path 920 may be formed not only on the first region I of the substrate 100 but also on the second region II of the substrate 100.

The second conductive path 920 may include a metal unlike the first conductive path 900 which includes doped polysilicon. Therefore, the reduction of the resistance of the first to third gate electrodes 752, 754 and 756 included in the shared memory block on the respective cell array regions of the substrate 100 may be further increased.

Figure 38:
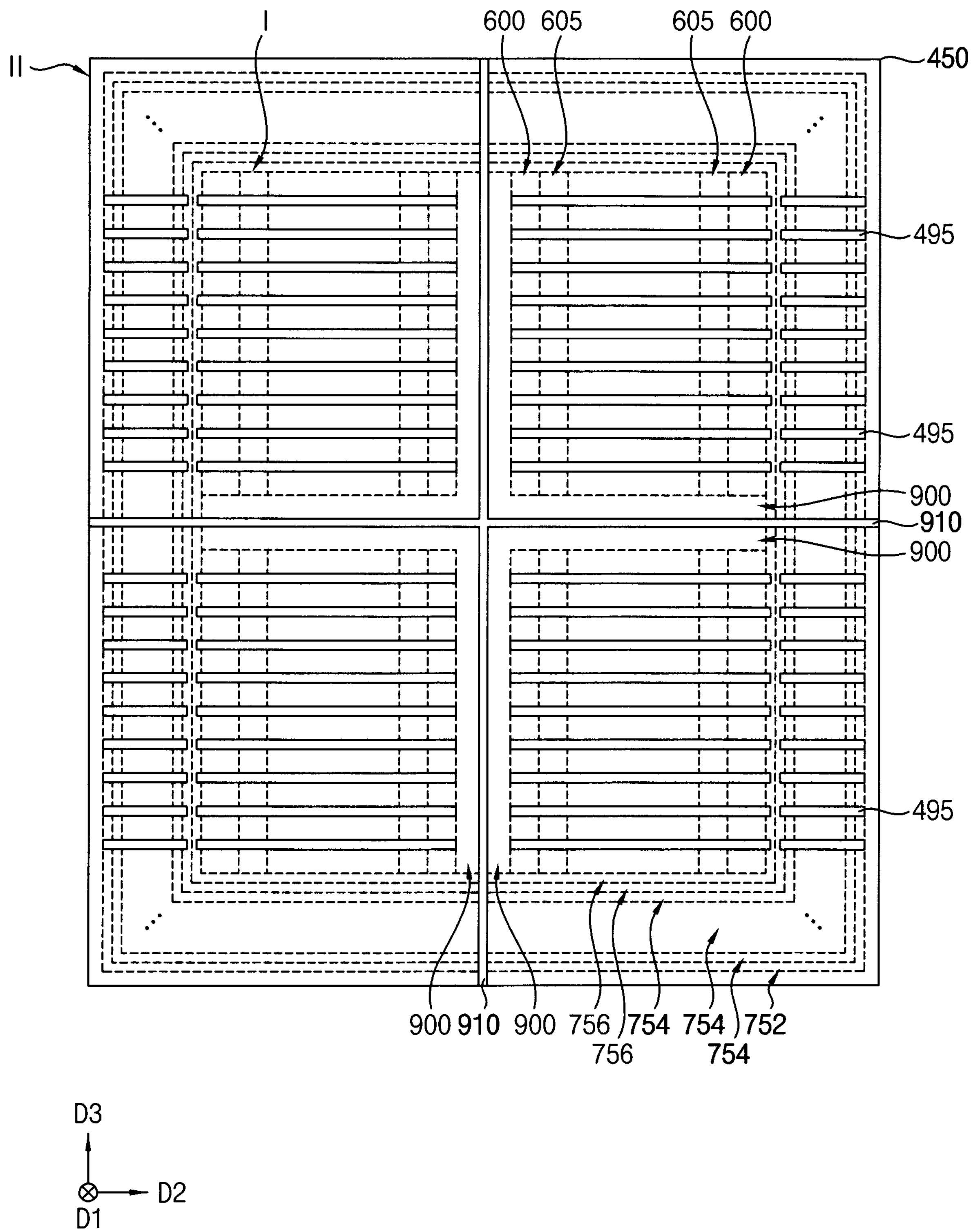
FIG. 38 is a plan view illustrating a vertical memory device in accordance with exemplary embodiments of the present inventive concepts.

FIG. 38 is a plan view illustrating a vertical memory device in accordance with an exemplary embodiment, and may correspond to FIG. 15. For convenience of illustration, FIG. 38 does not show the first division pattern 440.

Referring to the exemplary embodiment of FIG. 38, four memory blocks each including two memory groups may share gate electrodes to form a shared memory block on each cell array region of the substrate 100. Therefore, seven second openings 465 are formed in the shared memory block. However, exemplary embodiments of the present inventive concepts are not limited thereto and the number of the memory blocks included in the shared memory block may vary in other exemplary embodiments.

Figure 39:
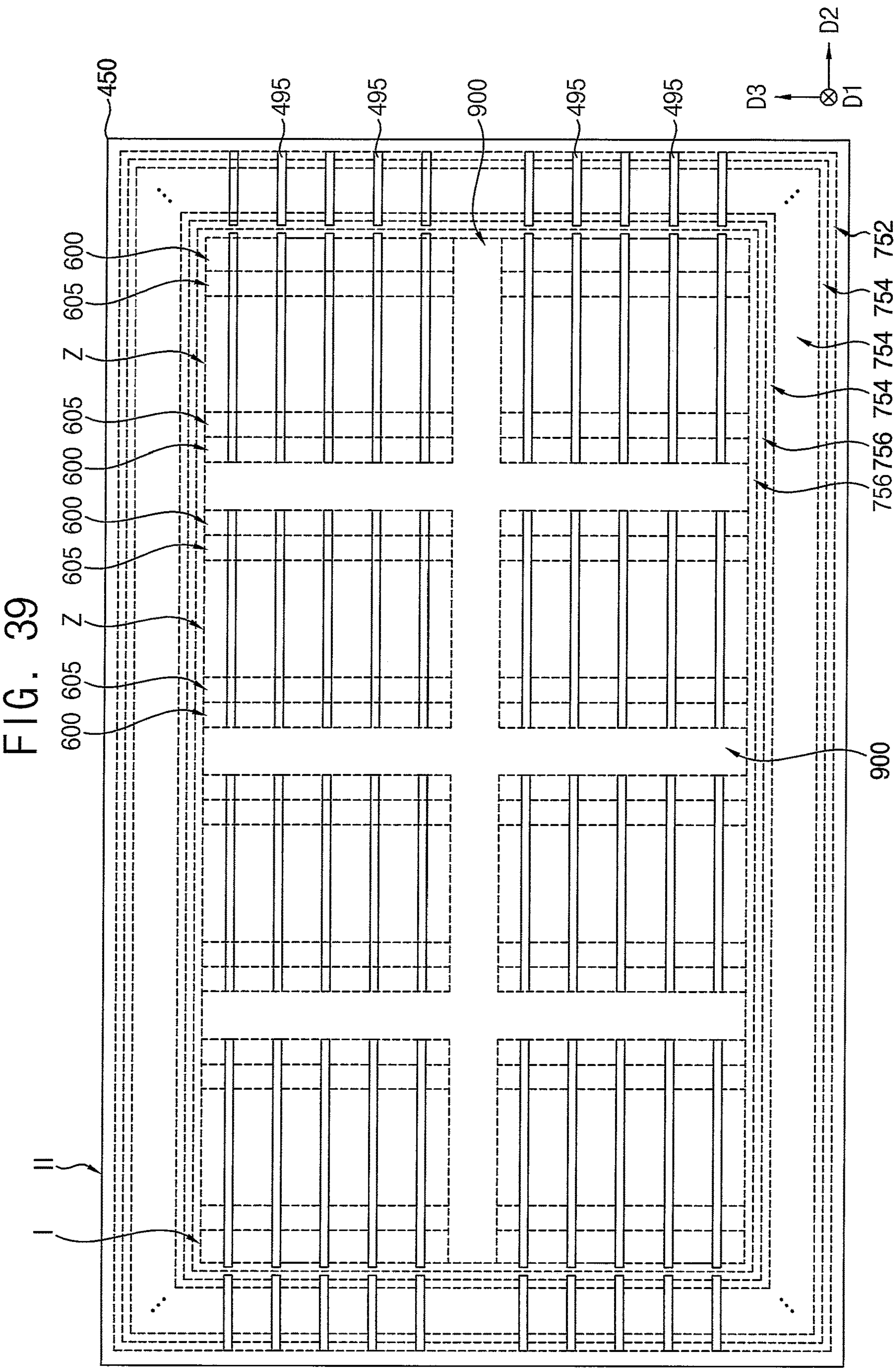
FIGS. 39 to 41 are plan views illustrating vertical memory devices in accordance with exemplary embodiments of the present inventive concepts.
Figure 40:
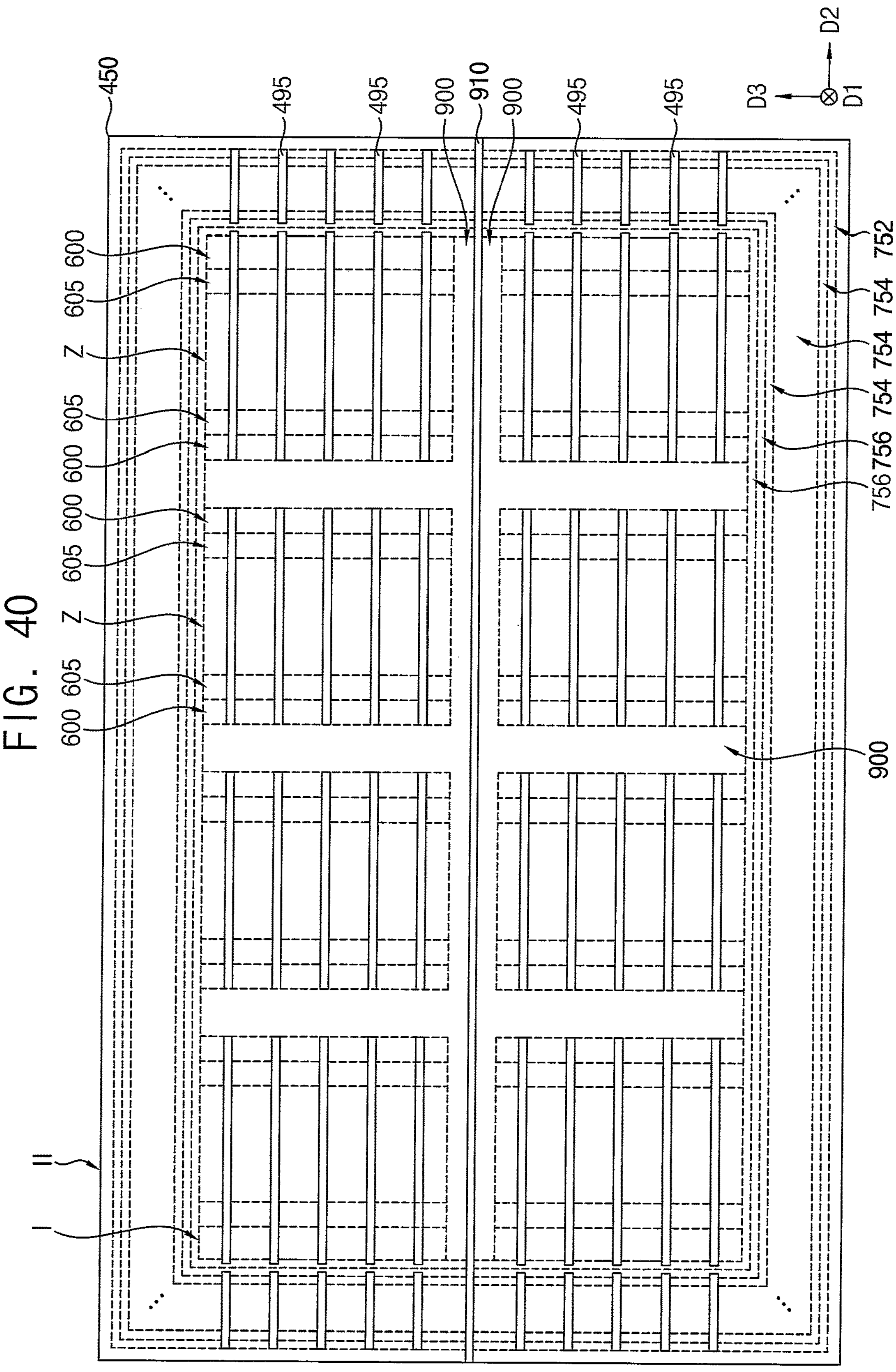
Figure 41:
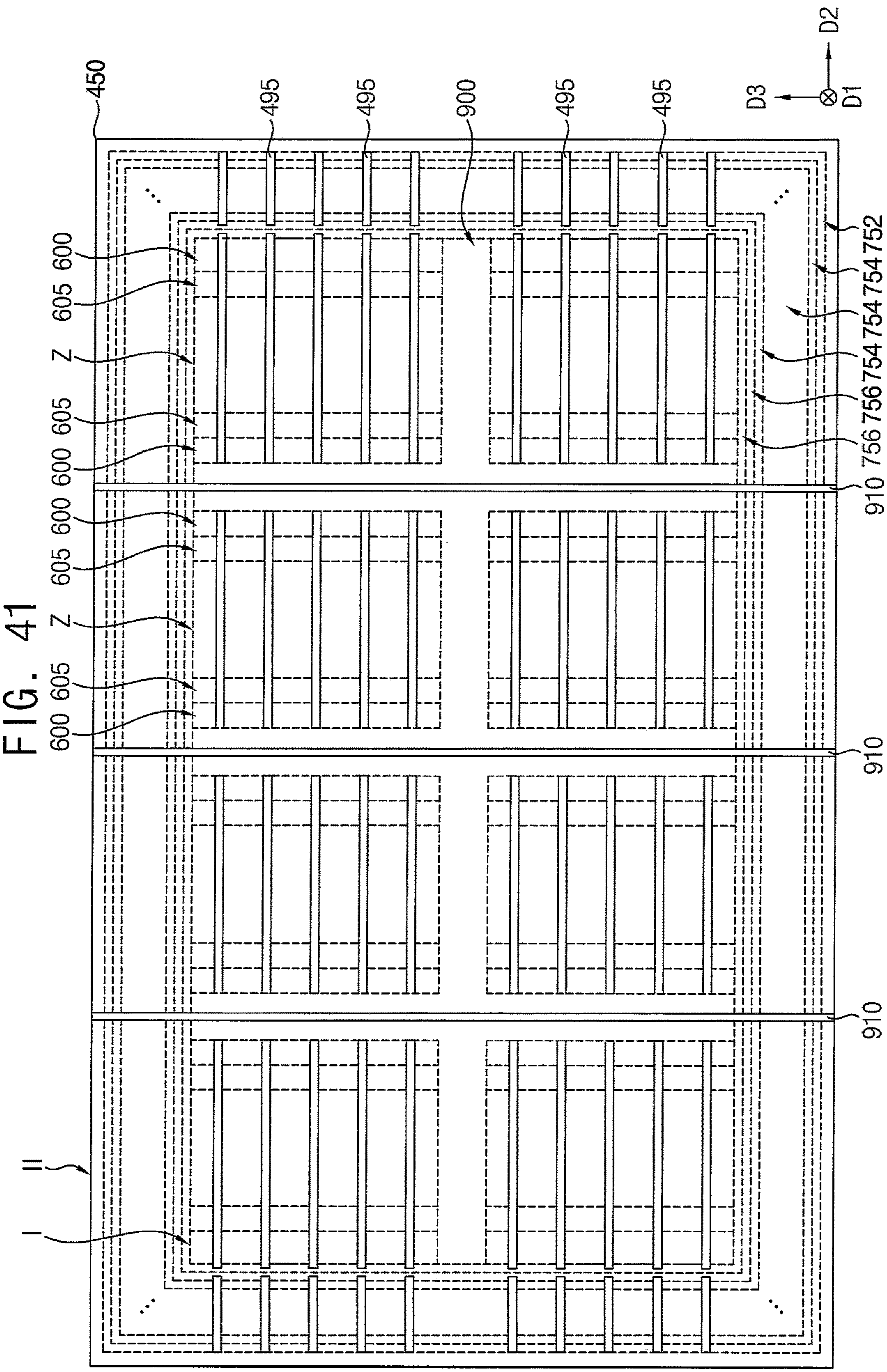

FIGS. 39 to 41 are plan views illustrating vertical memory devices in accordance with exemplary embodiments of the present inventive concepts, and may correspond to FIG. 15. The first division pattern 440 are not shown in the drawings for convenience of illustration.

Referring to the exemplary embodiment of FIG. 39, the first region I of the substrate 100 may include eight cell array regions divided by the second connection portion of the mold, such as the first conductive path 900. The vertical channel region Z may be formed at a central portion in the second direction D2 of each cell array region, and the first and second switching transistors 600 and 605 and the third switching transistor may be formed in the switching transistor region at each of opposite lateral sides in the second direction D2 of the vertical channel region Z.

A plurality of memory blocks disposed in the third direction D3 may share gate electrodes to form a shared memory block on each cell array region of the substrate 100. However, on cell array regions disposed at each of opposite lateral ends in the second direction D2, the shared memory block may be formed not only on the cell array region but also on a portion of the second region II of the substrate 100 adjacent thereto in the second direction D2 so that the gate electrodes at each level may be connected with each other by the first connecting portion 990 of the mold, such as the connecting pattern of the gate electrode. Accordingly, an upper circuit pattern may be disposed on pads of the first to third gate electrodes 752, 754 and 756 on the second region II of the substrate 100.

On the cell array regions that are not disposed at the opposite lateral ends in the second direction D2, the shared memory block may be formed only on the cell array region of the substrate 100, and the gate electrodes at each level may be connected with each other by the second connecting portion of the mold, such as the first conductive path 900.

As shown in the exemplary embodiments of FIGS. 32 and 33, an upper circuit pattern may be disposed on steps of the mold, such as the pads of the first to third gate electrodes 752, 754 and 756 that are disposed in the third direction D3 from each cell array region of the substrate 100 and the second connecting portion of the mold adjacent to each cell array region in the second direction D2. Alternatively, as shown in the exemplary embodiments of FIGS. 34 and 35, an upper circuit pattern may be disposed on pads of the first to third gate electrodes 752, 754 and 756 adjacent to the second connecting portion of the mold, such as the first conductive path 900 in the third direction D3.

The third division pattern 910 may not be formed, and thus the shared memory blocks on the respective cell array regions may be electrically connected with each other through the first conductive path 900.

Referring to the exemplary embodiment of FIG. 40, the third division pattern 910 may extend through the second connection portion of the mold in the second direction D2. Therefore, the shared memory blocks on the cell array regions at upper and lower sides, respectively, (e.g., in the third direction D3) of the third division pattern 910 may be electrically insulated from each other.

Referring to the exemplary embodiment of FIG. 41, each of a plurality of third division patterns 910 may extend through the third connection portion of the mold in the third direction D3. Therefore, the shared memory blocks on the cell array regions disposed at left and right sides, respectively, of each of the third division patterns 910 (e.g., in the second direction D2) may be electrically insulated from each other.

However, exemplary embodiments of the present inventive concepts are not limited thereto and the number of the cell array regions on the first region I of the substrate 100 and the layout of the third division pattern 910 electrically insulating the cell array regions from each other may vary from the arrangements shown in the exemplary embodiments of FIGS. 39 to 41.

Figure 42:
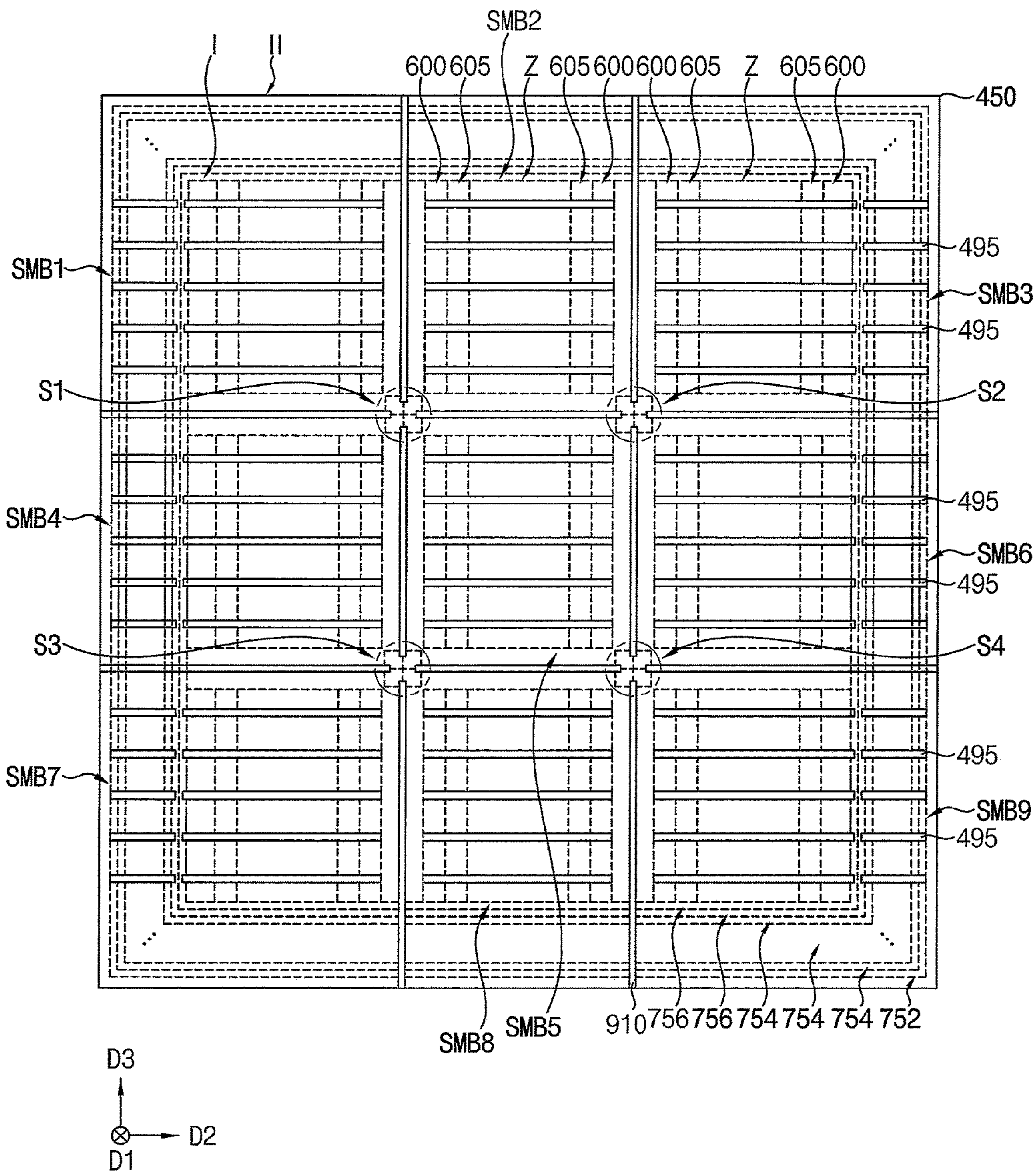
FIGS. 42 and 43 are plan views illustrating a vertical memory device in accordance with exemplary embodiments of the present inventive concepts.
Figure 43:
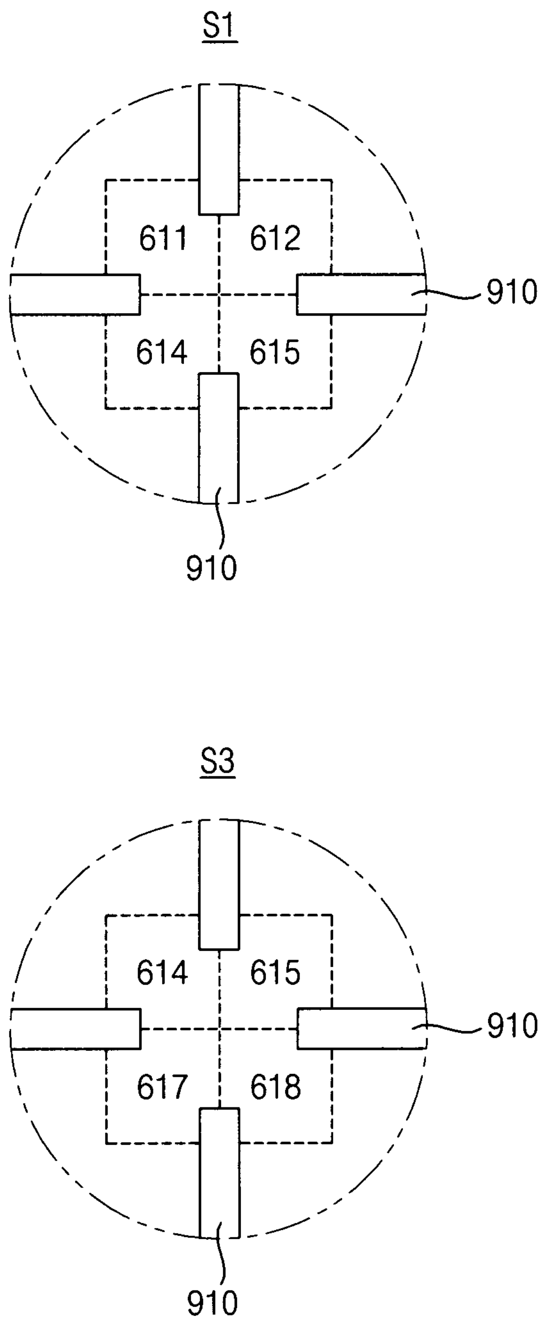

FIGS. 42 and 43 are plan views illustrating a vertical memory device in accordance with an exemplary embodiment of the present inventive concepts, and FIG. 42 may correspond to FIG. 15. FIG. 43 is an enlarged plan view of regions S1, S2, S3 and S4 of FIG. 43. The first division pattern 440 is not shown in FIG. 42 for convenience of illustration.

Referring to the exemplary embodiment of FIG. 42, the first region I of the substrate 100 may include nine cell array regions divided by the second connecting portion of the mold, such as the first conductive path 900. The vertical channel region Z may be formed at a central portion in the second direction D2 of each cell array region, and the first and second switching transistors 600 and 605 and the third switching transistor may be formed on the switching transistor region at each of the opposite lateral sides in the second direction D2 of the vertical channel region Z. A plurality of memory blocks disposed in the third direction D3 on each cell array region may share gate electrodes at each level to form a shared memory block. In the drawings, first to ninth shared memory blocks SMB1, SMB2, SMB3, SMB4, SMB5, SMB6, SMB7, SMB8 and SMB9 are shown.

In an exemplary embodiment, the third division pattern 910 may extend through the second connecting portion of the mold. However, the third division pattern 910 may include third and fourth extension portions extending in the second and third directions D2 and D3, respectively, that are not connected with each other and are spaced apart from each other at first through fourth crossing areas S1, S2, S3 and S4 where the third and fourth extension portions meet each other. In an exemplary embodiment, switching transistors may be formed at the first to fourth crossing areas S1, S2, S3 and S4, respectively, and each of the switching transistors may serve as a shared memory block selection transistor for selecting a corresponding one of the shared memory blocks.

For example, the first, second, fourth and fifth shared memory blocks SMB1, SMB2, SMB4 and SMB5 may meet each other at a first crossing area S1, and eleventh, twelfth, fourteenth and fifteenth switching transistors 611, 612, 614 and 615 may be formed on corresponding portions, respectively, of the first crossing area S1 so that applying electrical signals to the first, second, fourth and fifth shared memory blocks SMB1, SMB2, SMB4 and SMB5 may be selectively on or off. Likewise, the eleventh to nineteenth switching transistors 611, 612, 613, 614, 615, 616, 617, 618 and 619 may be formed on corresponding portions, respectively, of the first to fourth crossing areas S1, S2, S3 and S4.

In an exemplary embodiment, tach of the shared memory block selection transistors may have a structure substantially the same as the structure of the first switching transistor 600. Pass transistors may be formed in the corresponding shared memory block to apply electrical signal to each of the shared memory block selection transistors. For example, one switching transistor and one pass transistor electrically connected thereto may be formed in each of the first, third, seventh and ninth shared memory blocks SMB1, SMB3, SMB7 and SMB9, two switching transistors and two pass transistors electrically connected thereto may be formed in each of the second, fourth, sixth and eighth shared memory blocks SMB2, SMB4, SMB6 and SMB8, and four switching transistors and four pass transistors electrically connected thereto may be formed in the fifth shared memory block SMB5.

Therefore, even though the third division pattern 910 extends through the second connecting portion of the mold, the third division pattern 910 may be partially cut to be discontinuous at the first to fourth crossing areas S1, S2, S3 and S4 where the cell array regions meet each other so that the cell array regions may be electrically connected with each other, and the switching transistors and the pass transistors, which may perform on-off operation of electrical signals applied to the shared memory blocks on the cell array regions, respectively, may be formed at the first to fourth crossing areas S1, S2, S3 and S4. Accordingly, for example, one of the shared memory blocks on a central cell array region of the substrate 100 may receive electrical signals from an upper circuit pattern on pads of gate electrodes on the second region II of the substrate 100, while the shared memory block may be independently operated from other shared memory blocks by using the switching transistors and the pass transistors.

Figure 44:
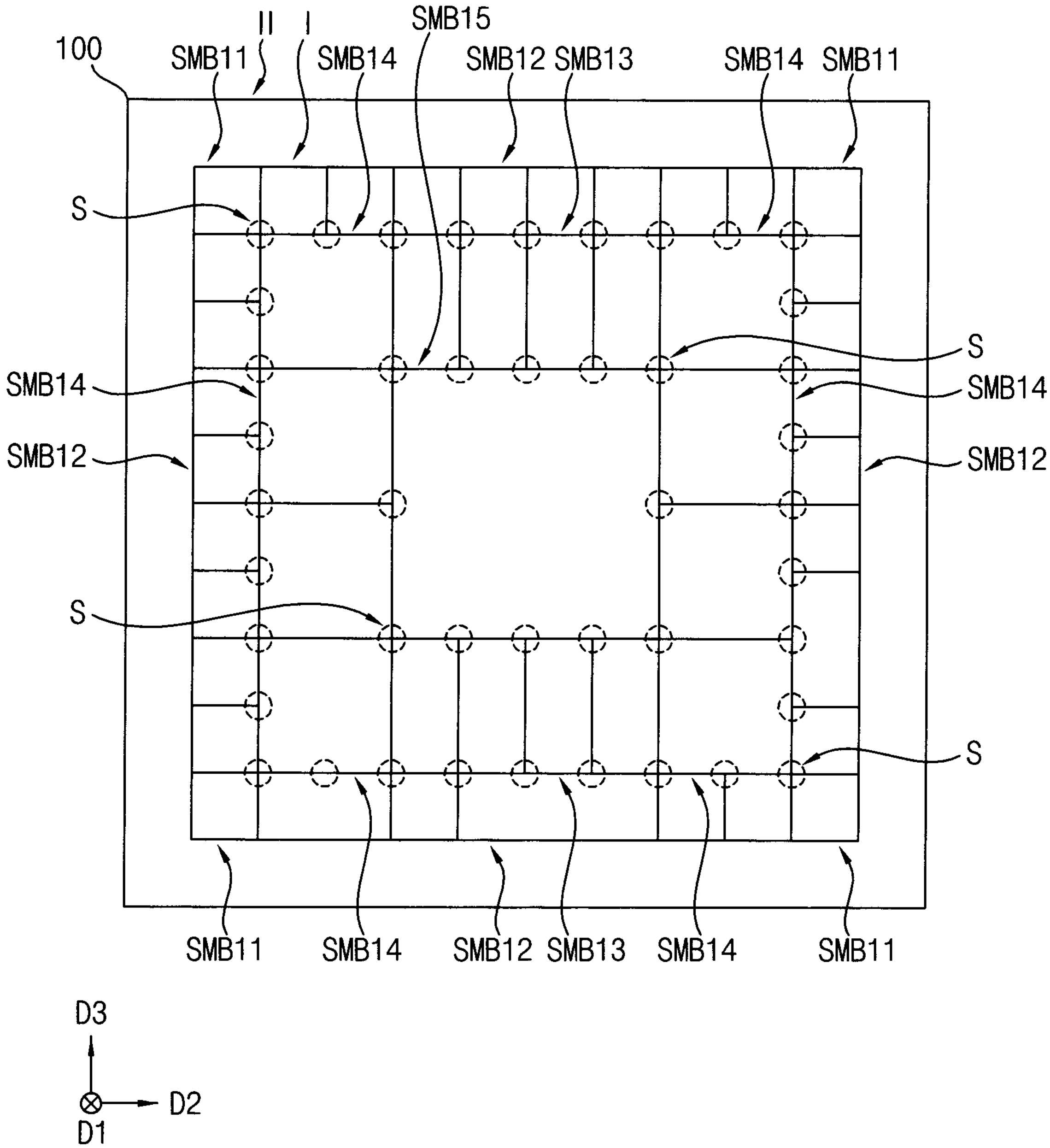
FIG. 44 is a plan view illustrating a layout of cell array regions of a vertical memory device in accordance with an exemplary embodiment of the present inventive concepts.

FIG. 44 is a plan view illustrating a layout of cell array regions of a vertical memory device in accordance with an exemplary embodiment of the present inventive concepts.

Referring to the exemplary embodiment of FIG. 44, the first region I of the substrate 100 may include a plurality of cell array regions, and shared memory blocks may be disposed on the cell array regions, respectively. The shared memory blocks may have different sizes from each other, and distances from the shared memory blocks to the second region II of the substrate 100 on which upper circuit patterns for applying electrical signal to gate electrodes of the shared memory blocks and pads of the gate electrodes are formed may be different from each other.

Generally, when electrical signal is applied from an upper circuit pattern to a shared memory block, as the distance between the upper circuit pattern and the shared memory block increases, the resistance may increase. Additionally, as an area of the shared memory block increases, the capacitance may increase. Therefore, an RC delay that is proportional to the product of resistance and capacitance may be proportional to the product of the distance and the area.

For example, the eleventh shared memory block SMB11 having a relatively short distance from the second region II of the substrate 100 and a relatively small area may have an RC delay that is less than that of the thirteenth shared memory block SMB13 having a relatively long distance from the second region II of the substrate 100 and a relatively large area. Likewise, the RC delay of the thirteenth shared memory block SMB13 may be less than those of the fourteenth and fifteenth shared memory blocks SMB14 and SMB15.

The eleventh shared memory block SMB11 adjacent to both portions of the second region II of the substrate 100 in the second and third directions D2 and D3, respectively, may receive electrical signals from upper circuit patterns on both portions thereof, while the twelfth shared memory block SMB12 adjacent to a portion of the second region II of the substrate 100 in one of the second and third directions D2 and D3 may receive electrical signals from an upper circuit pattern on the portion thereof. Therefore, the eleventh shared memory block SMB11 may have an RC delay that is less than that of the twelfth shared memory block SMB12.

In an exemplary embodiment, the first conductive path 900 and the third division pattern 910 shown in the exemplary embodiments of FIGS. 42 and 43 may be disposed between the cell array regions, and the shared memory block selection transistors and the pass transistors may be formed at crossing areas S where the first and second extension portions of the first conductive path 900 meet each other. Therefore, the eleventh to fifteenth shared memory blocks SMB11, SMB12, SMB13, SMB14 and SMB15 may receive electrical signal from the upper circuit patterns on the second region II of the substrate 100. However, each of the eleventh to fifteenth shared memory blocks SMB11, SMB12, SMB13, SMB14 and SMB15 may be independently operated.

The vertical memory device may include cell array regions having various sizes and distances from the pad region of the substrate. Therefore, for example, shared memory blocks requiring high response speed may be disposed on some of the cell array regions, and shared memory blocks not requiring high response speed, such as for editing data or storing data that is not frequently read, may be disposed on other cell array regions. Accordingly, the vertical memory device may have efficient and improved data process capacity.

As described above, although the present inventive concepts has been described with reference to exemplary embodiments thereof, those skilled in the art will readily appreciate that many modifications are possible in the exemplary embodiments without materially departing from the novel teachings and advantages of the present inventive concepts.

What is claimed is:

1. A vertical memory device, comprising:

a plurality of memory blocks, adjacent memory blocks of the plurality of memory blocks are separated by an opening, each of the plurality of memory blocks including:

a plurality of horizontal gate electrodes disposed on a substrate and spaced apart from each other in a first direction that is substantially perpendicular to an upper surface of the substrate, wherein each of the plurality of horizontal gate electrodes extends in a second direction that is substantially parallel to the upper surface of the substrate;

a plurality of vertical channels, each of the plurality of vertical channels extends through horizontal gate electrodes of the plurality of horizontal gate electrodes in the first direction; and a plurality of charge storage structures, each of the charge storage structures are disposed between a vertical channel of the plurality of vertical channels and a horizontal gate electrode of the plurality of horizontal gate electrodes; and a conductive path extending in a third direction that is substantially parallel to the upper surface of the substrate and crosses the second direction, the conductive path including a plurality of gate electrode layers, the gate electrode layers are spaced apart from each other in the first direction, the plurality of gate electrode layers comprises a portion of the plurality of horizontal gate electrodes remaining on a discontinuous portion of the opening, wherein the plurality of memory blocks are arranged in the third direction and are divided from each other by a first division pattern that extends in the second direction, and wherein the plurality of horizontal gate electrodes at each level are electrically connected to the gate electrode layers, respectively, at each level of the conductive path at a first lateral side in the second direction to form a shared memory block from the adjacent memory blocks of the plurality of memory blocks, wherein the plurality of horizontal gate electrodes are configured to provide selection lines and word lines, wherein each of the plurality of memory blocks further includes:

a first switching transistor configured to control electrical signals applied to the word lines, the first switching transistor including:

a first vertical gate electrode extending through the word lines in the first direction, the first vertical gate electrode is electrically insulated from the word lines; and a first horizontal channel disposed at a portion of each of the word lines that is adjacent to the first vertical gate electrode; and a second switching transistor configured to control electrical signals applied to the selection lines, the second switching transistor including:

a second vertical gate electrode extending through the selection lines, the second vertical gate electrode is electrically insulated from the selection lines and is spaced apart from the first vertical gate electrode; and a second horizontal channel disposed at a portion of each of the selection lines that is adjacent to the second vertical gate electrode.

2. The vertical memory device as claimed in claim 1, wherein the conductive path includes:

a first extension portion extending in the third direction at the first lateral side in the second direction of the shared memory block; and a second extension portion extending in the second direction at a second lateral side in the third direction of the shared memory block.

3. The vertical memory device as claimed in claim 2, wherein:

the shared memory block is one of a plurality of shared memory blocks disposed in each of the second and third directions; and the first extension portion or the second extension portion of the conductive path is disposed between the plurality of shared memory blocks, and the first extension portion or the second extension portion is connected to the plurality of horizontal gate electrodes at respective levels included in at least one of the plurality of shared memory blocks.

4. The vertical memory device as claimed in claim 1, wherein each of the plurality of horizontal gate electrodes and the conductive path include polysilicon doped with impurities.

5. The vertical memory device as claimed in claim 1, wherein:

each of the plurality of horizontal gate electrodes includes polysilicon doped with impurities; and the conductive path includes a metal.

6. The vertical memory device as claimed in claim 1, further comprising:

a second division pattern extending in the third direction to divide the conductive path into two separate portions in the second direction, the two separate portions of the conductive path are electrically insulated from each other.

7. The vertical memory device as claimed in claim 1, wherein:

the first and the second switching transistors are disposed at a lateral end portion in the second direction of each of the plurality of memory blocks; and the first and the second switching transistors contact the conductive path.

8. The vertical memory device as claimed in claim 7, wherein:

the substrate includes a first region and a second region at least partially surrounding the first region;

horizontal gate electrodes of each of the plurality of memory blocks are disposed on the first and second regions of the substrate;

lateral end portions of the horizontal gate electrodes in the second direction, respectively, form first pads of the horizontal gate electrodes, wherein the first pads of the horizontal gate electrodes are stacked in a staircase shape on a portion of the second region of the substrate at each of opposite lateral sides in the second direction of the first region; and the vertical channels, the charge storage structures and the first and the second switching transistors of each of the memory blocks and the conductive path are disposed on the first region of the substrate; and the first and second switching transistors of each of the memory blocks are also disposed on a portion of the first region of the substrate that is adjacent to the second region of the substrate, the first and second switching transistors contacting the first pads of the horizontal gate electrodes.

9. The vertical memory device as claimed in claim 8, further comprising:

contact plugs disposed on the first pads of the horizontal gate electrodes of the shared memory block, respectively, the contact plugs are electrically connected to the respective first pads of the horizontal gate electrodes;

through vias disposed on a portion of the second region at each of opposite lateral sides in the second direction of the first region of the substrate in correspondence with the contact plugs, respectively, the through vias extending through the horizontal gate electrodes and are electrically insulated therefrom; and pass transistors disposed on the second region of the substrate, the pass transistors are electrically connected to the through vias, respectively.

10. The vertical memory device as claimed in claim 8, wherein:

lateral end portions in the third direction of horizontal gate electrodes, respectively, in memory blocks of the plurality of memory blocks form second pads of the horizontal gate electrodes, the second pads of the horizontal gate electrodes are stacked in a staircase shape on the second region of the substrate and are connected to the first pads, the vertical memory device further comprises:

contact plugs disposed on the second pads, respectively, of the horizontal gate electrodes of the shared memory block, the contact plugs are electrically connected to the respective second pads;

through vias disposed on a portion of the second region at each of opposite lateral sides in the third direction of the first region of the substrate in correspondence with the contact plugs, respectively, the through vias extending through the horizontal gate electrodes and are electrically insulated therefrom; and pass transistors disposed on the second region of the substrate, the pass transistors are electrically connected to the through vias, respectively.

11. The vertical memory device as claimed in claim 1, wherein:

the selection lines include a ground selection line (GSL) and a string selection line (SSL); and the GSL is disposed under the word lines in the first direction and the SSL is disposed above the word lines in the first direction.

12. The vertical memory device as claimed in claim 1, further comprising:

a first pass transistor disposed under the first vertical gate electrode, the first pass transistor is electrically connected to the first vertical gate electrode; and a second pass transistor disposed under the second vertical gate electrode, the second pass transistor is electrically connected to the second vertical gate electrode, wherein each of the plurality of memory blocks include one first pass transistor and four second pass transistors.

13. A vertical memory device, comprising:

a substrate including a memory cell region and a pad region surrounding the memory cell region;

a conductive path disposed on the memory cell region, the conductive path including conductive patterns that are spaced apart from each other in a first direction that is substantially perpendicular to an upper surface of the substrate, wherein the conductive path extends in at least one of second and third directions that are substantially parallel to the upper surface of the substrate and cross each other; and shared memory blocks disposed on cell array regions, respectively, of the substrate, the shared memory blocks are separated from each other by an opening, the cell array regions are portions of the memory cell region of the substrate that are spaced apart from each other by the conductive path, wherein each of the shared memory blocks includes memory blocks arranged in the third direction on each of the cell array regions of the substrate, the memory blocks are divided by a first division pattern extending in the second direction, wherein each of the memory blocks includes:

horizontal gate electrodes disposed on the substrate and spaced apart from each other in the first direction, each of the horizontal gate electrodes extending in the second direction;

vertical channels each extending through the horizontal gate electrodes in the first direction; and charge storage structures, wherein each of the charge storage structures are disposed between each of the vertical channels and the horizontal gate electrodes, and the horizontal gate electrodes at each level of the memory blocks in each of the shared memory blocks are electrically connected to the conductive patterns, respectively, at each level of the conductive path, the conductive path at a first lateral side in the second direction or a second lateral side in the third direction of each of the shared memory blocks and are configured to be shared by the shared memory blocks, wherein the conductive patterns comprises a portion of the horizontal gate electrodes remaining on a discontinuous portion of the opening, wherein the horizontal gate electrodes include selection lines and word lines, and wherein each of the memory blocks further includes:

a first switching transistor configured to control electrical signals applied to the word lines, the first switching transistor including:

a first vertical gate electrode extending through the word lines in the first direction, the first vertical gate electrode is electrically insulated from the word lines; and a first horizontal channel disposed at a portion of each of the word lines adjacent to the first vertical gate electrode; and a second switching transistor configured to control electrical signals applied to the selection lines, the second switching transistor including:

a second vertical gate electrode extending through the selection lines, the second vertical gate electrode is electrically insulated from the selection lines and is spaced apart from the first vertical gate electrode; and a second horizontal channel disposed at a portion of each of the selection lines, that is adjacent to the second vertical gate electrode.

14. The vertical memory device as claimed in claim 13, wherein the first and second switching transistors are both disposed at opposite lateral end portions in the second direction of each of the cell array regions of the substrate.

15. The vertical memory device as claimed in claim 13, wherein:

The shared memory blocks includes first shared memory blocks, horizontal gate electrodes of each of the memory blocks included in each of the first shared memory blocks extend on the pad region of the substrate, the first shared memory blocks are disposed at each of opposite lateral ends in the second direction of the shared memory blocks, and lateral end portions in the second direction of the horizontal gate electrodes form first pads of the horizontal gate electrodes, the first pads of the horizontal gate electrodes are stacked in a staircase shape; and the first pads of the horizontal gate electrodes at each level of the memory blocks included in each of the first shared memory blocks are partially connected with each other to be shared by the first shared memory blocks.

16. The vertical memory device as claimed in claim 15, wherein:

lateral end portions in the third direction of the horizontal gate electrodes of memory blocks included in each of first shared memory blocks form second pads, the second pads of the horizontal gate electrodes are stacked in a staircase shape on the pad region of the substrate and are configured to be connected to the first pads, respectively, and wherein the vertical memory device further comprises:

contact plugs disposed on the second pads, respectively, of the horizontal gate electrodes, the contact plugs are configured to be electrically connected to the respective second pads;

through vias disposed on a portion of the pad region at each of opposite lateral sides in the third direction of the memory cell region of the substrate in correspondence with the contact plugs, respectively, the through vias extending through horizontal gate electrodes and are electrically insulated therefrom; and pass transistors disposed on the pad region of the substrate, the pass transistors are configured to be electrically connected to the through vias, respectively.

17. A vertical memory device, comprising:

a substrate including a first region and a second region;

first pass transistors disposed on the second region of the substrate;

second and third pass transistors disposed on the first region of the substrate;

first, second and third lower circuit patterns disposed on the substrate, the first to third lower circuit patterns are configured to be electrically connected to the first to third pass transistors, respectively;

a common source plate (CSP) disposed on the first to third lower circuit patterns;

memory blocks each including;

first, second and third horizontal gate electrodes disposed on the CSP, the first, second and third horizontal gate electrodes are spaced apart from each other in a first direction that is substantially perpendicular to an upper surface of the substrate, wherein each of the first to third horizontal gate electrodes extends on the first and second regions of the substrate in a second direction that is substantially parallel to the upper surface of the substrate;

vertical channels disposed on the first region, each of the vertical channels extends through the first to third horizontal gate electrodes in the first direction; and charge storage structures disposed on sidewalls of the vertical channels, respectively;

a conductive path extending on the substrate in a third direction that is substantially parallel to the upper surface of the substrate and crosses the second direction:

a first switching transistor configured to control electrical signals applied to the second horizontal gate electrodes, the first switching transistor is disposed on the first region of the substrate and includes;

a first vertical gate electrode extending through the first to third horizontal gate electrodes in the first direction on the first region of the substrate, the first vertical gate electrode is electrically insulated from the first to third horizontal gate electrodes; and a first horizontal channel disposed at a portion of each of the second horizontal gate electrodes that is adjacent to the first vertical gate electrode; and a second switching transistor configured to control electrical signals applied to the third horizontal gate electrode, the second switching transistor is disposed on the first region of the substrate and includes;

a second vertical gate electrode extending through the first to third horizontal gate electrodes in the first direction on the first region of the substrate, the second vertical gate electrode is electrically insulated from the first to third horizontal gate electrodes and is spaced apart from the first vertical gate electrode in the second direction; and a second horizontal channel disposed at a portion of the third horizontal gate electrodes that is adjacent to the third vertical gate electrodes, wherein the memory blocks are disposed in the third direction, and divided by a division pattern that extends in the second direction, the first, second and third horizontal gate electrodes at each level of the memory blocks are connected to form a shared memory block, and wherein the first, second and third horizontal gate electrodes at each level included in the shared memory block are connected to the conductive path at a lateral side in the second direction of the shared memory block.

* * * * *